United States Patent
Patel et al.

(10) Patent No.: US 10,355,664 B2
(45) Date of Patent: Jul. 16, 2019

(54) RESONATOR APPLICATIONS FOR LANGASITE AND ITS ISOMORPHS

(71) Applicant: SCHLUMBERGER TECHNOLOGY CORPORATION, Sugar Land, TX (US)

(72) Inventors: Mihir S. Patel, W. Quincy, MA (US); Bikash K. Sinha, Cambridge, MA (US); Tsutomu Yamate, Kanagawa-Ken (JP)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 34 days.

(21) Appl. No.: 14/904,317

(22) PCT Filed: Jul. 10, 2014

(86) PCT No.: PCT/US2014/046110
§ 371 (c)(1),
(2) Date: Jan. 11, 2016

(87) PCT Pub. No.: WO2015/006536
PCT Pub. Date: Jan. 15, 2015

(65) Prior Publication Data
US 2016/0173058 A1    Jun. 16, 2016

Related U.S. Application Data

(60) Provisional application No. 61/845,262, filed on Jul. 11, 2013.

(51) Int. Cl.
*G01K 7/32*    (2006.01)
*G01L 9/00*    (2006.01)
(Continued)

(52) U.S. Cl.
CPC .......... *H03H 9/02039* (2013.01); *G01K 7/32* (2013.01); *G01K 11/26* (2013.01); *G01L 9/0022* (2013.01);
(Continued)

(58) Field of Classification Search
CPC .......... H01L 41/08; G01K 11/26; H03B 5/32; H03H 9/132; H03H 9/02039;
(Continued)

(56) References Cited

U.S. PATENT DOCUMENTS 4,419,600 A    12/1983  Sinha
6,005,331 A    12/1999  Sakharov et al.
(Continued)

FOREIGN PATENT DOCUMENTS

JP    2006238290 A    9/2006
JP    2010216896 A    9/2010

OTHER PUBLICATIONS

Malocha, D., et al., "Recent Measurements of Material Constants versus Temperature for Langatate, Langanite and Langasite," Proceeding of the IEEE International Frequency Control Symposium and Exhibition, 2000, pp. 200-205.

Yoonkee, K., et al., "Force-Frequency Effect of Y-cut Langanite and Y-cut Langatate," IEEE-Transactions on Ultrasonics, Ferroelectrics, and Frequency Control, 2003, 50(12), pp. 1678-1682.
(Continued)

*Primary Examiner* — Arnold M Kinkead

(57) ABSTRACT

Oscillators that use resonator elements formed from langasite or one of its isomorphs are described herein. The resonator elements include crystal orientations that are stress and/or temperature compensated. The resonators vibrate at an oscillating frequency in a thickness-shear mode of vibration. The oscillating frequency can be used to derive temperature, derive pressure, and/or for frequency control applications.

24 Claims, 24 Drawing Sheets

(51) Int. Cl.
| | |
|---|---|
| *H03B 5/32* | (2006.01) |
| *H03H 9/02* | (2006.01) |
| *H03H 9/13* | (2006.01) |
| *H03H 9/17* | (2006.01) |
| *G01K 11/26* | (2006.01) |
| *H01L 41/08* | (2006.01) |

(52) U.S. Cl.
CPC .............. *H01L 41/08* (2013.01); *H03B 5/32* (2013.01); *H03H 9/02062* (2013.01); *H03H 9/02086* (2013.01); *H03H 9/02102* (2013.01); *H03H 9/02133* (2013.01); *H03H 9/132* (2013.01); *H03H 9/177* (2013.01)

(58) Field of Classification Search
CPC .......... H03H 9/02133; H03H 9/02102; H03H 9/02086; H03H 9/02062
USPC ......... 310/360, 313 A, 361; 29/25.35, 592.1; 374/31; 331/158; 73/580, 702, 658
See application file for complete search history.

(56) References Cited

U.S. PATENT DOCUMENTS

| | | | |
|---|---|---|---|
| 8,136,406 B2 | 3/2012 | Sato et al. | |
| 8,294,332 B2 | 10/2012 | Matsumoto et al. | |
| 2004/0189153 A1 | 9/2004 | Thanner et al. | |
| 2008/0157632 A1* | 7/2008 | Williams | C23C 16/274 310/364 |
| 2013/0127534 A1 | 5/2013 | Badillo et al. | |

OTHER PUBLICATIONS

Kosinski, J. A. et al., "Stress-Induced Frequency Shifts in Langasite Thickness-Mode Resonators", IEEE International Frequency Control Symposium, 2003, pp. 716-722.
Kosinski, J. A. et al., "Stress-Induced Frequency Shifts in Langasite Thickness-Mode Resonators", IEEE Transactions on Ultrasonics, Ferroelectrics, and Frequency Control, 2009, 56(1), Abstract and pp. 129-134 (22 pages total).
Patel, M. S. et al., "Force-Frequency Effect on the Q-Factor of Thickness-Shear Mode Quartz and Langasite Resonator at High Temperatures", IEEE International Ultrasonics Symposium Proceedings, 2011, Abstract and pp. 316-319 (7 pages total).
Supplementary Search Report of European Patent Application No. 14823255.6 dated Jun. 13, 2016, 8 pages.
Search Report of European Patent Application No. 14823255.6 dated Sep. 20, 2016, 5 pages.
EP Communication Article 94(3) regarding European Patent Application No. 14823255.6 dated Oct. 28, 2016, 7 pages.
Search Report and Written Opinion of International Patent Application No. PCT/US2014/046110 dated Nov. 12, 2014, 13 pages.
IEEE Standard on Piezoelectricity, Standards Committee of the IEEE Ultrasonics, Ferroelectrics, and Frequency Control Society, 1988, 74 pp.
Office Action for the equivalent Japanese patent application 2016-525480 dated Jun. 8, 2018.
First Office Action for the equivalent Mexican patent application MX/a/2016/000270 dated Jul. 19, 2018.
Second Office Action for the equivalent Mexican patent application MX/a/2016/000270 dated Dec. 11, 2018.

* cited by examiner

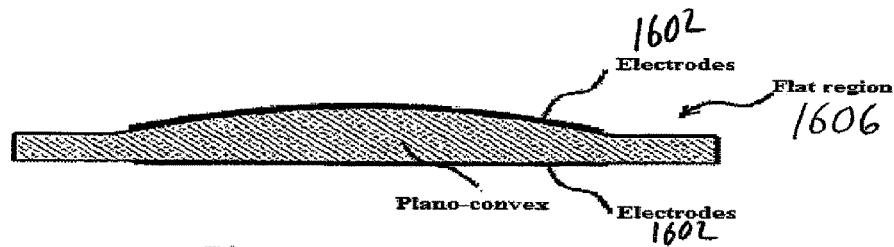
FIG. 17A  Plano-Convex Resonator with Flat Region
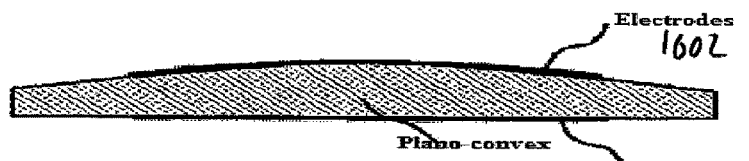
FIG. 17B  Plano-Convex Resonator
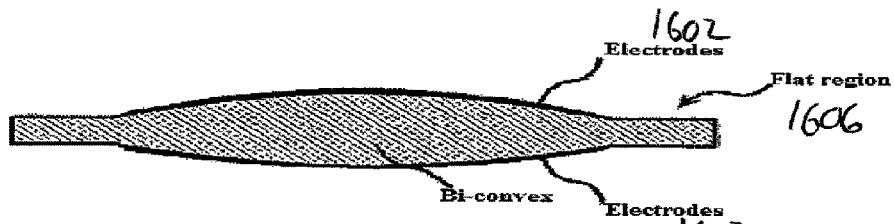
FIG. 17C  Bi-convex Resonator with Flat Region
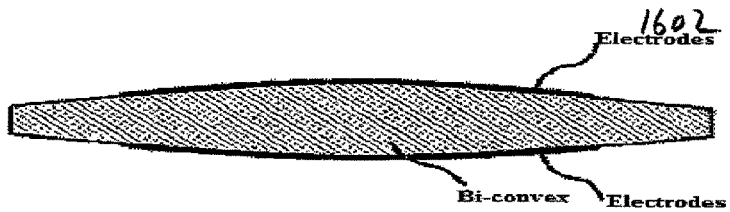
FIG. 17D  Bi-convex Resonator
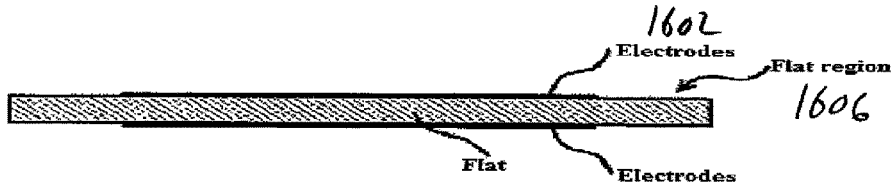
FIG. 17E  Flat-Flat Resonator
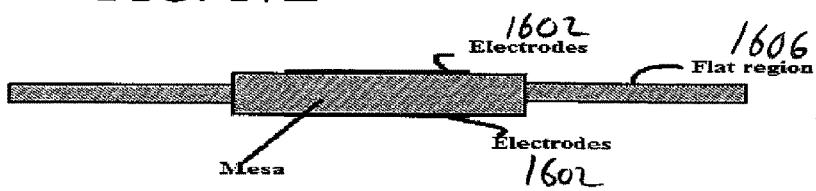
FIG. 17F  Mesa Resonator ent application claims the benefit of U.S. Application Ser. No. 61/845,262, filed Jul. 11, 2013, which

RESONATOR APPLICATIONS FOR LANGASITE AND ITS ISOMORPHS

PRIORITY

The present application claims the benefit of U.S. Application Ser. No. 61/845,262, filed Jul. 11, 2013, which application is incorporated herein, in its entirety, by reference.

TECHNICAL FIELD

The subject disclosure relates to resonator applications, such as clocks, pressure sensors, and temperature sensors. More particularly, the subject disclosure relates to resonator applications for langasite and its isomorphs.

BACKGROUND

Piezoelectric based measurement devices typically have a thickness-shear resonator located in a housing with electrodes. The thickness-shear resonator is generally made from quartz owing to its excellent stable properties under temperature and pressure, low hysteresis, high resolution, high accuracy, and good long-term stability. A thickness-shear resonator is useful in that it can be excited into resonance through the application of an external electric field, which is preferably applied to the resonator through electrodes formed thereon by means of vacuum deposition of conductive metals, such as copper, silver, or gold. The resonator frequency (or frequencies if the resonator is excited in both the thickness-shear modes of vibration) is dependent on the elastic coefficients, density, thickness, and overtone operation of the resonator. The resonator frequency shift in relation to changes in temperature, pressure, or externally applied force transmitted to the resonator via the housing. The capability of a thickness-shear resonator to experience a shift in its resonance frequency is quite useful in sensor applications (but not in frequency control) if the resonator is responding essentially to only one of the variables of temperature, pressure, voltage, or externally applied force within a relatively narrow operating range. If the resonator is responsive to more than one variable in its intended operating range, then the variable(s) other than the one being measured is compensated in order to successfully measure the desired variable. On the contrary, for frequency control applications, the thickness-shear resonator should not experience a shift in its resonance frequency in relation to changes in temperature, pressure or externally applied forces (for example, the stress caused by the mounting supports at their boundaries with the resonator).

Both theoretical and experimental results show that the frequency changes induced in a thickness-shear quartz resonator due to changes in temperature, pressure or externally applied forces are strongly dependent on its crystalline orientation, resonator geometry, material anisotropy, mounting supports, and aspect ratio. Recent discovery of Stress Compensated (SC-cut) and Stress Compensated B-mode Temperature Compensated C-mode (SBTC-cut) orientations of quartz have helped to significantly minimize these effects. The discovery of the SBTC-cut for the thickness-shear quartz resonator provided for the development of a dual-mode concept, which, in turn, led to the development of precision dual-mode quartz pressure sensors. Dual-mode based sensors utilize the fast thickness-shear mode (B-mode), which is stress compensated, and the slow thickness-shear mode (C-mode), which is temperature compensated. The frequency of the B-mode indicates primarily the temperature of the sensing resonator, and the frequency of the C-mode indicates the applied pressure. As the B-mode's frequency depends on the temperature of the resonator's vibrating volume, the effects of temperature gradients are greatly reduced. Thus, under pressure and temperature transients, dual-mode sensors allow for superior temperature compensation accuracy and superior pressure sensing accuracy. The discovery of SC-cut for the thickness-shear quartz resonator let to the development of precision frequency control devices and applications requiring frequency stability, as it exhibited superior frequency-temperature stability over narrow temperature ranges to obtain good static compensation and frequency-stress stability.

Thus, the discovery of stress and temperature compensated crystalline orientations of quartz facilitated the development of a sensor with superior sensing characteristics and stable properties at its resonant frequency, even when subjected to thermal and mechanical stresses. This technology has been deployed for high precision pressure and temperature sensors in the oilfield services industry for the last two decades. The sensors provide reliable estimates of formation properties, such as pressure and temperature. These basic properties are used to determine other formation properties, like permeability and oil/water interfaces in the formation, which, in turn, are used to facilitate optimal completion of wells for oil and gas production. In addition, the quartz resonators are used as frequency control devices in the oilfield for timing (telemetry) applications.

Although quartz has been a valuable resonator material in the oilfield services industry, the low phase transition temperature of quartz, which occurs at 573° C., limits its application up to 250° C. Thus, quartz resonators cannot be used for certain oil and gas field applications. For example, quartz resonators cannot be used for deeper and more productive oil/gas exploration because of the high temperatures associated with drilling deeper into the Earth.

SUMMARY

Illustrative embodiments of the present disclosure are directed to an oscillator with a langasite resonator that vibrates at an oscillating frequency in a thickness-shear mode of vibration. The resonator includes a crystal orientation (yxwl) $\Phi/\Theta$ that is within plus or minus 4° in $\Phi$ and 4° in $\Theta$ of the following orientations: (i) 1.5°/1.5°, (ii) 12.5°/22.0°, (iii) 47.5°/−22.0°, (iv) 60.0°/−3.0°, (v) 2.0°/34.5°, (vi) 2.0°/−43.0°, (vii) 58.0°/43.0°, (viii) 60.0°/−34.5°, (ix) 32.0°/44.0°, (x) 28.0°/−44.0°, (xi) 34.5°/76.5°, (xii) 25.5°/−76.5°, and (xiii) corresponding orientations for orientations (i)-(xii).

In various embodiments, the resonator vibrates in a slow thickness-shear mode, a fast thickness shear mode, or both. The oscillator can be used to measure pressure, measure temperature, and/or to maintain a stable oscillating frequency Various embodiments of the present disclosure are also directed to a method for vibrating the oscillator. The oscillator is vibrated at an oscillating frequency in a thickness-shear mode of vibration. The oscillating frequency can be used to derive a temperature, a pressure, or both.

Illustrative embodiments of the present disclosure are also directed to an oscillator with a resonator that vibrates at an oscillating frequency in a thickness-shear mode of vibration. The resonator is formed from one of: (i) a langasite material with a crystal orientation (yxwl) $\Phi/\Theta$ that is within plus or minus 4° in $\Phi$ and 4° in $\Theta$ of the orientations in Table 5D and corresponding orientations; (ii) a langatate material with a crystal orientation (yxwl) Φ/Θ that is within plus or minus 4° in Φ and 4° in Θ of the orientations in Table 5E, Table 6C, and corresponding orientations; and (iii) a langanite material with a crystal orientation (yxwl) Φ/Θ that is within plus or minus 4° in Φ and 4° in Θ of the orientations in Table 5F, Table 6D, and corresponding orientations.

BRIEF DESCRIPTION OF THE DRAWINGS

Further features and advantages will become more readily apparent from the following detailed description when taken in conjunction with the accompanying drawings:

FIGS. 17A-17F show examples of cross sectional shapes for plate-shaped resonators in accordance with various embodiment of the present disclosure;

DETAILED DESCRIPTION

Figure 1:
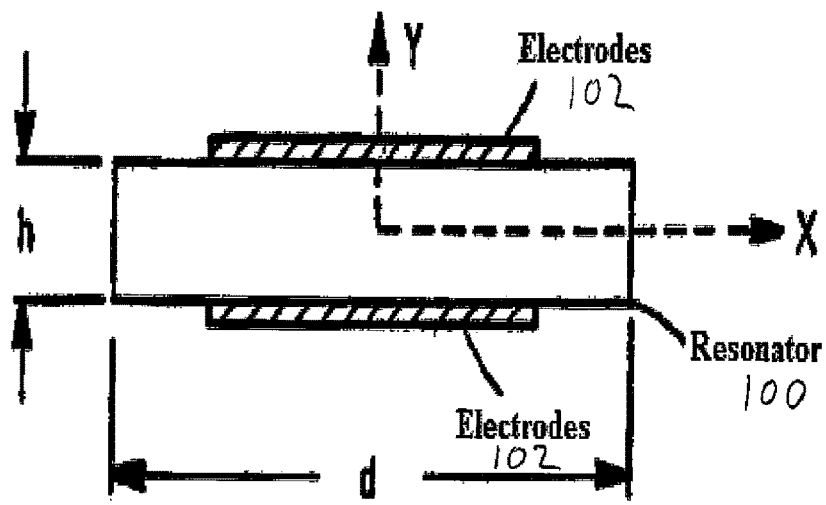
FIG. 1 shows a cross section of a resonator in accordance with one embodiment of the present disclosure.

Illustrative embodiments of the present disclosure are described below. As used herein, langasite (LGS), langatate (LGT), and langanite (LGN) are together called "LGX." LGX refers to a crystalline material belonging to the trigonal crystal system, international point group 32, class $D_3$ (Schoenflies symbol). The crystalline orientation of a given LGX cut is specified herein in accordance to IEEE Standards-176 on Piezoelectricity, pp. 26-28 (1987). Both singly rotated and doubly rotated cuts will be referred to herein by the nomenclature (YXlw) Φ/Θ. In Table 1, typical values of second-order elastic constants, piezoelectric constants, and dielectric constants of LGS and its isomorphs are listed. In Table 2, typical values of third-order elastic constants of LGS are listed. In Table 3, typical values of the first and second order temperature coefficients of elastic constants, thermal expansion, piezoelectric constants, and dielectric constants for LGS are listed. These constants and coefficients for LGN and LGT can be obtained from Malocha, D., et al., "Recent Measurements of Material Constants versus Temperature for Langatate, Langanite and Langasite," Proceeding of the IEEE International Frequency Control Symposium and Exhibition, 2000, pp. 200-205. Further details regarding crystalline orientations and application of crystal resonators are provided in U.S. Pat. No. 4,419,600, issued on Dec. 6, 1983 to Sinha.

TABLE 1

Material Constants for LGS, LGN and LGT. Room Temperature is 25° C. All values are with respect to the IEEE 176-1987 Standard on Piezoelectricity.

| Constants at Ref. Temp. 25° C. | Langasite (LGS) | Langatate (LGT) | Langanite (LGN) |
|---|---|---|---|
| Density (kg/m³) | 5739.20 | 6150.4 | 6028.90 |
| Elastic Constant $C_{11}$ (GPa) | 188.49 | 188.52 | 192.99 |
| Elastic Constant $C_{66}$ (GPa) | 42.21 | 40.32 | 41.16 |
| Elastic Constant $C_{33}$ (GPa) | 261.168 | 261.80 | 264.65 |
| Elastic Constant $C_{44}$ (GPa) | 53.71 | 51.10 | 49.56 |
| Elastic Constant $C_{14}$ (GPa) | −14.15 | −13.51 | −14.85 |
| Elastic Constant $C_{13}$ (GPa) | 96.88 | 103.36 | 102.25 |

TABLE 1-continued

Material Constants for LGS, LGN and LGT. Room Temperature
is 25° C. All values are with respect to the
IEEE 176-1987 Standard on Piezoelectricity.

| Constants at Ref. Temp. 25° C. | Langasite (LGS) | Langatate (LGT) | Langanite (LGN) |
|---|---|---|---|
| Piezoelectric Constant $e_{11}$ (C/m²) | −0.402 | −0.456 | −0.452 |
| Piezoelectric Constant $e_{14}$ (C/m²) | −0.130 | −0.094 | −0.061 |
| Relative Dielectric Constant $\varepsilon_{11}$ | 19.62 | 18.271 | 20.089 |
| Relative Dielectric Constant $\varepsilon_{33}$ | 49.41 | 78.95 | 79.335 |

TABLE 2

Nonlinear Elastic Stiffnesses (Third-order Elastic Constants)
of LGS. Room Temperature is 25° C. All values are with
respect to the IEEE 176-1987 Standard on Piezoelectricity.

| Third Order Elastic Constants | Langasite (LGS) |
|---|---|
| $C_{111}$ (GPa) | −972.0 |
| $C_{112}$ (GPa) | 7.0 |
| $C_{113}$ (GPa) | −116.0 |
| $C_{114}$ (GPa) | −22.0 |
| $C_{123}$ (GPa) | 9.0 |
| $C_{124}$ (GPa) | −28.0 |
| $C_{133}$ (GPa) | −721.0 |
| $C_{134}$ (GPa) | −41.0 |
| $C_{144}$ (GPa) | −40.0 |
| $C_{155}$ (GPa) | −198.0 |
| $C_{222}$ (GPa) | −965.0 |
| $C_{333}$ (GPa) | −1834.0 |
| $C_{344}$ (GPa) | −389.0 |
| $C_{444}$ (GPa) | 202.0 |

TABLE 3

Temperature Coefficients of Material Constants
for LGS. All values are with respect to the IEEE
176-1949 (R1971) Standard on Piezoelectricity.

| Temperature Coefficients of LGS | First-order (×10⁻⁶) | Second-order (×10⁻⁹) |
|---|---|---|
| Elastic Constant $C_{11}$ | −43.908 | −8.183 |
| Elastic Constant $C_{66}$ | −22.432 | −64.402 |
| Elastic Constant $C_{33}$ | −91.904 | −491.305 |
| Elastic Constant $C_{44}$ | −44.046 | 127.130 |
| Elastic Constant $C_{14}$ | −309.099 | 261.107 |
| Elastic Constant $C_{13}$ | −61.952 | −1446.007 |
| Thermal Expansion - Y | 5.630 | 5.979 |
| Thermal Expansion - Z | 4.079 | 4.577 |
| Density | −15.34 | −13.460 |
| Piezoelectric Constant $e_{11}$ | 329.0 | 199.0 |
| Piezoelectric Constant $e_{14}$ | −342.0 | 2287.0 |
| Relative Dielectric Constant $\varepsilon_{11}$ | 322.90 | −1073.0 |
| Relative Dielectric Constant $\varepsilon_{33}$ | −737.10 | 543.90 |

In the disclosure that follows, the orientations of LGX will be provided for a "primitive region" of Φ/Θ defined by 0°<Φ<60° and −90°<Θ<90°. All corresponding orientations within the full 360 degrees of rotation of Φ and Θ are thereby defined and included when the orientation in the primitive region is specified. LGS and its isomorphs exhibit trigonal and diagonal symmetry about Z and X axes, respectively, meaning that orientations having Φ=n (120°)±Φ0 (for n=0, 1, 2) and Θ=Θ0+m (180°) (where m=0, 1) exactly correspond to the orientation in the primitive region because of the crystalline symmetry. In addition to the trigonal and diagonal symmetry described above, the stress compensated orientations have been found to exhibit a diagonal-mirror type of symmetry that is represented by the relationships:

$$\Phi = 60° - n(120°) \pm \Phi 0 \text{ where } n=0,1,2 \quad (1)$$

$$\Theta = -\Theta 0 \quad (2)$$

The various symmetries of stress compensated LGS, therefore, permit definition of a primitive region defined by 0°<Φ<60° and −90°<Θ<+90°. Each orientation in the primitive region will correspond to eleven other orientations in their respective thickness mode characteristics. All orientations or loci which can be derived from a particular orientation or loci in the primitive region by application of these symmetrical relationships (trigonal, diagonal, and diagonal-mirror) correspond to the particular orientation in so-far as their stress compensated behavior is concerned. Accordingly, the term "corresponding orientations" is defined herein as all orientations which can be derived from a particular orientation in the primitive region by application of the trigonal, diagonal, or diagonal-mirror symmetry. An orientation in the primitive region 0°<Φ<60° and −90°<Θ<90° comprehensively defines and includes all corresponding orientations within the full 360° of rotation of Φ and Θ.

As used herein, "resonator" refers to a suitably shaped, contoured, and polished material that is capable of operation in a thickness-shear mode of vibration. FIG. 1 shows a cross section of a resonator 100. The resonator 100 has a disk or a disk-like vibratory region formed (e.g., cut) from LGX material. The resonator 100 has a rectangular cross section having diameter "d" and thickness "h," for which X and Y are two of the three axes parallel and normal to the major plane of the resonator, respectively. Axes X and Y define orientation angles relative to the principal axes. In some embodiments, after the cutting of the LGX material is performed, both of the opposite surfaces of the resonator are contoured so as to produce a LGX crystal adapted for use as a bi-convex resonator. In other embodiments, after the cutting is performed, one of these opposite surfaces is contoured to produce a LGX crystal that is adapted for use as a plano-convex resonator. The contouring of the surfaces is desirable for the operation of the resonator in a trapped energy mode of vibration, whereby the Q-factor of the resonator is increased. Electrodes 102 are provided for exciting the LGX material, and may comprise, for example, a thin metallic film vapor deposited on select areas of the resonator 100. In further embodiments, the LGX resonators are used in a so-called "electrodeless" manner. In that manner, an AC electric field of high voltage is applied to the opposite surfaces of the crystal across an air gap of a few microns.

Figure 2:
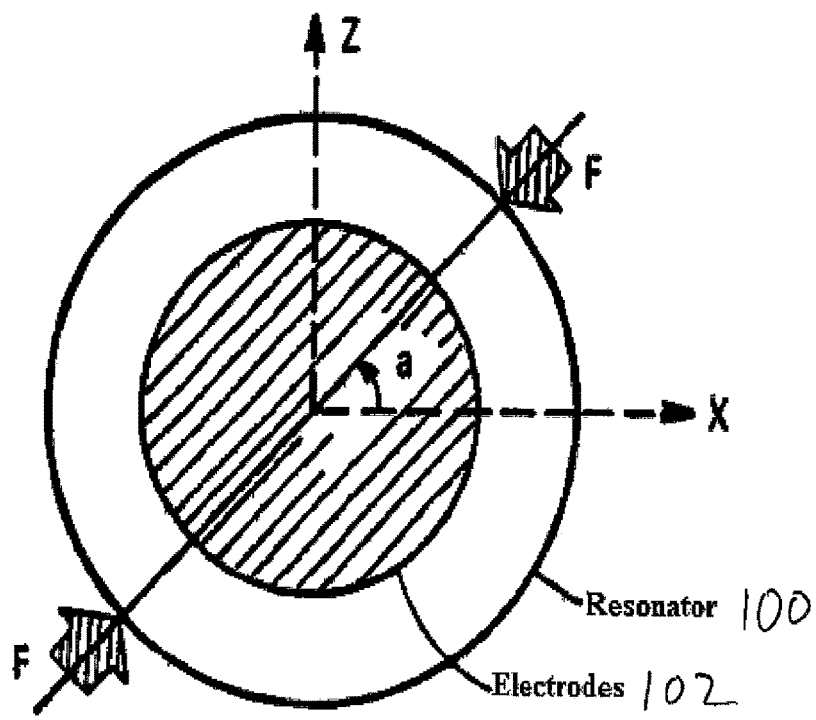
FIG. 2 shows a top view of the resonator of FIG. 1.

FIGS. 1 and 2 show a disk resonator, but the embodiments of the present disclosure are not limited to this geometry. Other geometries, such as rectangular or square plates can also be used.

FIG. 2 shows a top view of the resonator 100. The third or Z axis of orientation of the vibratory resonator 100 is shown, as well as the arrows "F" representing opposite force vectors, which when integrated 180° about the resonator result in radially uniform planar stresses acting on the resonator. The angle "a" is defined by the direction of discrete force vectors and the X-axis. These stresses arise from electrodes, externally applied loads, mechanical mounts, and/or acceleration.

A thickness mode LGX resonator vibrates in three modes of motion, the thickness-extensional ("A" mode), the fast thickness-shear ("B-mode"), and the slow thickness-shear ("C-mode"), such that resonant frequencies follow the relation $f_A > f_B \geq f_C$. The displacement directions of the modes are mutually perpendicular in all materials, although the displacement directions relative to the resonator surface may differ as a function of the material. In isotropic or cubic material, two of the three displacement directions are shear and the third is thickness extension, and the directional displacements are either in the plane X-Z of the resonator or perpendicular to the plane. In anisotropic materials, the three displacement directions generally are neither parallel to nor exactly perpendicular to a normal to the surface, although they are orthogonal (e.g., the directions can be obliquely oriented with respect to the orthogonal axes containing the resonator surface normal (Y), and resonator plane (X-Z)). LGX is an anisotropic material and, therefore, reference herein to the shear modes B and C pertains not to a precise-shear mode of motion relative to the resonator surface, but rather to modes of motion which are predominantly shear. The axes of these modal displacements are indicated in FIGS. 1 and 2 as X, Y and Z.

The natural resonant frequencies of a LGX resonator are affected by a static mechanical stress bias, which can be caused by electrode stresses, externally applied loads, mechanical mounts, and acceleration, in addition to uniform and non-uniform heating of the resonator. In various embodiments, the mechanical stress bias on the resonator is configured to act on the resonator parallel to its major plane such that all (or most) stresses are radially uniform and planar within the resonator. For this purpose, in illustrative embodiments, the resonator has a disk or a disk-like vibratory region. In this case, both the frequency-temperature and frequency-stress behavior of a LGX resonator can be represented by equation (3) as:

$$\Delta f/f_0 = A(\Delta T) + B(\Delta T)^2/2! + C(\Delta T)^3/3! + \ldots + D(\Delta P) \quad (3)$$

where higher order terms can be ignored and where "D" is the stress coefficient of frequency and $\Delta P$ is the resonator stress minus a selected reference stress. Where frequency-stress stability is desired in a non-zero $\Delta P$ environment without external stress compensation, the stress coefficient "D" is made zero or close to zero. LGX cuts having such a stress coefficient are referred to as "stress compensated". Where frequency-temperature stability is desired in a non-zero $\Delta T$ environment without external compensation, the temperature coefficient "A" is made zero or close to zero. LGX cuts having such a temperature coefficient value are referred to as "temperature compensated". Where frequency-temperature and frequency-stress stability ($\Delta f/f_0=0$) is desired in a non-zero $\Delta T$ and $\Delta P$ environment without external compensation, the coefficients "A" and "D" are made zero or close to zero. LGX cuts having such a stress and temperature coefficient value are referred to as "stress and temperature compensated".

In an investigation of the stress-frequency behavior of the resonator 100 in FIG. 2, the stress coefficient "D" of equation (1) is considered to be the mean stress coefficient $\langle K_f \rangle$, which is given by:

$$\langle K_f \rangle = \frac{1}{\pi} \int_0^\pi K_f(a) da \quad (4)$$

where:

$$K_f = [\Delta f/f][dh/FN] \quad (5)$$

and in which d and h are defined above, "F" is the planar force in Newton, "N" (which equals hf) is the frequency constant in meters/sec, and $\Delta f/f$ is the resulting fractional change in the resonant frequency for a given mode of vibration. The mean stress coefficient $\langle K_f \rangle$ for an anisotropic material like LGX is dependent not only on the second-order elastic constants, but also on the third-order elastic constants of LGX. The stress-frequency behavior of LGS is described herein.

Figure 3:
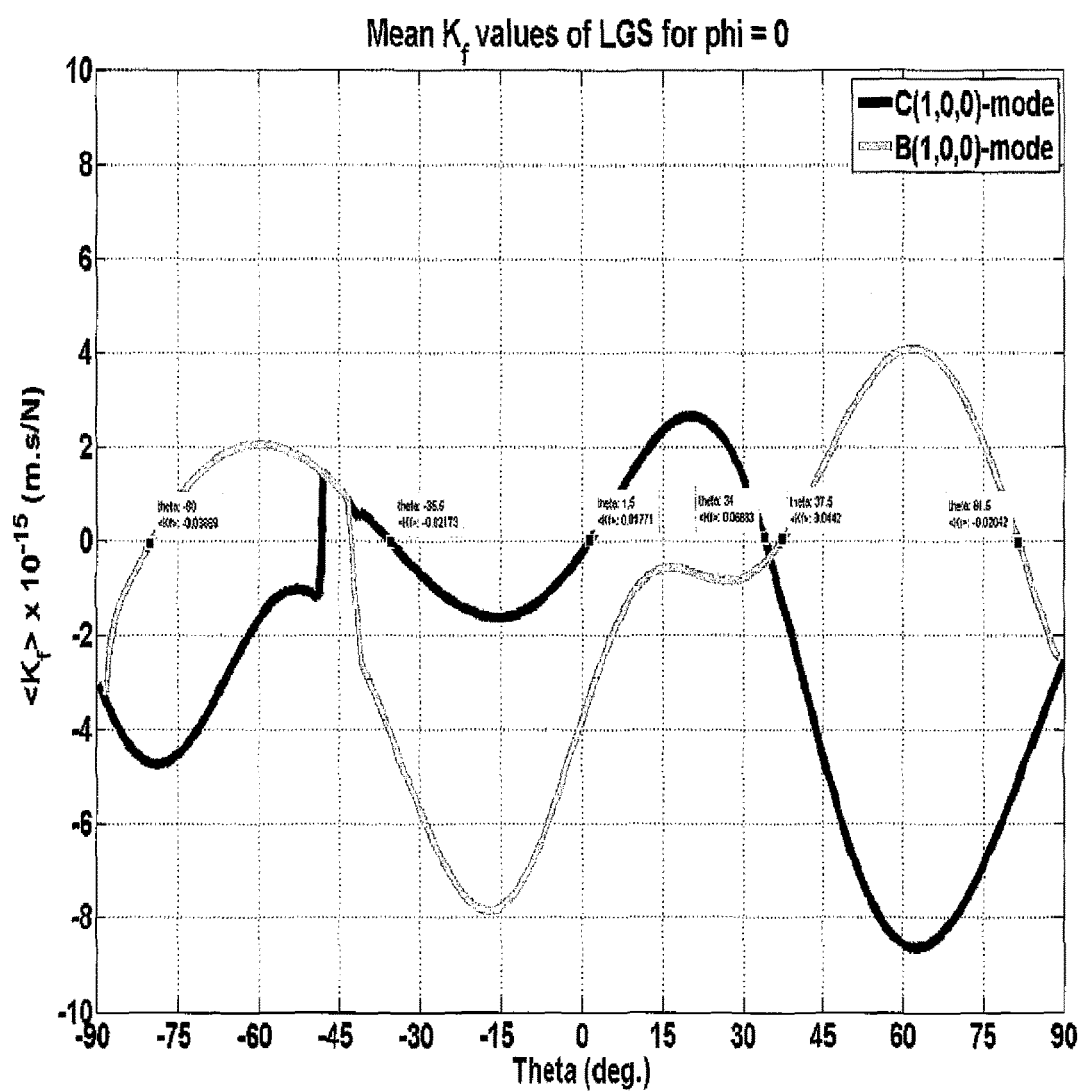
FIG. 3 shows a plot of mean force sensitivity coefficients for Φ=0.0° and Θ varied from −90° to +90° for Langasite (LGS) in accordance with one embodiment of the present disclosure.
Figure 4:
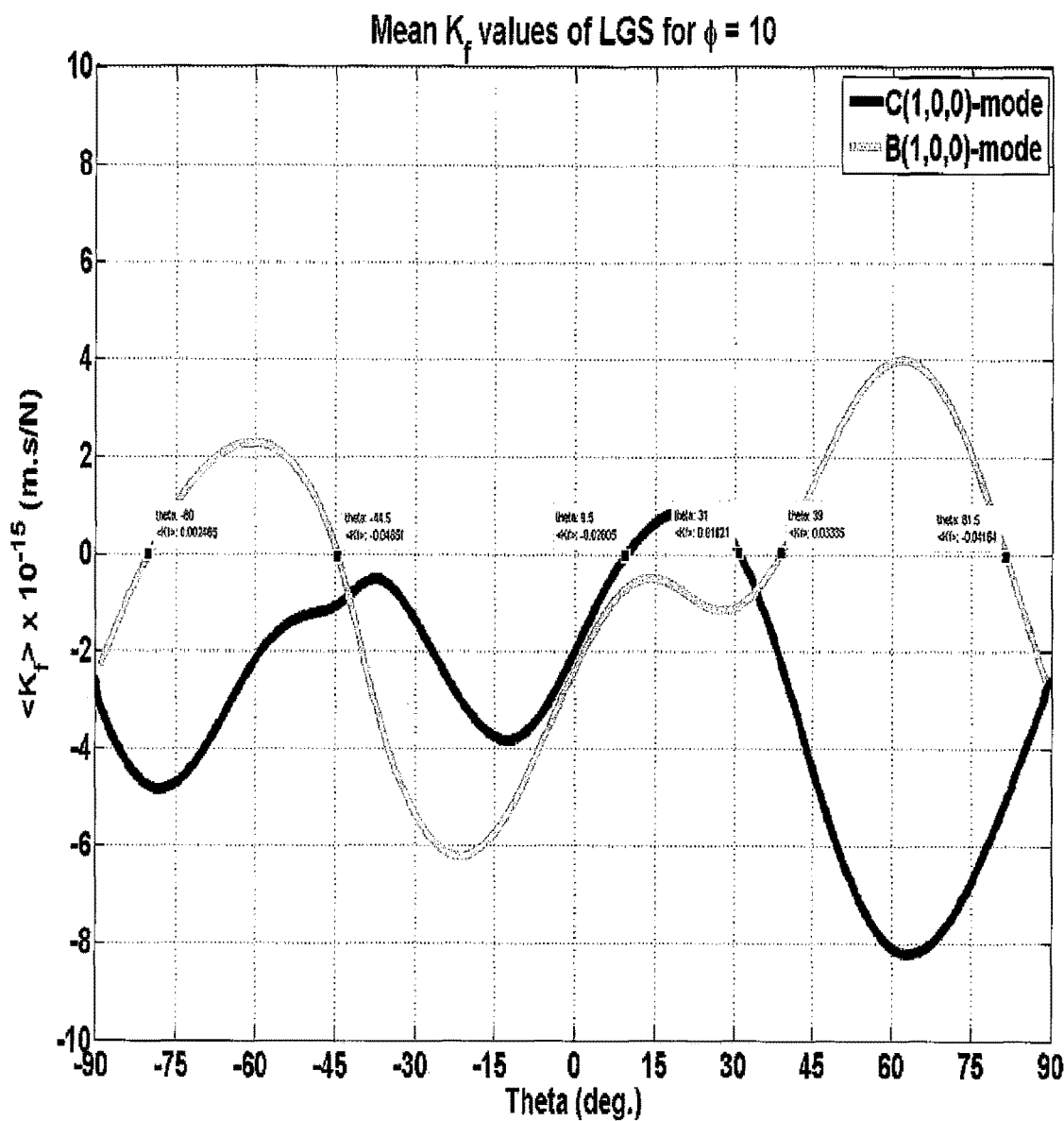
FIG. 4 shows a plot of mean force sensitivity coefficients for Φ=10.0° and Θ varied from −90° to +90° for LGS in accordance with one embodiment of the present disclosure.
Figure 5:
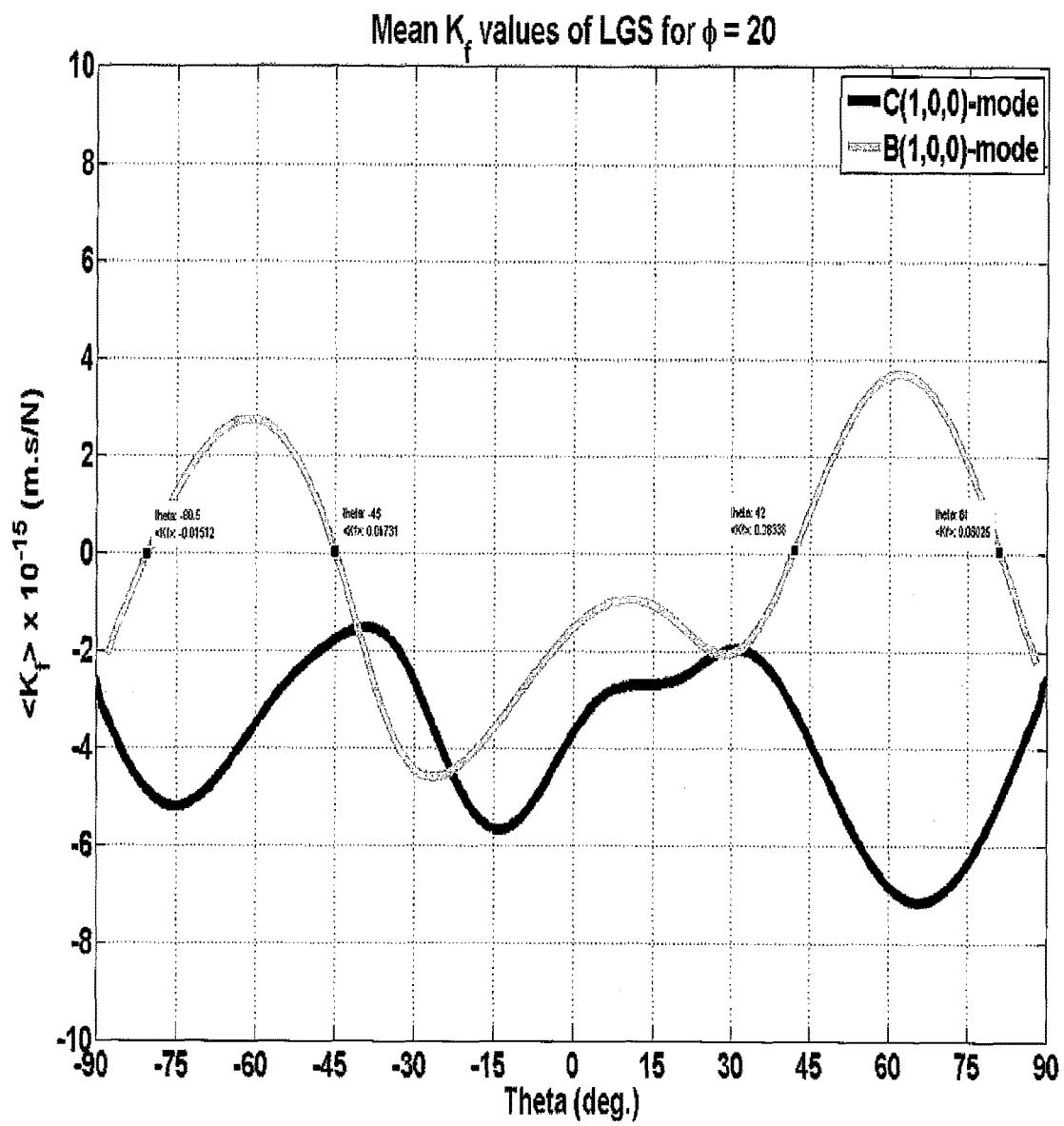
FIG. 5 shows a plot of mean force sensitivity coefficients for Φ=20.0° and Θ varied from −90° to +90° for LGS in accordance with one embodiment of the present disclosure.
Figure 6:
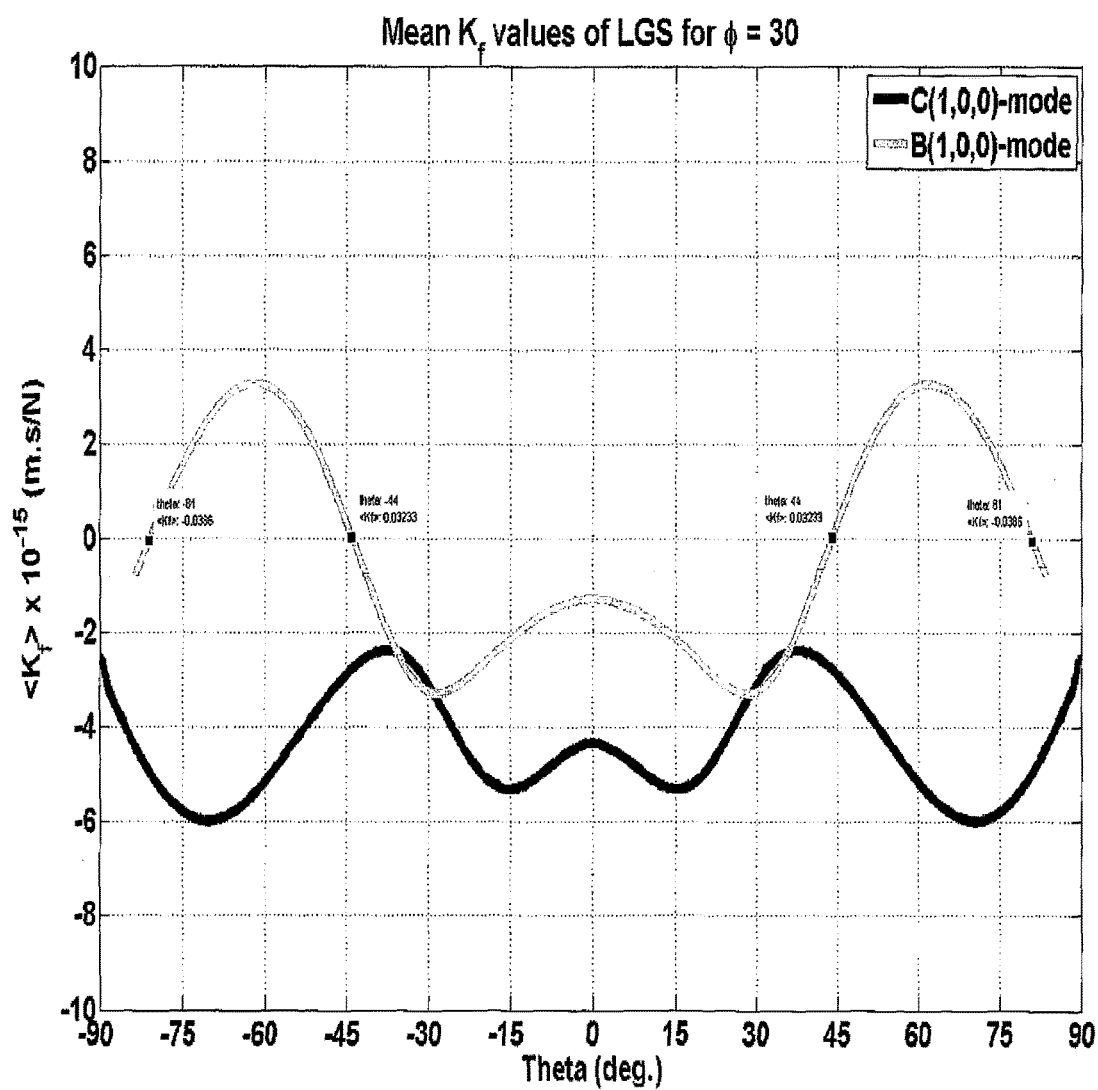
FIG. 6 shows a plot of mean force sensitivity coefficients for Φ=30.0° and Θ varied from −90° to +90° for LGS in accordance with one embodiment of the present disclosure.

A few representative illustrations of the behavior of the mean stress coefficient $\langle K_f \rangle$ of LGS are presented for the C-mode and the B-mode in FIGS. 3-6. FIG. 3 shows the mean force sensitivity coefficients for $\Phi=0.0°$ and $\Theta$ varied from $-90°$ to $+90°$. A zero-valued mean force coefficient $\langle K_f \rangle$ for the C-mode is found at (YXlw) 0.0°/−35.5°, (YXlw) 0.0°/1.5°, and (YXlw) 0.0°/34.0°. A zero-valued mean force coefficient $\langle K_f \rangle$ for the B-mode is found at (YXlw) 0.0°/−80.0°, (YXlw) 0.0°/37.5°, and (YXlw) 0.0°/81.5°. FIG. 4 shows the mean force sensitivity coefficients for $\Phi=10.0°$ and $\Theta$ varied from $-90°$ to $+90°$. A zero-valued mean force coefficient $\langle K_f \rangle$ for the C-mode is found at (YXlw) 10.0°/9.5° and (YXlw) 10.0°/31.0. A zero-valued mean force coefficient $\langle K_f \rangle$ for the B-mode is found at (YXlw) 10.0°/−80.0°, (YXlw) 10.0°/−44.5°, (YXlw) 10.0°/39.0° and (YXlw) 10.0°/81.5°. FIG. 5 shows the mean force sensitivity coefficients for $\Phi=20.0°$ and $\Theta$ varied from $-90°$ to $+90°$. No zero-valued mean force coefficient $\langle K_f \rangle$ for the C-mode exists for these orientations. A zero-valued mean force coefficient $\langle K_f \rangle$ for the B-mode is found at (YXlw) 20.0°/−80.5°, (YXlw) 20.0°/−45.0°, (YXlw) 20.0°/42.0°, and (YXlw) 10.0°/81.0°. FIG. 6 shows the mean force sensitivity coefficients for $\Phi=30.0°$ and $\Theta$ varied from $-90°$ to $+90°$. No zero-valued mean force coefficient $\langle K_f \rangle$ for the C-mode exists for these orientations. A zero-valued mean force coefficient $\langle K_f \rangle$ for the B-mode is found at (YXlw) 30.0°/−81.0°, (YXlw) 30.0°/−44.0°, (YXlw) 30.0°/44.0°, and (YXlw) 30.0°/81.0°.

Figure 7:
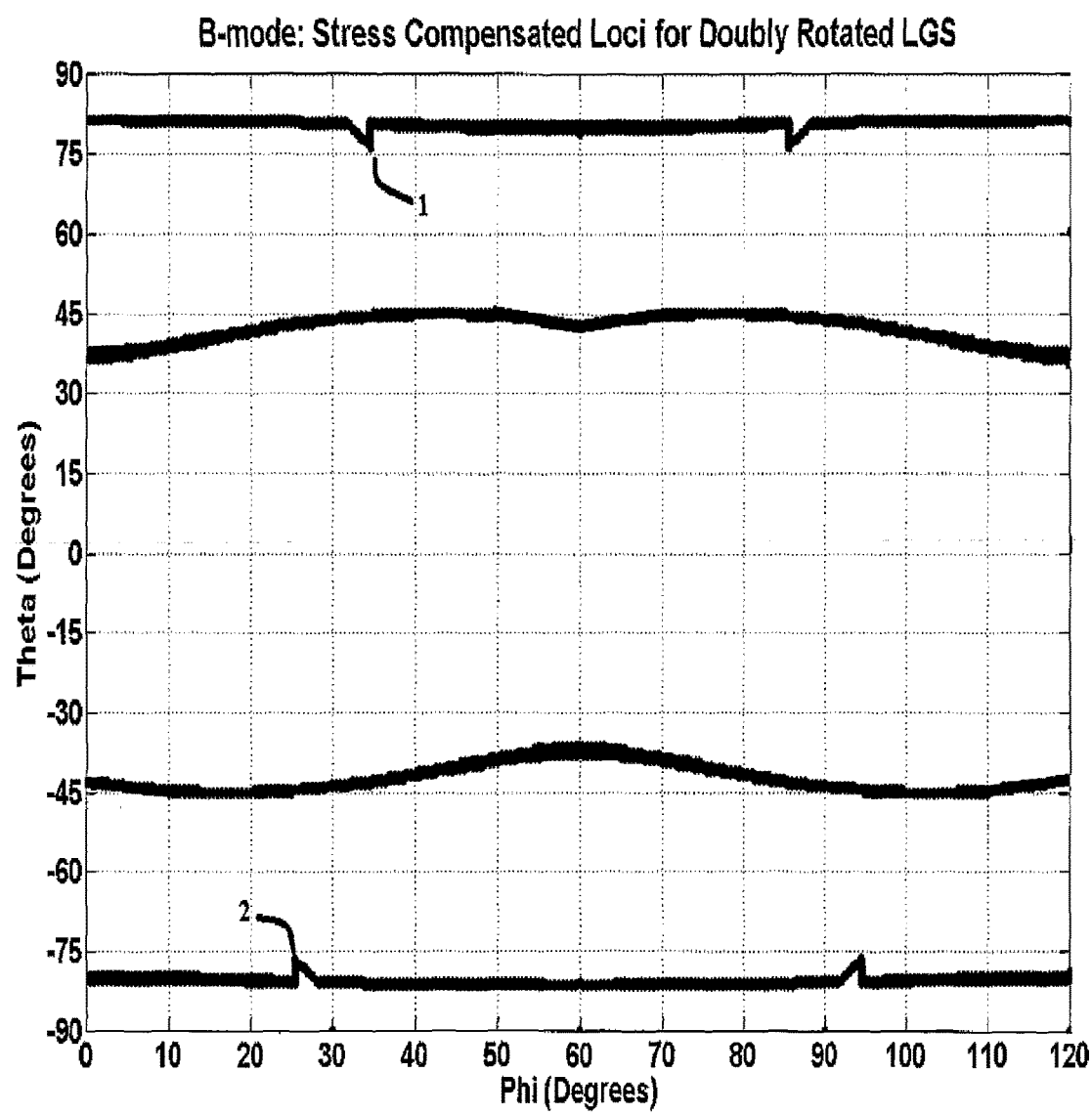
FIG. 7 shows a plot of B-mode stress compensated loci for doubly rotated LGS in accordance with one embodiment of the present disclosure.
Figure 8:
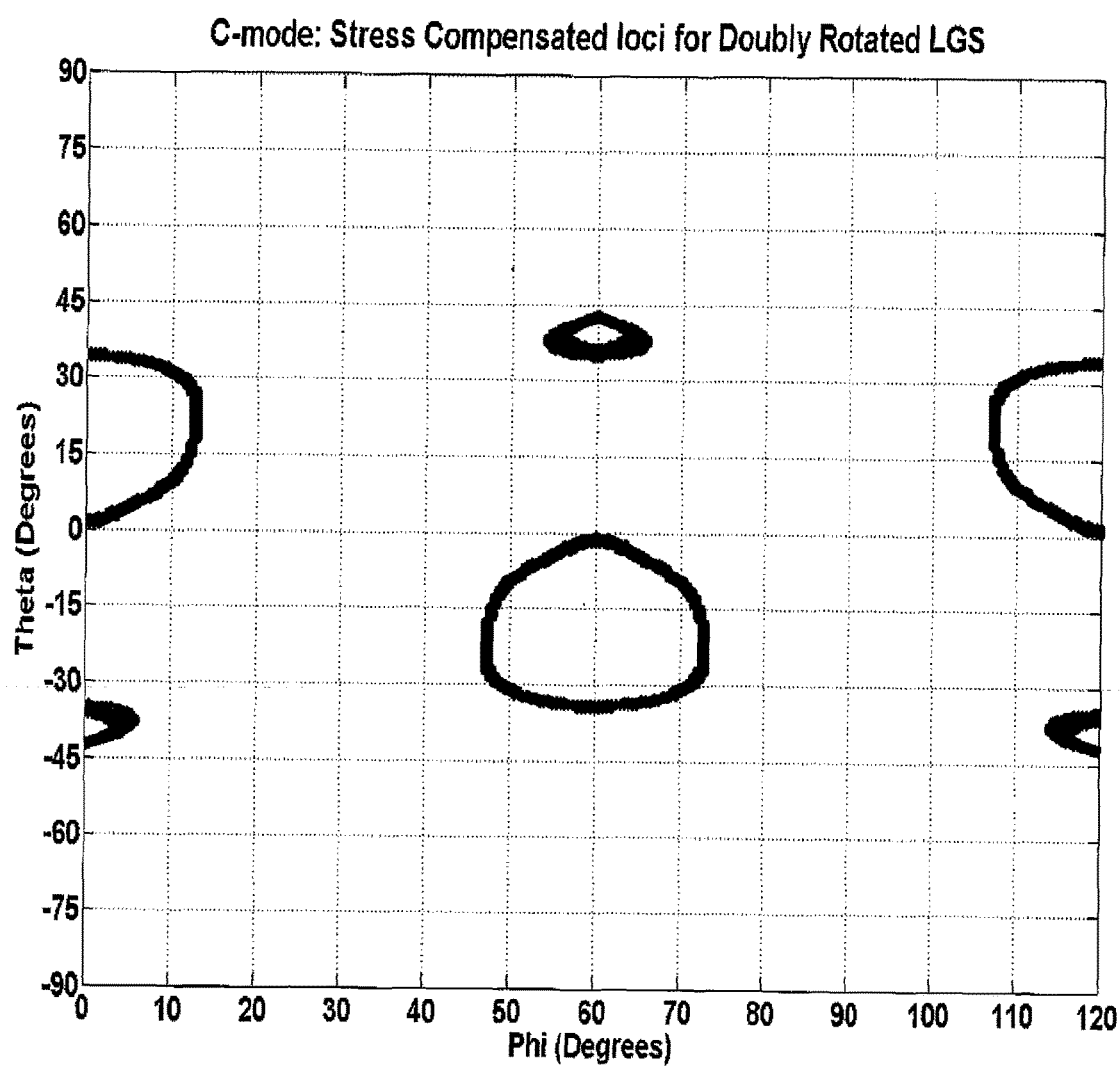
FIG. 8 shows a plot of C-mode stress compensated loci for doubly rotated LGS in accordance with one embodiment of the present disclosure.

By analyzing the variation of the mean stress coefficient $\langle K_f \rangle$ for each thickness-shear mode of vibration for $0° < \Phi < 120°$ and $-90° < \Theta < 90°$, the description above shows that a sufficient number of discrete orientations having zero valued $\langle K_f \rangle$ exist to permit the development of loci of stress compensated orientations for the thickness-shear modes of LGS. The corresponding plots of the loci of the B-mode and the C-mode stress compensated orientations are presented in FIGS. 7 and 8, respectively. Additional numerical results for the stress compensated locus of B-mode for LGS are presented in Table 4. The C-mode for LGT and LGN has an approximate zero-valued mean force coefficient $\langle K_f \rangle$ for (YXlw) 0.0°/0.0°. See, for example, Yoonkee, K., et al., "Force-Frequency Effect of Y-cut Langanite and Y-cut Langatate," IEEE-Transactions on Ultrasonics, Ferroelectrics, and Frequency Control, Vol. 50, No. 12, December 2003.

TABLE 4

| B-mode Stress Compensated Locus for LGS. | | | | |
|---|---|---|---|---|
| Locus 1 expressed as (YXlw) Φ/Θ | | | | |
| 32.0/80.5 | 32.5/79.5 | 33.0/79.0 | 33.5/78.0 | 34.0/77.5 |
| 34.5/76.5 | 34.5/77.5 | 34.5/78.5 | 34.5/79.5 | 34.5/80.5 |
| Locus 2 expressed as (YXlw) Φ/Θ | | | | |
| 25.0/−80.5 | 25.5/−80.0 | 25.5/−79.0 | 25.5/−77.0 | 25.5/−76.5 |
| 26.0/−77.5 | 26.5/−78.0 | 27.0/−79.0 | 28.0/−80.0 | 28.5/−81.0 |

The frequency-temperature behavior of LGX disks of generalized orientation can be predicted from data on the thermal expansion coefficient of LGX and the dependence of elastic constants upon temperature. For a generalized orientation, the dependence of thickness h upon temperature for a disk with orientation (YXlw) Φ/Θ is given by:

$$h = h_0(1 + \alpha^{(1)}\Delta T + \alpha^{(2)}\Delta T^2/2! + \alpha^{(3)}\Delta T^3/3!) \quad (6)$$

Density ρ(T) is given by:

$$\rho = \rho_0[1 - (2\alpha_{11}^{(1)} + \alpha_{33}^{(1)})\Delta T - (2\alpha_{11}^{(2)} + \alpha_{33}^{(2)})\Delta T^2/2! - (2\alpha_{11}^{(3)} + \alpha_{33}^{(3)})\Delta T^3/3!] \quad (7)$$

The dependence of the effective elastic constant upon temperature is determined from the solution of the secular equation resulting from the differential equations of plane modes in anisotropic media. This cubic equation has the matrix form:

$$\begin{vmatrix} \Gamma_{11} - \bar{c}_m & \Gamma_{12} & \Gamma_{13} \\ \Gamma_{21} & \Gamma_{22} - \bar{c}_m & \Gamma_{23} \\ \Gamma_{31} & \Gamma_{32} & \Gamma_{33} - \bar{c}_m \end{vmatrix} = 0 \quad (8)$$

The three $\bar{c}_m$ roots of this equation are real for all directions of propagation, and correspond to the three normal thickness modes. The three roots are identified $\bar{c}_m$, where m=A, B, and C such that $f_A \geq f_B \geq f_C$. Values for the $\Gamma_{ij}$ as a function of temperature are given in terms of the $c_{ij}$ and the direction cosines l, m, and n of the direction of wave propagation, which is the thickness direction of the plate. The dependence of the elastic constants upon temperature is given by:

$$c_{ij} = c_{ij_o}(1 + Tc_{ij}^{(1)}\Delta T + Tc_{ij}^{(2)}\Delta T^2/2! + Tc_{ij}^{(3)}\Delta T^3/3!) \quad (9)$$

where the values for these constants and their temperature coefficients are given in Table 1 and 2, respectively. The third-order temperature coefficients for the elastic constants, thermal expansion coefficients, piezoelectric constants, and dielectric constants for LGX shall not be taken into account for calculation. With this analytical approach, the frequency-thickness constants, and the first three terms of A, B, C in the power series expansion of frequency (equation 3) with respect to temperature were computed for the thickness mode of LGX for orientations in the range of 0°<Φ<120° and −90°<Θ<90°. In addition, the electromechanical coupling factor $k_m^2$ for these modes of LGX given by (equation 10) is also computed.

$$k_m^2 = (\bar{\gamma}_{mj} e_j)^2 / \bar{c}_m \varepsilon_{22} \quad (10)$$

where $e_j$, and $\varepsilon_{22}$ are, respectively, the piezoelectric constant and the dielectric constants listed in Table 1. The orthonormal eigenvectors $\bar{\gamma}_{mj}$ correspond to the roots $\bar{c}_m$ determined from equation 8. The orthonormal eigenvectors $\bar{\gamma}_{mj}$ determine the direction cosines of particle displacement for each modes with respect to the crystal axes.

Figure 9:
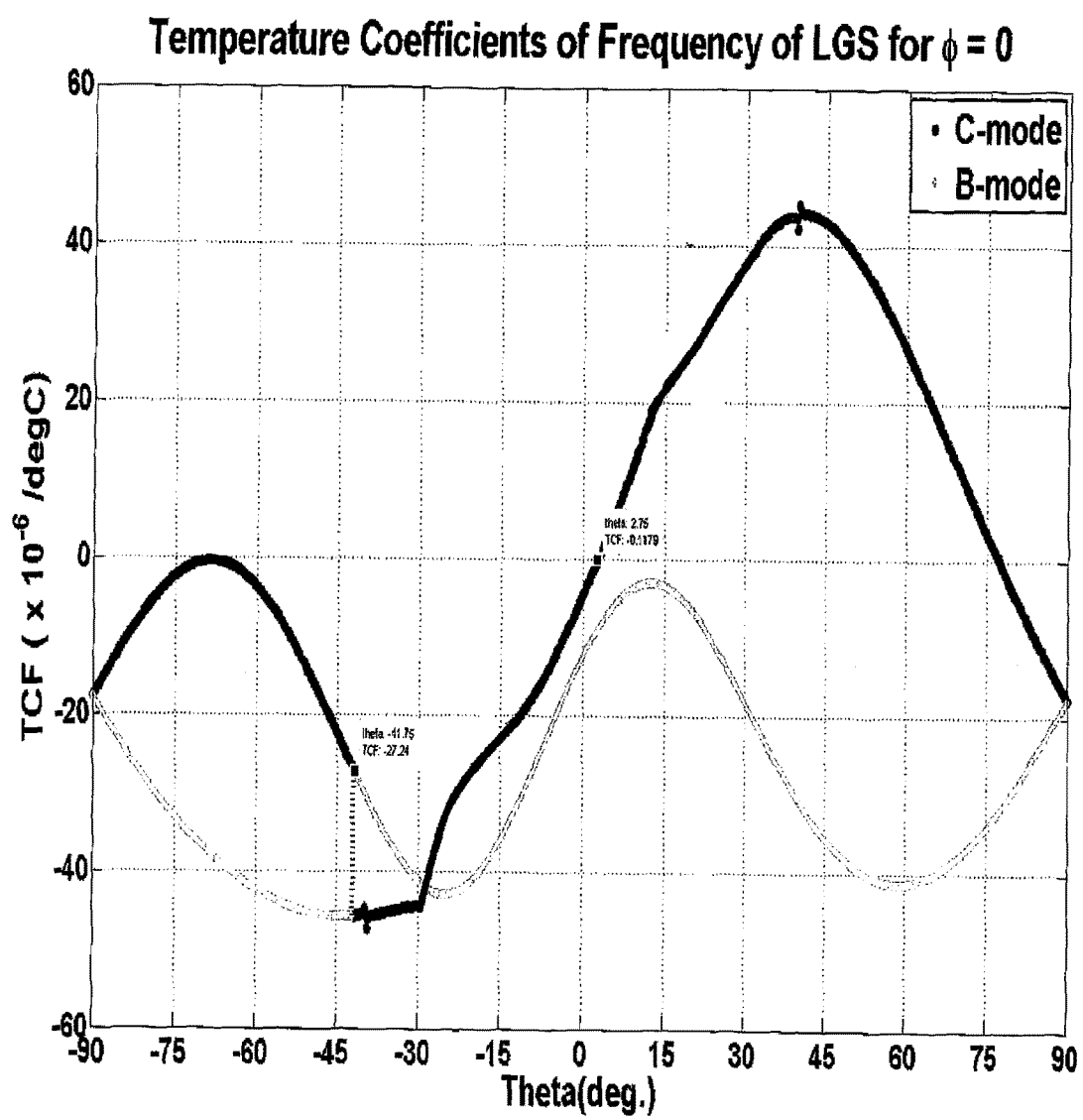
FIG. 9 shows a plot of temperature coefficients for Φ=0.0° and Θ varied from −90° to +90° for LGS in accordance with one embodiment of the present disclosure.
Figure 10:
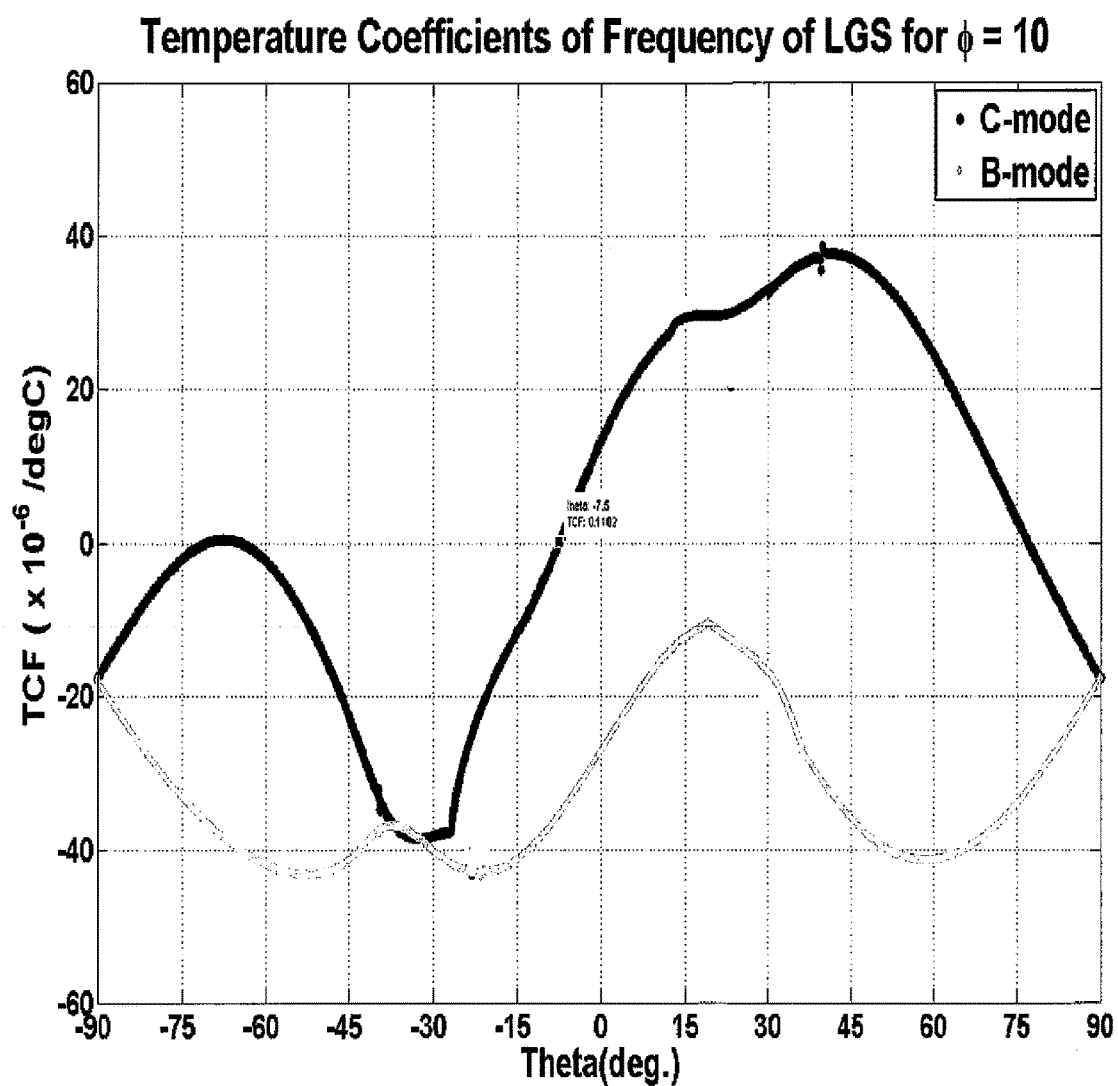
FIG. 10 shows a plot of temperature coefficients for Φ=10.0° and Θ varied from −90° to +90° for LGS in accordance with one embodiment of the present disclosure.
Figure 11:
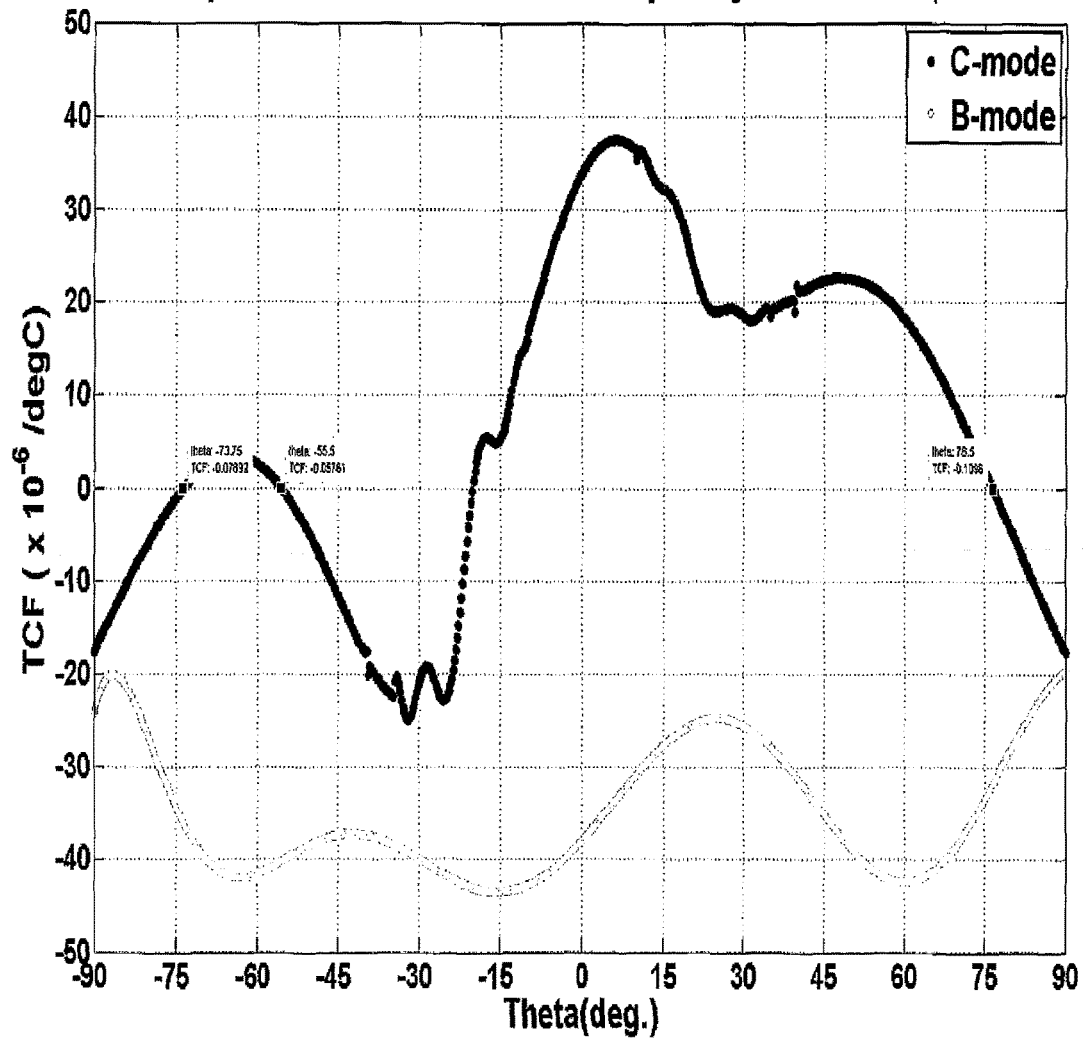
FIG. 11 shows a plot of temperature coefficients for Φ=20.0° and Θ varied from −90° to +90° for LGS in accordance with one embodiment of the present disclosure.

A few representative illustrations of the behavior of the temperature coefficient "A" are presented for the C-mode and the B-mode of Langasite (LGS) in FIGS. 9-12. FIG. 9 shows the temperature coefficients for Φ=0.0° and Θ varied from −90° to +90°. A zero-valued temperature coefficient "A" for the C-mode is found at (YXlw) 0.0°/−2.75°. No zero-valued temperature coefficient "A" for the B-mode exists for these orientations. FIG. 10 shows the temperature coefficients for Φ=10.0° and Θ varied from −90° to +90°. A zero-valued temperature coefficient "A" for the C-mode is found at (YXlw) 10.0°/−7.5°. No zero-valued temperature coefficient "A" for the B-mode exists for these orientations. FIG. 11 shows the temperature coefficients for Φ=20.0° and Θ varied from −90° to +90°. A zero-valued temperature coefficient "A" for the C-mode is found at (YXlw) 20.0°/−73.75°, (YXlw) 20.0°/−55.50°, and (YXlw) 20.0°/76.50°.

Figure 12:
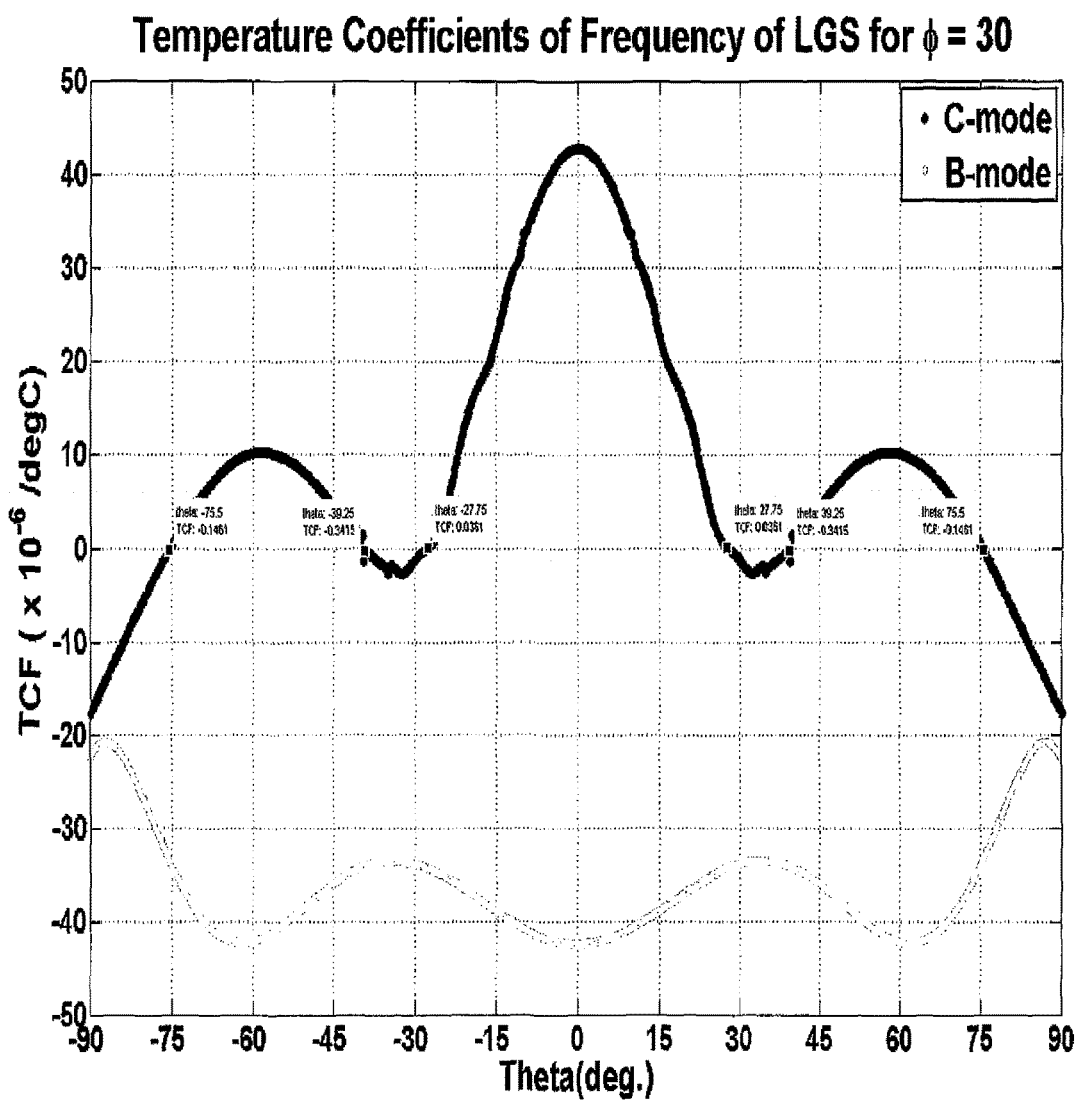
FIG. 12 shows a plot of temperature coefficients for Φ=30.0° and Θ varied from −90° to +90° for LGS in accordance with one embodiment of the present disclosure.

No zero-valued temperature coefficient "A" for the B-mode exists for these orientations. FIG. 12 shows the temperature coefficients for Φ=30.0° and Θ varied from −90° to +90°. A zero-valued temperature coefficient "A" for the C-mode is found at (YXlw) 30.0°/−75.50°, (YXlw) 30.0°/−39.25°, and (YXlw) 30.0°/−27.75°. No zero-valued temperature coefficient "A" for the B-mode exists for these orientations.

Figure 13A:
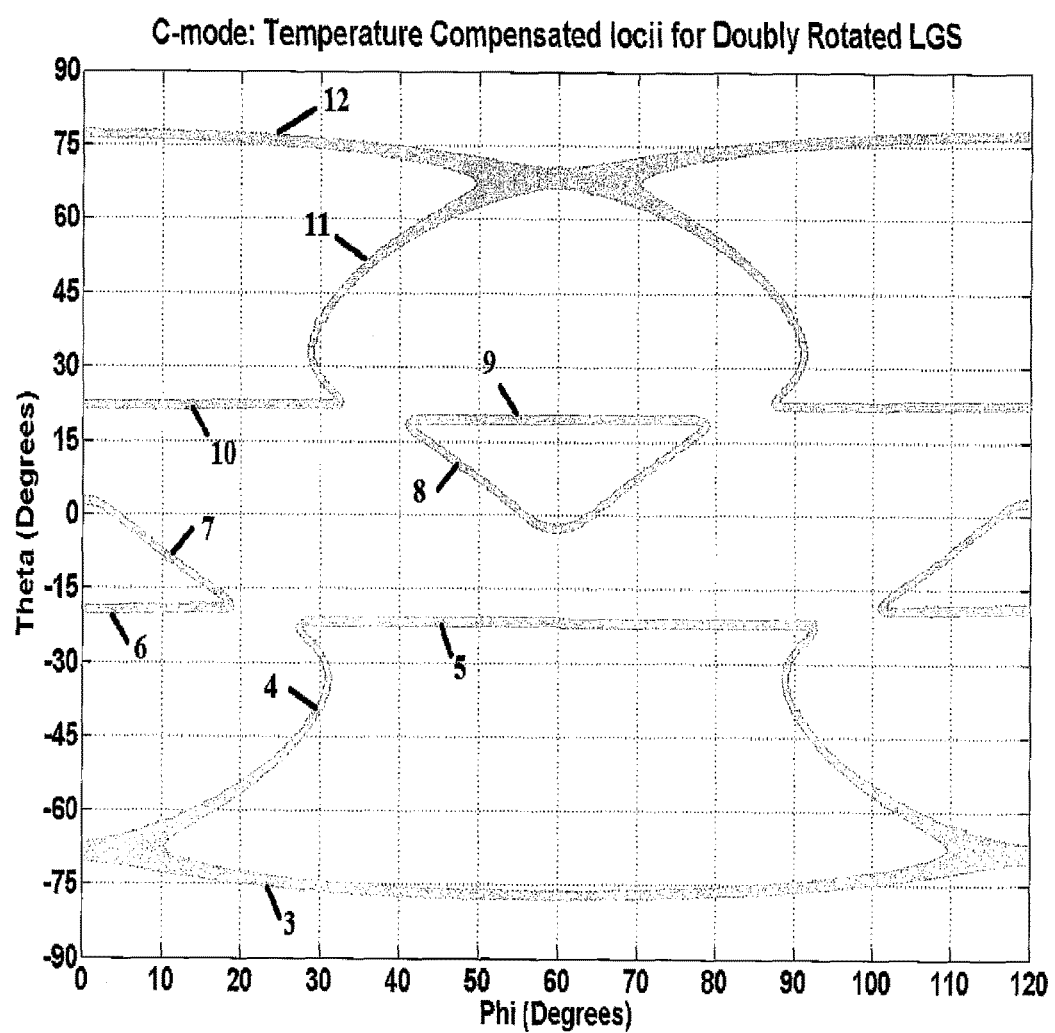
FIG. 13A shows a plot of temperature compensated loci for LGS in C-mode in accordance with one embodiment of the present disclosure.
Figure 13B:
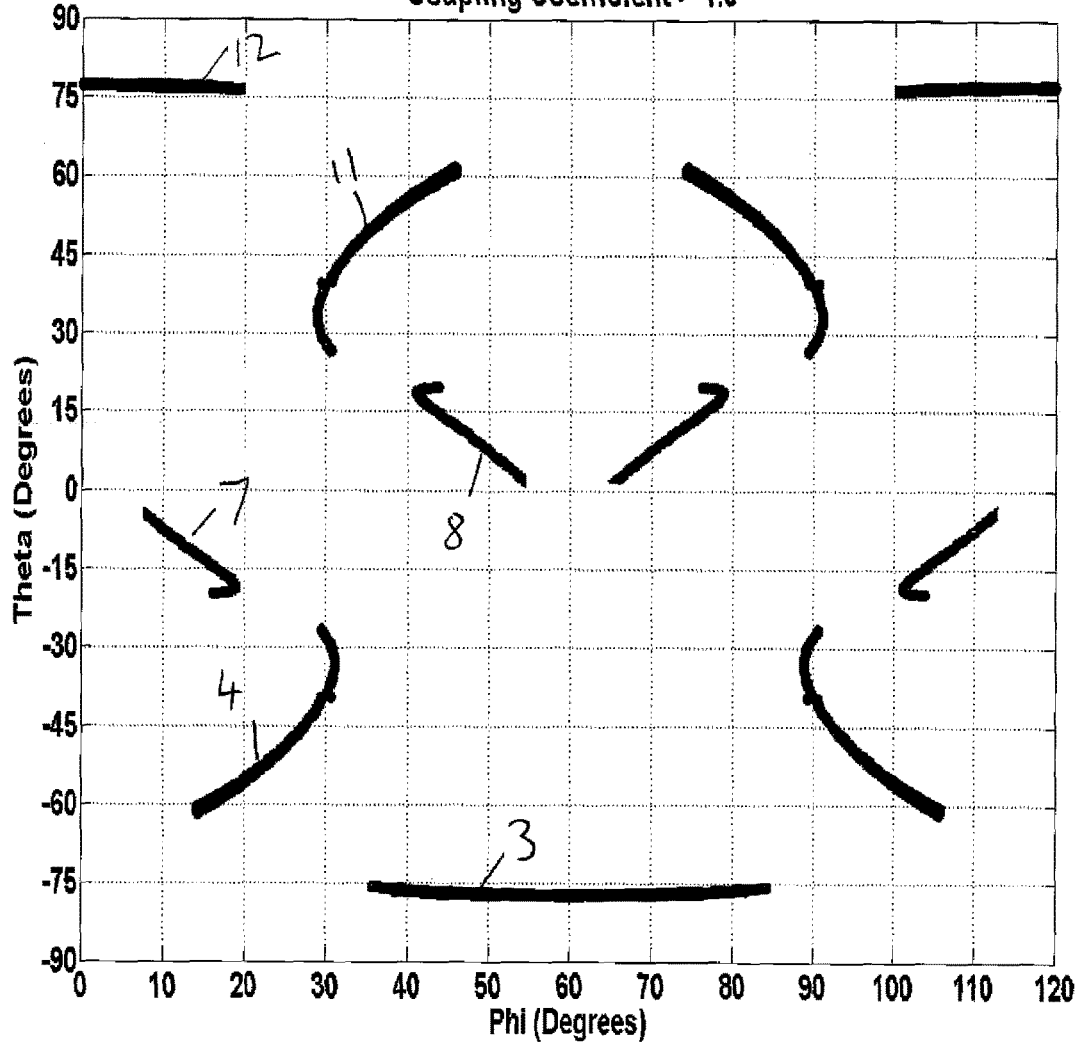
FIG. 13B shows a plot of temperature compensated loci for LGS in C-mode that distinguish past loci values and that include a coupling coefficient (kt) greater than 1, in accordance with one embodiment of the present disclosure.
Figure 14A:
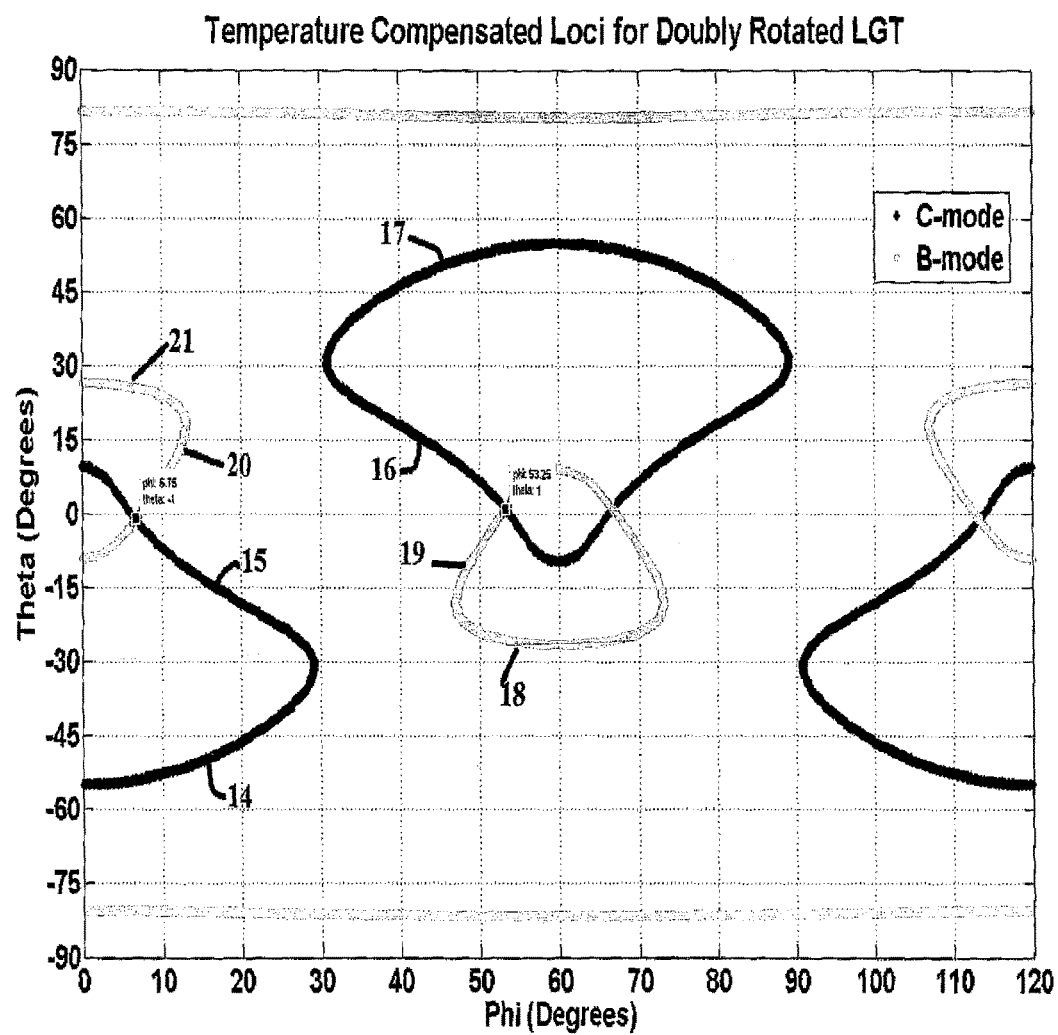
FIG. 14A shows a plot of temperature compensated loci for Langatate (LGT) in B-mode and C-mode in accordance with one embodiment of the present disclosure.
Figure 14B:
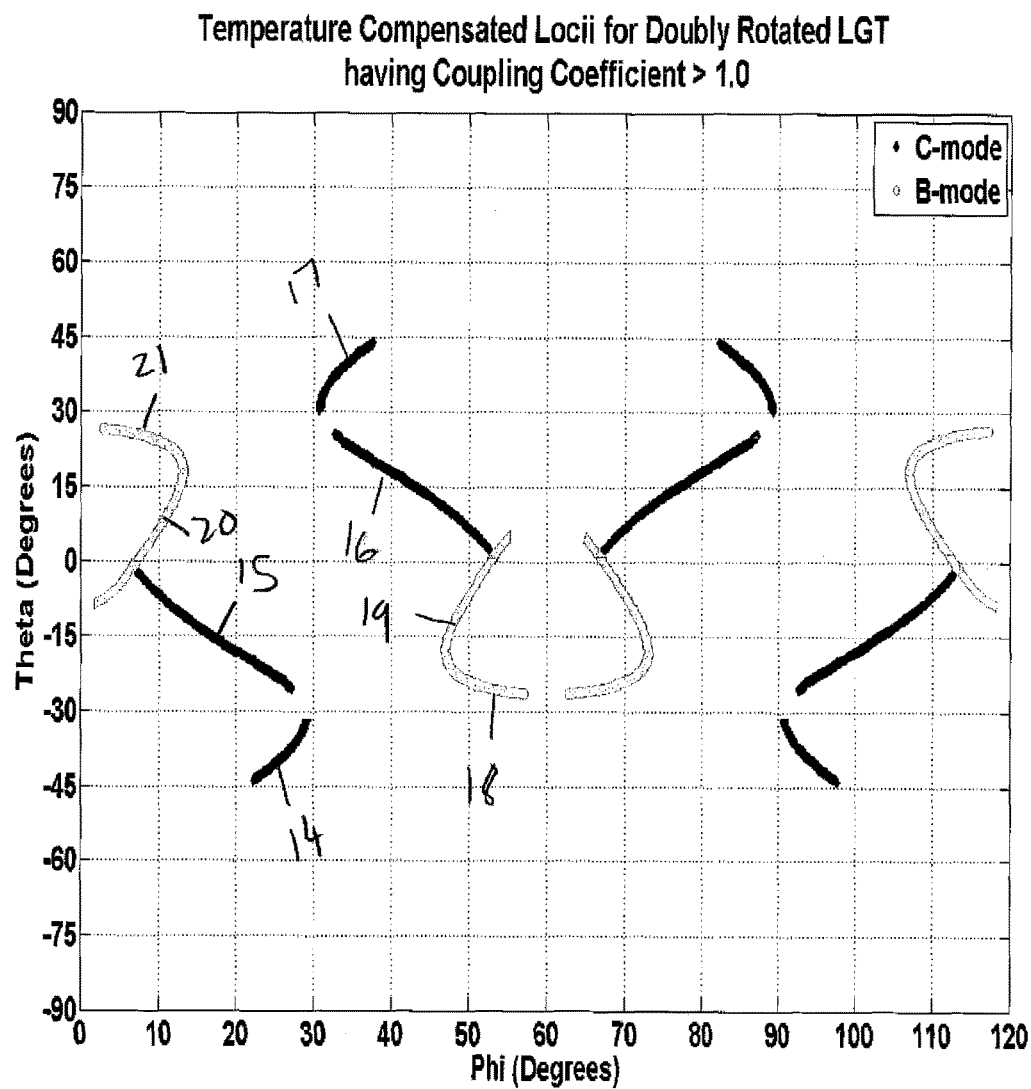
FIG. 14B shows a plot of temperature compensated loci for LGT in B-mode and C-mode that distinguish past loci values and that include a coupling coefficient (kt) greater than 1, in accordance with one embodiment of the present disclosure.
Figure 15A:
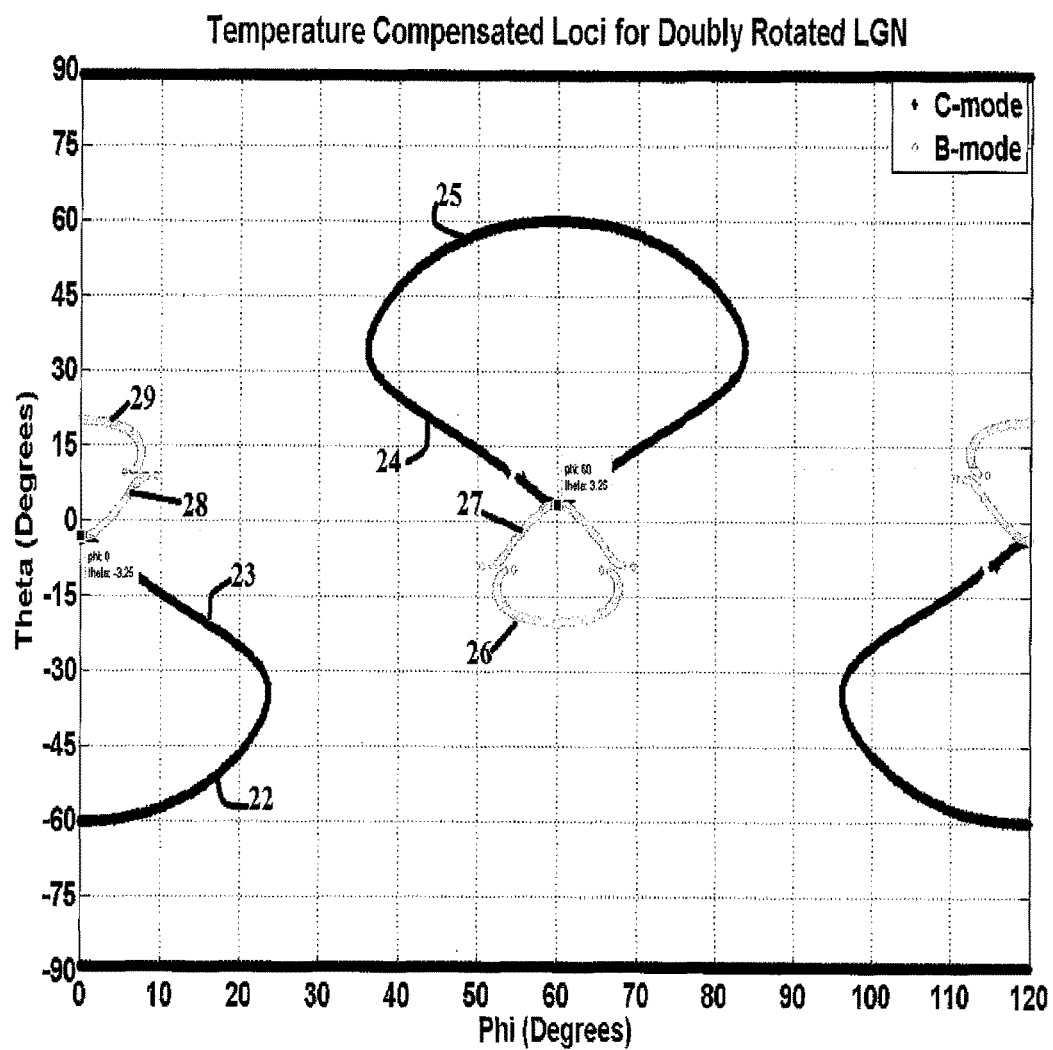
FIG. 15A shows a plot of temperature compensated loci for Langanite (LGN) in B-mode and C-mode in accordance with one embodiment of the present disclosure.
Figure 15B:
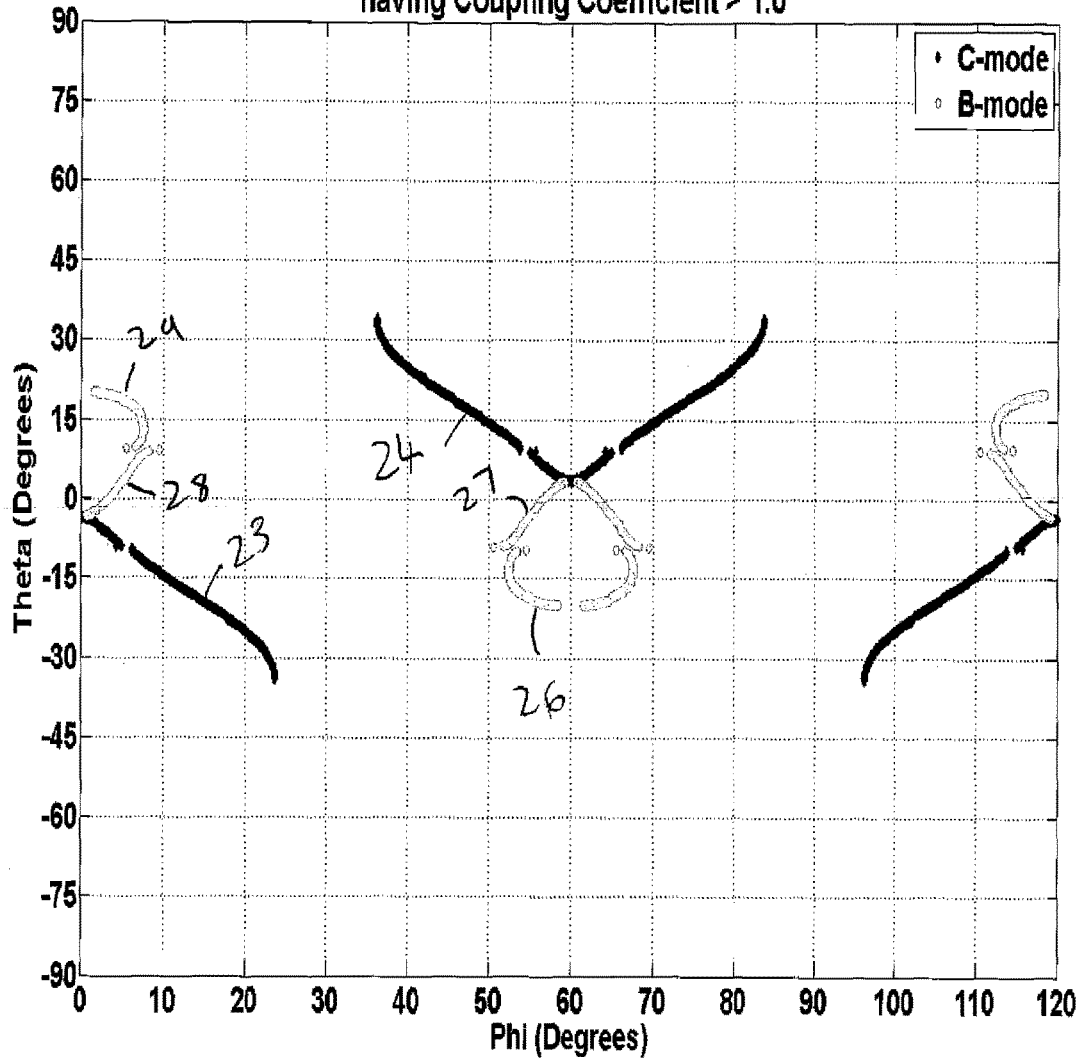
FIG. 15B shows a plot of temperature compensated loci for LGN in B-mode and C-mode that distinguish past loci values and that include a coupling coefficient (kt) greater than 1, in accordance with one embodiment of the present disclosure.

By analyzing the variation of the temperature coefficient "A" for each thickness-shear mode of vibration for 0°<Φ<120° and −90°<Θ<90°, the analysis has identified a sufficient number of discrete orientations having zero temperature coefficient "A" to permit the development of loci of temperature compensated orientations for the thickness-shear modes for LGS, LGT, and LGN. FIG. 13A-13B show the loci of temperature compensated orientations for LGS in C-mode. The calculations show that temperature compensated orientations for LGS in B-mode do not exist. FIGS. 14A-B and 15A-B, respectively, show the calculated temperature compensated loci for LGT and LGN for both the C-mode and the B-mode.

C-mode temperature compensated loci for LGS, LGT, and LGN are presented in Tables 5A, 5B, and 5C, respectively. The values in Tables 5A, 5B, and 5C correspond to FIGS. 13A, 14A, and 15A, respectively. Tables 5D, 5E, and 5F show a subset of loci from Tables 5A, 5B, and 5C that distinguish past loci values. Tables 5G, 5H, and 5I show a further subset of loci that distinguish past loci values and that include a coupling coefficient (kt) greater than 1. The values in Tables 5G, 5H, and 5I correspond to FIGS. 13B, 14B, and 15B, respectively.

B-mode temperature compensated loci for LGT and LGN are presented in Tables 6A and 6B. The values in Tables 6A and 6B correspond to FIGS. 14A, and 15A, respectively. Tables 6C and 6D show a subset of loci from Tables 6A and 6B that distinguish past loci values. Tables 6E and 6F show a further subset of loci that distinguish past loci values and that include a coupling coefficient (kt) greater than 1. The values in Tables 6E and 6F correspond to FIGS. 14B, and 15B, respectively.

The values in Tables 5A-I, 6A-F, 7, 8, and 9 below are provided for the primitive region. It is understood that corresponding orientations can be found outside of the primitive region in accordance with the various symmetries exhibited by LGX cuts, as explained above. The values in Tables 5A-I, 6A-F, 7, 8, and 9 below include and define all corresponding orientations.

TABLE 5A

C-mode Temperature Compensated Loci for LGS.

LGS: C-mode Temperature Compensated
Locus 3 expressed as (YXlw) Φ/Θ

| | | | | |
|---|---|---|---|---|
| 0.0/−68.50 | 1.0/−68.75 | 2.0/−69.00 | 3.0/−69.25 | 4.0/−69.50 |
| 5.0/−69.75 | 6.0/−70.00 | 6.0/−70.50 | 8.0/−71.00 | 9.0/−71.50 |
| 10.0/−72.00 | 11.0/−72.25 | 12.0/−72.50 | 13.0/−72.75 | 14.0/−73.50 |
| 15.0/−73.25 | 16.0/−73.50 | 17.0/−73.75 | 18.0/−74.00 | 19.0/−74.00 |
| 20.0/−74.25 | 21.0/−74.25 | 22.0/−74.50 | 23.0/−74.50 | 24.0/−74.75 |
| 25.0/−75.00 | 26.0/−75.25 | 27.0/−75.25 | 28.0/−75.50 | 29.0/−75.50 |
| 30.0/−75.75 | 31.0/−75.75 | 32.0/−76.00 | 33.0/−76.00 | 34.0/−76.25 |
| 35.0/−76.25 | 36.0/−76.25 | 37.0/−76.50 | 38.0/−76.50 | 39.0/−76.75 |
| 40.0/−76.75 | 41.0/−76.75 | 42.0/−76.75 | 43.0/−76.75 | 44.0/−77.00 |
| 45.0/−77.00 | 46.0/−77.00 | 47.0/−77.00 | 48.0/−77.25 | 49.0/−77.25 |

TABLE 5A-continued

C-mode Temperature Compensated Loci for LGS.

| | | | | |
|---|---|---|---|---|
| 50.0/−77.25 | 51.0/−77.25 | 52.0/−77.25 | 53.0/−77.25 | 54.0/−77.25 |
| 55.0/−77.25 | 56.0/−77.25 | 57.0/−77.25 | 58.0/−77.50 | 59.0/−77.50 |
| 60.0/−77.50 | | | | |

LGS: C-mode Temperature Compensated
Locus 4 expressed as (YXlw) Φ/Θ

| | | | | |
|---|---|---|---|---|
| 0.0/−67.50 | 1.0/−67.50 | 2.0/−67.50 | 3.0/−67.50 | 4.0/−67.25 |
| 5.0/−66.75 | 6.0/−66.00 | 8.0/−65.00 | 9.0/−64.25 | 10.0/−63.75 |
| 11.0/−63.25 | 12.0/−62.50 | 13.0/−61.75 | 14.0/−61.25 | 15.0/−60.50 |
| 16.0/−59.50 | 17.0/−58.50 | 18.0/−57.50 | 19.0/−56.75 | 20.0/−55.50 |
| 21.0/−54.50 | 22.0/−53.25 | 23.0/−52.00 | 24.0/−50.75 | 24.0/−49.25 |
| 25.0/−49.00 | 26.0/−47.50 | 27.0/−45.75 | 28.0/−44.00 | 29.0/−41.75 |
| 30.0/−39.00 | 31.0/−35.50 | 31.0/−34.50 | 31.0/−33.50 | 31.0/−32.50 |
| 31.0/−31.50 | 30.5/−29.50 | 30.0/−28.00 | 29.5/−27.00 | 29.0/−26.00 |
| 28.5/−25.25 | 28.0/−24.25 | 27.5/−23.25 | 27.5/−22.25 | 28.25/−21.75 |

LGS: C-mode Temperature Compensated
Locus 5 expressed as (YXlw) Φ/Θ

| | | | | |
|---|---|---|---|---|
| 29.0/−21.50 | 30.0/−21.50 | 31.0/−21.50 | 32.0/−21.50 | 33.0/−21.50 |
| 34.0/−21.50 | 35.0/−21.50 | 36.0/−21.50 | 37.0/−21.50 | 38.0/−21.50 |
| 39.0/−21.50 | 40.0/−21.50 | 41.0/−21.50 | 42.0/−21.50 | 43.0/−21.50 |
| 44.0/−21.50 | 45.0/−21.50 | 46.0/−21.50 | 47.0/−21.50 | 48.0/−21.50 |
| 49.0/−21.50 | 50.0/−21.50 | 51.0/−21.50 | 52.0/−21.50 | 53.0/−21.50 |
| 54.0/−21.50 | 55.0/−21.50 | 56.0/−21.50 | 57.0/−21.50 | 58.0/−21.50 |
| 59.0/−21.50 | 60.0/−21.50 | | | |

LGS: C-mode Temperature Compensated
Locus 6 expressed as (YXlw) Φ/Θ

| | | | | |
|---|---|---|---|---|
| 0.0/−20.00 | 1.0/−20.00 | 2.0/−20.00 | 3.0/−20.00 | 4.0/−20.00 |
| 5.0/−20.00 | 6.0/−20.00 | 7.0/−20.00 | 8.0/−20.00 | 9.0/−20.00 |
| 10.0/−20.00 | 11.0/−20.00 | 12.0/−20.00 | 13.0/−20.00 | 14.0/−20.00 |
| 15.0/−20.00 | 16.0/−20.00 | 17.0/−20.00 | 18.0/−20.00 | 19.0/−20.00 |

LGS: C-mode Temperature Compensated
Locus 7 expressed as (YXlw) Φ/Θ

| | | | | |
|---|---|---|---|---|
| 0.0/2.75 | 1.0/2.50 | 2.0/2.25 | 3.0/1.25 | 4.0/0.25 |
| 5.0/−1.25 | 6.0/−2.25 | 7.0/−3.50 | 8.0/−5.00 | 9.0/−6.50 |
| 10.0/−7.75 | 11.0/−8.75 | 12.0/−10.00 | 13.0/−11.25 | 14.0/−12.25 |
| 15.0/−13.25 | 16.0/−14.50 | 17.0/−15.50 | 18.0/−17.00 | 19.0/−18.50 |

LGS: C-mode Temperature Compensated
Locus 8 expressed as (YXlw) Φ/Θ

| | | | | |
|---|---|---|---|---|
| 41.25/18.50 | 42.00/17.00 | 43.00/15.75 | 44.00/14.50 | 45.00/13.50 |
| 46.00/12.25 | 47.00/11.00 | 48.00/10.00 | 49.00/9.00 | 50.00/7.750 |
| 51.00/6.50 | 52.00/5.00 | 53.00/3.50 | 54.00/2.25 | 55.00/1.25 |
| 56.00/0.25 | 57.00/−1.25 | 58.00/−2.25 | 59.00/−2.50 | 60.00/−2.75 |

LGS: C-mode Temperature Compensated
Locus 9 expressed as (YXlw) Φ/Θ

| | | | | |
|---|---|---|---|---|
| 41.00/18.75 | 42.00/19.25 | 43.00/19.75 | 44.00/19.75 | 45.00/20.00 |
| 46.00/20.00 | 47.00/20.00 | 48.00/20.00 | 49.00/20.00 | 50.00/20.00 |
| 51.00/20.00 | 52.00/20.00 | 53.00/20.00 | 54.00/20.00 | 55.00/20.00 |
| 56.00/20.00 | 57.00/20.00 | 58.00/20.00 | 59.00/20.00 | 60.00/20.00 |

LGS: C-mode Temperature Compensated
Locus 10 expressed as (YXlw) Φ/Θ

| | | | | |
|---|---|---|---|---|
| 0.0/22.25 | 1.0/22.25 | 2.0/22.25 | 3.0/22.25 | 4.0/22.25 |
| 5.0/22.25 | 6.0/22.25 | 7.0/22.25 | 8.0/22.00 | 9.0/22.00 |
| 10.0/22.00 | 11.0/22.00 | 12.0/22.00 | 13.0/21.75 | 14.0/21.75 |
| 15.0/21.75 | 16.0/21.75 | 17.0/21.75 | 18.0/21.50 | 19.0/21.50 |
| 20.0/21.50 | 21.0/21.50 | 22.0/21.50 | 23.0/21.50 | 24.0/21.50 |
| 25.0/21.50 | 26.0/21.50 | 27.0/21.50 | 28.0/21.50 | 29.0/21.50 |
| 30.0/21.50 | 31.0/21.75 | 32.0/22.00 | | |

LGS: C-mode Temperature Compensated
Locus 11 expressed as (YXlw) Φ/Θ

| | | | | |
|---|---|---|---|---|
| 32.5/23.00 | 32.0/24.25 | 31.0/25.75 | 30.0/27.75 | 29.0/30.25 |
| 29.0/31.25 | 29.0/32.25 | 29.0/33.25 | 29.0/34.25 | 29.0/35.25 |
| 29.0/36.25 | 29.0/34.25 | 29.5/37.0 | 30.0/38.75 | 30.5/40.25 |
| 31.0/41.75 | 31.5/42.75 | 32.0/43.75 | 32.5/44.75 | 33.0/45.75 |
| 33.5/46.75 | 34.0/47.75 | 34.5/48.50 | 35.0/49.00 | 35.5/49.75 |
| 36.0/50.50 | 36.0/51.50 | 37.0/52.50 | 38.0/53.50 | 39.0/54.50 |
| 40.0/55.50 | 41.0/56.50 | 42.0/57.50 | 43.0/58.50 | 44.0/59.50 |
| 45.0/60.50 | 46.0/61.50 | 47.0/62.25 | 48.0/62.00 | 48.5/63.50 |
| 49.00/64.00 | 49.50/64.50 | 49.50/63.00 | 49.50/66.25 | 50.0/68.00 |
| 50.0/67.00 | 50.0/66.00 | 50.0/65.00 | 50.0/64.00 | 50.0/63.00 |
| 51.0/69.00 | 51.0/68.00 | 51.0/67.00 | 51.0/66.00 | 51.0/65.00 |
| 51.0/64.00 | 51.0/63.00 | 52.0/69.00 | 52.0/68.00 | 52.0/67.00 |
| 52.0/66.00 | 52.0/65.00 | 52.0/64.00 | 53.0/69.50 | 53.0/68.50 |
| 53.0/67.50 | 53.0/66.50 | 53.0/65.50 | 53.0/65.00 | 54.0/69.50 |
| 54.0/68.50 | 54.0/67.50 | 54.0/66.50 | 54.0/65.50 | 55.0/69.50 |
| 55.0/68.50 | 55.0/67.50 | 55.0/66.50 | 55.0/66.00 | 56.0/69.00 |
| 56.0/68.00 | 56.0/67.00 | 56.0/66.00 | 57.0/69.00 | 57.0/68.00 |
| 57.0/67.00 | 57.0/66.50 | 58.0/69.00 | 58.0/68.00 | 58.0/67.00 |
| 59.0/69.00 | 59.0/68.00 | 59.0/67.00 | 60.0/69.00 | 60.0/68.00 |
| 60.0/67.00 | | | | |

LGS: C-mode Temperature Compensated
Locus 12 expressed as (YXlw) Φ/Θ

| | | | | |
|---|---|---|---|---|
| 0.0/77.25 | 1.0/77.25 | 2.0/77.25 | 3.0/77.25 | 4.0/77.25 |
| 5.0/77.25 | 6.0/77.25 | 7.0/77.00 | 8.0/77.00 | 9.0/77.00 |
| 10.0/77.00 | 11.0/77.00 | 12.0/77.00 | 13.0/76.75 | 14.0/76.75 |
| 15.0/76.75 | 16.0/76.75 | 17.0/76.50 | 18.0/76.50 | 19.0/76.50 |
| 20.0/76.25 | 21.0/76.25 | 22.0/76.25 | 23.0/76.00 | 24.0/76.00 |
| 25.0/75.75 | 26.0/75.75 | 27.0/75.75 | 28.0/75.50 | 29.0/75.50 |
| 30.0/75.25 | 31.0/75.00 | 32.0/74.75 | 33.0/74.50 | 34.0/74.25 |
| 35.0/74.25 | 36.0/74.25 | 37.0/74.25 | 38.0/74.00 | 39.0/74.00 |
| 40.0/73.75 | 41.0/73.50 | 42.0/73.25 | 43.0/73.00 | 44.0/72.75 |
| 45.0/72.50 | 46.0/72.25 | 47.0/72.00 | 48.0/71.75 | 49.0/71.50 |
| 50.0/68.50 | 50.0/69.50 | 50.0/70.50 | 50.0/71.50 | 51.0/69.50 |
| 51.0/70.50 | 51.0/71.50 | 52.0/69.50 | 52.0/70.50 | 52.0/71.50 |
| 53.0/71.00 | 54.0/70.50 | 55.0/70.50 | 56.0/70.00 | 57.0/70.00 |
| 58.0/69.50 | 59.0/69.50 | 60.0/69.50 | | |

TABLE 5B

C-mode Temperature Compensated Loci for LGT.

LGT: C-mode Temperature Compensated
Locus 14 expressed as (YXlw) Φ/Θ

| | | | | |
|---|---|---|---|---|
| 0.0/−54.75 | 1.0/−54.75 | 2.0/−54.75 | 3.0/−54.75 | 4.0/−54.50 |
| 5.0/−54.25 | 6.0/−54.00 | 7.0/−53.75 | 8.0/−53.50 | 9.0/−53.25 |
| 10.0/−52.75 | 11.0/−52.25 | 12.0/−51.75 | 13.0/−51.25 | 14.0/−50.50 |
| 15.0/−50.00 | 16.0/−49.25 | 17.0/−48.75 | 18.0/−48.00 | 19.0/−47.00 |
| 20.0/−46.00 | 21.0/−45.00 | 22.0/−44.00 | 23.0/−43.00 | 24.0/−42.00 |
| 24.5/−41.50 | 25.0/−40.75 | 26.0/−39.50 | 27.0/−37.75 | 28.0/−36.00 |
| 29.0/−33.25 | 29.0/−32.25 | 29.0/−31.25 | 29.0/−30.25 | |

LGT: C-mode Temperature Compensated
Locus 15 expressed as (YXlw) Φ/Θ

| | | | | |
|---|---|---|---|---|
| 0.0/9.75 | 1.0/9.25 | 2.0/8.50 | 3.0/7.00 | 4.0/5.00 |
| 5.0/2.75 | 6.0/0.25 | 6.75/−1.00 | 7.0/−1.75 | 8.0/−3.75 |
| 9.0/−5.25 | 10.0/−6.75 | 11.0/−8.25 | 12.0/−9.50 | 13.0/−10.75 |
| 14.0/−12.0 | 15.0/−13.0 | 16.0/−14.0 | 17.0/−15.0 | 18.0/−16.0 |
| 19.0/−17.0 | 20.0/−18.0 | 21.0/−19.0 | 22.0/−20.0 | 23.0/−21.0 |
| 24.0/−22.0 | 25.0/−23.0 | 26.0/−24.0 | 27.0/−25.0 | 28.0/−27.0 |
| 28.0/−29.0 | | | | |

LGT: C-mode Temperature Compensated
Locus 16 expressed as (YXlw) Φ/Θ

| | | | | |
|---|---|---|---|---|
| 31.0/31.0 | 31.0/30.0 | 31.0/29.00 | 31.0/29.00 | 31.5/27.75 |
| 32.0/26.75 | 32.5/25.75 | 33.0/25.00 | 33.5/24.50 | 34.0/23.75 |
| 34.5/23.25 | 35.0/22.75 | 36.0/21.75 | 37.0/20.75 | 38.0/20.00 |
| 39.0/19.00 | 40.0/18.00 | 41.0/17.00 | 42.0/16.00 | 43.0/15.00 |
| 44.0/14.00 | 45.0/13.00 | 46.0/12.00 | 47.0/11.00 | 48.0/9.50 |
| 49.0/8.25 | 50.0/6.75 | 51.0/5.25 | 52.0/3.50 | 53.0/1.50 |
| 53.25/1.00 | 53.50/0.50 | 54.00/−0.50 | 54.50/−1.50 | 55.00/−3.00 |
| 56.00/−5.00 | 57.00/−7.25 | 58.0/−8.50 | 59.0/−9.50 | 60.0/−9.75 |

LGT: C-mode Temperature Compensated
Locus 17 expressed as (YXlw) Φ/Θ

| | | | | |
|---|---|---|---|---|
| 31.0/32.5 | 31.5/34.00 | 32.0/35.50 | 32.5/36.75 | 33.00/37.50 |
| 33.5/38.50 | 34.0/39.25 | 35.0/40.50 | 36.0/41.75 | 37.0/43.00 |
| 38.0/44.00 | 39.0/45.00 | 40.0/46.00 | 41.0/47.00 | 42.0/48.00 |
| 43.0/48.75 | 44.0/49.50 | 45.0/50.00 | 46.0/50.75 | 47.0/51.25 |
| 48.0/51.75 | 49.0/52.25 | 50.0/52.75 | 51.0/53.25 | 52.0/53.50 |
| 53.0/53.75 | 54.0/54.00 | 55.0/54.25 | 56.0/54.50 | 57.0/54.75 |
| 58.0/54.75 | 59.0/54.75 | 60.0/54.75 | | |

TABLE 5C

C-mode Temperature Compensated Loci for LGN.

LGN: C-mode Temperature Compensated Locus 22 expressed as (YXlw) Φ/Θ

| | | | | |
|---|---|---|---|---|
| 0.0/−60.00 | 1.0/−60.00 | 2.0/−60.00 | 3.0/−60.00 | 4.0/−59.75 |
| 5.0/−59.50 | 6.0/−59.25 | 7.0/−58.75 | 8.0/−58.50 | 9.0/−58.00 |
| 10.0/−57.50 | 11.0/−56.50 | 12.0/−56.00 | 13.0/−55.00 | 14.0/−54.25 |
| 15.0/−53.25 | 16.0/−52.25 | 17.0/−51.00 | 18.0/−49.50 | 19.0/−48.00 |
| 20.0/−46.50 | 21.0/−44.50 | 22.0/−42.25 | 23.0/−39.50 | 23.5/−37.25 |
| 23.75/−35.75 | 23.75/−34.75 | 23.75/−33.75 | | |

LGN: C-mode Temperature Compensated Locus 23 expressed as (YXlw) Φ/Θ

| | | | | |
|---|---|---|---|---|
| 0.0/−3.75 | 1.0/−4.00 | 2.0/−5.00 | 3.0/−6.25 | 4.0/−7.50 |
| 5.0/−8.75 | 6.0/−10.0 | 70/−11.0 | 8.0/−12.25 | 9.0/−13.25 |
| 10.0/−14.50 | 11.0/−15.50 | 12.0/−16.50 | 13.0/−17.50 | 14.0/−18.50 |
| 15.0/−19.50 | 16.0/−20.50 | 17.0/−21.50 | 18.0/−22.50 | 19.0/−23.75 |
| 20.0/−24.75 | 21.0/−26.25 | 22.0/−28.00 | 23.0/−30.00 | 23.5/−32.00 |
| 23.75/−33.00 | | | | |

LGN: C-mode Temperature Compensated Locus 24 expressed as (YXlw) Φ/Θ

| | | | | |
|---|---|---|---|---|
| 36.25/34.00 | 36.25/33.00 | 36.25/32.50 | 36.50/31.75 | 37.00/30.00 |
| 38.00/28.00 | 39.00/26.00 | 40.00/25.00 | 41.00/23.75 | 42.00/22.75 |
| 43.00/21.50 | 44.00/20.50 | 45.00/19.50 | 46.00/18.50 | 47.00/17.50 |
| 48.00/16.50 | 49.00/15.50 | 50.00/14.50 | 51.00/13.25 | 52.00/12.25 |
| 53.00/11.00 | 54.00/10.00 | 55.00/8.75 | 56.00/7.50 | 57.00/6.25 |
| 58.00/5.00 | 59.00/4.00 | 60.00/3.25 | | |

LGN: C-mode Temperature Compensated Locus 25 expressed as (YXlw) Φ/Θ

| | | | | |
|---|---|---|---|---|
| 36.25/35.00 | 36.25/36.00 | 36.50/37.00 | 36.75/38.50 | 37.00/39.50 |
| 37.50/41.00 | 38.00/42.50 | 39.00/44.50 | 40.00/46.50 | 41.00/48.00 |
| 42.00/49.50 | 43.00/51.00 | 44.00/52.25 | 45.00/53.50 | 46.00/54.50 |
| 47.00/55.00 | 48.00/56.00 | 49.00/56.75 | 50.00/57.50 | 51.00/58.00 |
| 52.00/58.50 | 53.00/58.75 | 54.00/59.25 | 55.00/59.50 | 56.00/59.75 |
| 57.00/59.75 | 58.00/60.00 | 59.00/60.25 | 60.00/60.25 | |

TABLE 5D

Subset of C-mode Temperature Compensated Loci for LGS.

LGS: C-mode Temperature Compensated Locus 3 expressed as (YXlw) Φ/Θ

| | | | | |
|---|---|---|---|---|
| 35.0/−76.25 | 36.0/−76.25 | 37.0/−76.50 | 38.0/−76.50 | 39.0/−76.75 |
| 40.0/−76.75 | 41.0/−76.75 | 42.0/−76.75 | 43.0/−76.75 | 44.0/−77.00 |
| 45.0/−77.00 | 46.0/−77.00 | 47.0/−77.00 | 48.0/−77.25 | 49.0/−77.25 |
| 50.0/−77.25 | 51.0/−77.25 | 52.0/−77.25 | 53.0/−77.25 | 54.0/−77.25 |
| 55.0/−77.25 | 56.0/−77.25 | 57.0/−77.25 | 58.0/−77.50 | 59.0/−77.50 |
| 60.0/−77.50 | 34.0/−76.25 | | | |

LGS: C-mode Temperature Compensated Locus 4 expressed as (YXlw) Φ/Θ

| | | | | |
|---|---|---|---|---|
| 0.0/−67.50 | 1.0/−67.50 | 2.0/−67.50 | 3.0/−67.50 | 4.0/−67.25 |
| 5.0/−66.75 | 6.0/−66.00 | 8.0/−65.00 | 9.0/−64.25 | 10.0/−63.75 |
| 11.0/−63.25 | 12.0/−62.50 | 13.0/−61.75 | 14.0/−61.25 | 15.0/−60.50 |
| 16.0/−59.50 | 17.0/−58.50 | 18.0/−57.50 | 19.0/−56.75 | 20.0/−55.50 |
| 21.0/−54.50 | 22.0/−53.25 | 23.0/−52.00 | 24.0/−50.75 | 24.0/−49.25 |
| 25.0/−49.00 | 26.0/−47.50 | 27.0/−45.75 | 28.0/−44.00 | 29.0/−41.75 |
| 30.0/−39.00 | 31.0/−35.50 | 31.0/−34.50 | 31.0/−33.50 | 31.0/−32.50 |
| 31.0/−31.50 | 30.5/−29.50 | 30.0/−28.00 | 29.5/−27.00 | 29.0/−26.00 |
| 28.5/−25.25 | 28.0/−24.25 | 27.5/−23.25 | 27.5/−22.25 | 28.25/−21.75 |

LGS: C-mode Temperature Compensated Locus 5 expressed as (YXlw) Φ/Θ

| | | | | |
|---|---|---|---|---|
| 29.0/−21.50 | 30.0/−21.50 | 31.0/−21.50 | 32.0/−21.50 | 33.0/−21.50 |
| 34.0/−21.50 | 35.0/−21.50 | 36.0/−21.50 | 37.0/−21.50 | 38.0/−21.50 |
| 39.0/−21.50 | 40.0/−21.50 | 41.0/−21.50 | 42.0/−21.50 | 43.0/−21.50 |
| 44.0/−21.50 | 45.0/−21.50 | 46.0/−21.50 | 47.0/−21.50 | 48.0/−21.50 |
| 49.0/−21.50 | 50.0/−21.50 | 51.0/−21.50 | 52.0/−21.50 | 53.0/−21.50 |
| 54.0/−21.50 | 55.0/−21.50 | 56.0/−21.50 | 57.0/−21.50 | 58.0/−21.50 |
| 59.0/−21.50 | 60.0/−21.50 | | | |

LGS: C-mode Temperature Compensated Locus 6 expressed as (YXlw) Φ/Θ

| | | | | |
|---|---|---|---|---|
| 0.0/−20.00 | 1.0/−20.00 | 2.0/−20.00 | 3.0/−20.00 | 4.0/−20.00 |
| 5.0/−20.00 | 6.0/−20.00 | 7.0/−20.00 | 8.0/−20.00 | 9.0/−20.00 |
| 10.0/−20.00 | 11.0/−20.00 | 12.0/−20.00 | 13.0/−20.00 | 14.0/−20.00 |
| 15.0/−20.00 | 16.0/−20.00 | 17.0/−20.00 | 18.0/−20.00 | 19.0/−20.00 |

LGS: C-mode Temperature Compensated Locus 7 expressed as (YXlw) Φ/Θ

| | | | | |
|---|---|---|---|---|
| 8.0/−5.00 | 9.0/−6.50 | 10.0/−7.75 | 11.0/−8.75 | 12.0/−10.00 |
| 13.0/−11.25 | 14.0/−12.25 | 15.0/−13.25 | 16.0/−14.50 | 17.0/−15.50 |
| 18.0/−17.00 | 19.0/−18.50 | | | |

LGS: C-mode Temperature Compensated Locus 8 expressed as (YXlw) Φ/Θ

| | | | | |
|---|---|---|---|---|
| 41.25/18.50 | 42.00/17.00 | 43.00/15.75 | 44.00/14.50 | 45.00/13.50 |
| 46.00/12.25 | 47.00/11.00 | 48.00/10.00 | 49.00/9.00 | 50.00/7.750 |
| 51.00/6.50 | 52.00/5.00 | 53.00/3.50 | 54.00/2.25 | 55.00/1.25 |

LGS: C-mode Temperature Compensated Locus 9 expressed as (YXlw) Φ/Θ

| | | | | |
|---|---|---|---|---|
| 41.00/18.75 | 42.00/19.25 | 43.00/19.75 | 44.00/19.75 | 45.00/20.00 |
| 46.00/20.00 | 47.00/20.00 | 48.00/20.00 | 49.00/20.00 | 50.00/20.00 |
| 51.00/20.00 | 52.00/20.00 | 53.00/20.00 | 54.00/20.00 | 55.00/20.00 |
| 56.00/20.00 | 57.00/20.00 | 58.00/20.00 | 59.00/20.00 | 60.00/20.00 |

LGS: C-mode Temperature Compensated Locus 10 expressed as (YXlw) Φ/Θ

| | | | | |
|---|---|---|---|---|
| 0.0/22.25 | 1.0/22.25 | 2.0/22.25 | 3.0/22.25 | 4.0/22.25 |
| 5.0/22.25 | 6.0/22.25 | 7.0/22.25 | 8.0/22.00 | 9.0/22.00 |
| 10.0/22.00 | 11.0/22.00 | 12.0/22.00 | 13.0/21.75 | 14.0/21.75 |
| 15.0/21.75 | 16.0/21.75 | 17.0/21.75 | 18.0/21.50 | 19.0/21.50 |
| 20.0/21.50 | | | | |

TABLE 5D-continued

Subset of C-mode Temperature Compensated Loci for LGS.

LGS: C-mode Temperature Compensated
Locus 11 expressed as (YXlw) Φ/Θ

| | | | | |
|---|---|---|---|---|
| 32.5/23.00 | 32.0/24.25 | 31.0/25.75 | 30.0/27.75 | 29.0/30.25 |
| 29.0/31.25 | 29.0/32.25 | 29.0/33.25 | 29.0/34.25 | 29.0/35.25 |
| 29.0/36.25 | 29.0/34.25 | 29.5/37.0 | 30.0/38.75 | 30.5/40.25 |
| 31.0/41.75 | 31.5/42.75 | 32.0/43.75 | 32.5/44.75 | 33.0/45.75 |
| 33.5/46.75 | 34.0/47.75 | 34.5/48.50 | 35.0/49.00 | 35.5/49.75 |
| 36.0/50.50 | 36.0/51.50 | 37.0/52.50 | 38.0/53.50 | 39.0/54.50 |
| 40.0/55.50 | 41.0/56.50 | 42.0/57.50 | 43.0/58.50 | 44.0/59.75 |
| 45.0/60.50 | 46.0/61.50 | 47.0/62.25 | 48.0/62.00 | 48.5/63.50 |
| 49.00/64.00 | 49.50/64.50 | 49.50/63.00 | 49.50/66.25 | 50.0/68.00 |
| 50.0/67.00 | 50.0/66.00 | 50.0/65.00 | 50.0/64.00 | 50.0/63.00 |
| 51.0/69.00 | 51.0/68.00 | 51.0/67.00 | 51.0/66.00 | 51.0/65.00 |
| 51.0/64.00 | 51.0/63.00 | 52.0/69.00 | 52.0/68.00 | 52.0/67.00 |
| 52.0/66.00 | 52.0/65.00 | 52.0/64.00 | 53.0/69.50 | 53.0/68.50 |
| 53.0/67.50 | 53.0/66.50 | 53.0/65.50 | 53.0/65.00 | 54.0/69.50 |
| 54.0/68.50 | 54.0/67.50 | 54.0/66.50 | 54.0/65.50 | 55.0/69.50 |
| 55.0/68.50 | 55.0/67.50 | 55.0/66.50 | 55.0/66.00 | 56.0/69.00 |
| 56.0/68.00 | 56.0/67.00 | 56.0/66.00 | 57.0/69.00 | 57.0/68.00 |
| 57.0/67.00 | 57.0/66.50 | 58.0/69.00 | 58.0/68.00 | 58.0/67.00 |
| 59.0/69.00 | 59.0/68.00 | 59.0/67.00 | 60.0/69.00 | 60.0/68.00 |
| 60.0/67.00 | | | | |

LGS: C-mode Temperature Compensated
Locus 12 expressed as (YXlw) Φ/Θ

| | | | | |
|---|---|---|---|---|
| 0.0/77.25 | 1.0/77.25 | 2.0/77.25 | 3.0/77.25 | 4.0/77.25 |
| 5.0/77.25 | 6.0/77.25 | 7.0/77.00 | 8.0/77.00 | 9.0/77.00 |
| 10.0/77.00 | 11.0/77.00 | 12.0/77.00 | 13.0/76.75 | 14.0/76.75 |
| 15.0/76.75 | 16.0/76.75 | 17.0/76.50 | 18.0/76.50 | 19.0/76.50 |
| 20.0/76.25 | | | | |

TABLE 5E

Subset of C-mode Temperature Compensated Loci for LGT.

LGT: C-mode Temperature Compensated
Locus 14 expressed as (YXlw) Φ/Θ

| | | | | |
|---|---|---|---|---|
| 0.0/−54.75 | 1.0/−54.75 | 2.0/−54.75 | 3.0/−54.75 | 4.0/−54.50 |
| 5.0/−54.25 | 6.0/−54.00 | 7.0/−53.75 | 8.0/−53.50 | 9.0/−53.25 |
| 10.0/−52.75 | 11.0/−52.25 | 12.0/−51.75 | 13.0/−51.25 | 14.0/−50.50 |
| 15.0/−50.00 | 16.0/−49.25 | 17.0/−48.75 | 18.0/−48.00 | 19.0/−47.00 |
| 20.0/−46.00 | 21.0/−45.00 | 22.0/−44.00 | 23.0/−43.00 | 24.0/−42.00 |
| 24.5/−41.50 | 25.0/−40.75 | 26.0/−39.50 | 27.0/−37.75 | 28.0/−36.00 |
| 29.0/−33.25 | 29.0/−32.25 | 29.0/−31.25 | 29.0/−30.25 | |

LGT: C-mode Temperature Compensated
Locus 15 expressed as (YXlw) Φ/Θ

| | | | | |
|---|---|---|---|---|
| 6.75/−1.00 | 7.0/−1.75 | 8.0/−3.75 | 9.0/−5.25 | 10.0/−6.75 |
| 11.0/−8.25 | 12.0/−9.50 | 13.0/−10.75 | 14.0/−12.0 | 15.0/−13.0 |
| 16.0/−14.0 | 17.0/−15.0 | 18.0/−16.0 | 19.0/−17.0 | 20.0/−18.0 |
| 21.0/−19.0 | 22.0/−20.0 | 23.0/−21.0 | 24.0/−22.0 | 25.0/−23.0 |
| 26.0/−24.0 | 27.0/−25.0 | 28.0/−27.0 | 28.0/−29.0 | |

LGT: C-mode Temperature Compensated
Locus 16 expressed as (YXlw) Φ/Θ

| | | | | |
|---|---|---|---|---|
| 31.0/31.0 | 31.0/30.0 | 31.0/29.00 | 31.0/29.00 | 31.5/27.75 |
| 32.0/26.75 | 32.5/25.75 | 33.0/25.00 | 33.5/24.50 | 34.0/23.75 |
| 34.5/23.25 | 35.0/22.75 | 36.0/21.75 | 37.0/20.75 | 38.0/20.00 |
| 39.0/19.00 | 40.0/18.00 | 41.0/17.00 | 42.0/16.00 | 43.0/15.00 |
| 44.0/14.00 | 45.0/13.00 | 46.0/12.00 | 47.0/11.00 | 48.0/9.50 |
| 49.0/8.25 | 50.0/6.75 | 51.0/5.25 | 52.0/3.50 | 53.0/1.50 |
| 53.25/1.00 | | | | |

LGT: C-mode Temperature Compensated
Locus 17 expressed as (YXlw) Φ/Θ

| | | | | |
|---|---|---|---|---|
| 31.0/32.5 | 31.5/34.00 | 32.0/35.50 | 32.5/36.75 | 33.00/37.50 |
| 33.5/38.50 | 34.0/39.25 | 35.0/40.50 | 36.0/41.75 | 37.0/43.00 |
| 38.0/44.00 | 39.0/45.00 | 40.0/46.00 | 41.0/47.00 | 42.0/48.00 |
| 43.0/48.75 | 44.0/49.50 | 45.0/50.50 | 46.0/50.75 | 47.0/51.25 |
| 48.0/51.75 | 49.0/52.25 | 50.0/52.75 | 51.0/53.25 | 52.0/53.50 |
| 53.0/53.75 | 54.0/54.00 | 55.0/54.25 | 56.0/54.50 | 57.0/54.75 |
| 58.0/54.75 | 59.0/54.75 | 60.0/54.75 | | |

TABLE 5F

Subset of C-mode Temperature Compensated Loci for LGN.

LGN: C-mode Temperature Compensated
Locus 22 expressed as (YXlw) Φ/Θ

| | | | | |
|---|---|---|---|---|
| 0.0/−60.00 | 1.0/−60.00 | 2.0/−60.00 | 3.0/−60.00 | 4.0/−59.75 |
| 5.0/−59.50 | 6.0/−59.25 | 7.0/−58.75 | 8.0/−58.50 | 9.0/−58.00 |
| 10.0/−57.50 | 11.0/−56.50 | 12.0/−56.00 | 13.0/−55.00 | 14.0/−54.25 |
| 15.0/−53.25 | 16.0/−52.25 | 17.0/−51.00 | 18.0/−49.50 | 19.0/−48.00 |
| 20.0/−46.50 | 21.0/−44.50 | 22.0/−42.25 | 23.0/−39.50 | 23.5/−37.25 |
| 23.75/−35.75 | 23.75/−34.75 | 23.75/−33.75 | | |

LGN: C-mode Temperature Compensated
Locus 23 expressed as (YXlw) Φ/Θ

| | | | | |
|---|---|---|---|---|
| 23.75/−33.00 | 1.0/−4.00 | 2.0/−5.00 | 3.0/−6.25 | 4.0/−7.50 |
| 5.0/−8.75 | 6.0/−10.0 | 70/−11.0 | 8.0/−12.25 | 9.0/−13.25 |
| 10.0/−14.50 | 11.0/−15.50 | 12.0/−16.50 | 13.0/−17.50 | 14.0/−18.50 |
| 15.0/−19.50 | 16.0/−20.50 | 17.0/−21.50 | 18.0/−22.50 | 19.0/−23.75 |
| 20.0/−24.75 | 21.0/−26.25 | 22.0/−28.00 | 23.0/−30.00 | 23.5/−32.00 |

LGN: C-mode Temperature Compensated
Locus 24 expressed as (YXlw) Φ/Θ

| | | | | |
|---|---|---|---|---|
| 36.25/34.00 | 36.25/33.00 | 36.25/32.50 | 36.50/31.75 | 37.00/30.00 |
| 38.00/28.00 | 39.00/26.00 | 40.00/25.00 | 41.00/23.75 | 42.00/22.75 |
| 43.00/21.50 | 44.00/20.50 | 45.00/19.50 | 46.00/18.50 | 47.00/17.50 |
| 48.00/16.50 | 49.00/15.50 | 50.00/14.50 | 51.00/13.25 | 52.00/12.25 |
| 53.00/11.00 | 54.00/10.00 | 55.00/8.75 | 56.00/7.50 | 57.00/6.25 |
| 58.00/5.00 | 59.00/4.00 | 60.00/3.25 | | |

LGN: C-mode Temperature Compensated
Locus 25 expressed as (YXlw) Φ/Θ

| | | | | |
|---|---|---|---|---|
| 36.25/35.00 | 36.25/36.00 | 36.50/37.00 | 36.75/38.50 | 37.00/39.50 |
| 37.50/41.00 | 38.00/42.50 | 39.00/44.50 | 40.00/46.50 | 41.00/48.00 |
| 42.00/49.50 | 43.00/51.00 | 44.00/52.25 | 45.00/53.50 | 46.00/54.50 |

TABLE 5F-continued

Subset of C-mode Temperature Compensated Loci for LGN.

| | | | | |
|---|---|---|---|---|
| 47.00/55.00 | 48.00/56.00 | 49.00/56.75 | 50.00/57.50 | 51.00/58.00 |
| 52.00/58.50 | 53.00/58.75 | 54.00/59.25 | 55.00/59.50 | 56.00/59.75 |
| 57.00/59.75 | 58.00/60.00 | 59.00/60.25 | 60.00/60.25 | |

TABLE 5G

Further Subset of C-mode Temperature Compensated Loci for LGS with Coupling Coefficients Greater Than 1.0 (kt > 1.0).

LGS: C-mode Temperature Compensated Locus 3 expressed as (YXlw) Φ/Θ

| | | | | |
|---|---|---|---|---|
| 35.0/−76.25 | 36.0/−76.25 | 37.0/−76.50 | 38.0/−76.50 | 39.0/−76.75 |
| 40.0/−76.75 | 41.0/−76.75 | 42.0/−76.75 | 43.0/−76.75 | 44.0/−77.00 |
| 45.0/−77.00 | 46.0/−77.00 | 47.0/−77.00 | 48.0/−77.25 | 49.0/−77.25 |
| 50.0/−77.25 | 51.0/−77.25 | 52.0/−77.25 | 53.0/−77.25 | 54.0/−77.25 |
| 55.0/−77.25 | 56.0/−77.25 | 57.0/−77.25 | 58.0/−77.50 | 59.0/−77.50 |
| 60.0/−77.50 | 34.0/−76.25 | | | |

LGS: C-mode Temperature Compensated Locus 4 expressed as (YXlw) Φ/Θ

| | | | | |
|---|---|---|---|---|
| | | | 14.0/−61.25 | 15.0/−60.50 |
| 16.0/−59.50 | 17.0/−58.50 | 18.0/−57.50 | 19.0/−56.75 | 20.0/−55.50 |
| 21.0/−54.50 | 22.0/−53.25 | 23.0/−52.00 | 24.0/−50.75 | 24.0/−49.25 |
| 25.0/−49.00 | 26.0/−47.50 | 27.0/−45.75 | 28.0/−44.00 | 29.0/−41.75 |
| 30.0/−39.00 | | | | |

LGS: C-mode Temperature Compensated Locus 7 expressed as (YXlw) Φ/Θ

| | | | | |
|---|---|---|---|---|
| 8.0/−5.00 | 9.0/−6.50 | 10.0/−7.75 | 11.0/−8.75 | 12.0/−10.00 |
| 13.0/−11.25 | 14.0/−12.25 | 15.0/−13.25 | 16.0/−14.50 | 17.0/−15.50 |
| 18.0/−17.00 | 19.0/−18.50 | | | |

LGS: C-mode Temperature Compensated Locus 8 expressed as (YXlw) Φ/Θ

| | | | | |
|---|---|---|---|---|
| 41.25/18.50 | 42.00/17.00 | 43.00/15.75 | 44.00/14.50 | 45.00/13.50 |
| 46.00/12.25 | 47.00/11.00 | 48.00/10.00 | 49.00/9.00 | 50.00/7.750 |
| 51.00/6.50 | 52.00/5.00 | 53.00/3.50 | 54.00/2.25 | 55.00/1.25 |

LGS: C-mode Temperature Compensated Locus 11 expressed as (YXlw) Φ/Θ

| | | | | |
|---|---|---|---|---|
| | | | 30.0/27.75 | 29.0/30.25 |
| 29.0/31.25 | 29.0/32.25 | 29.0/33.25 | 29.0/34.25 | 29.0/35.25 |
| 29.0/36.25 | 29.0/34.25 | 29.5/37.0 | 30.0/38.75 | 30.5/40.25 |
| 31.0/41.75 | 31.5/42.75 | 32.0/43.75 | 32.5/44.75 | 33.0/45.75 |
| 33.5/46.75 | 34.0/47.75 | 34.5/48.50 | 35.0/49.00 | 35.5/49.75 |
| 36.0/50.50 | 36.0/51.50 | 37.0/52.50 | 38.0/53.50 | 39.0/54.50 |
| 40.0/55.50 | 41.0/56.50 | 42.0/57.50 | 43.0/58.50 | 44.0/59.75 |
| 45.0/60.50 | 46.0/61.50 | 47.0/62.25 | | |

LGS: C-mode Temperature Compensated Locus 12 expressed as (YXlw) Φ/Θ

| | | | | |
|---|---|---|---|---|
| 0.0/77.25 | 1.0/77.25 | 2.0/77.25 | 3.0/77.25 | 4.0/77.25 |
| 5.0/77.25 | 6.0/77.25 | 7.0/77.00 | 8.0/77.00 | 9.0/77.00 |
| 10.0/77.00 | 11.0/77.00 | 12.0/77.00 | 13.0/76.75 | 14.0/76.75 |
| 15.0/76.75 | 16.0/76.75 | 17.0/76.50 | 18.0/76.50 | 19.0/76.50 |
| 20.0/76.25 | | | | |

TABLE 5H

Further Subset of C-mode Temperature Compensated Loci for LGT with Coupling Coefficients Greater Than 1.0 (kt > 1.0).

LGT: C-mode Temperature Compensated Locus 14 expressed as (YXlw) Φ/Θ

| | | | | |
|---|---|---|---|---|
| | | 22.0/−44.00 | 23.0/−43.00 | 24.0/−42.00 |
| 24.5/−41.50 | 25.0/−40.75 | 26.0/−39.50 | 27.0/−37.75 | 28.0/−36.00 |
| 29.0/−33.25 | | | | |

LGT: C-mode Temperature Compensated Locus 15 expressed as (YXlw) Φ/Θ

| | | | | |
|---|---|---|---|---|
| 6.75/−1.00 | 7.0/−1.75 | 8.0/−3.75 | 9.0/−5.25 | 10.0/−6.75 |
| 11.0/−8.25 | 12.0/−9.50 | 13.0/−10.75 | 14.0/−12.0 | 15.0/−13.0 |
| 16.0/−14.0 | 17.0/−15.0 | 18.0/−16.0 | 19.0/−17.0 | 20.0/−18.0 |
| 21.0/−19.0 | 22.0/−20.0 | 23.0/−21.0 | 24.0/−22.0 | 25.0/−23.0 |
| 26.0/−24.0 | 27.0/−25.0 | 28.0/−27.0 | 28.0/−29.0 | |

LGT: C-mode Temperature Compensated Locus 16 expressed as (YXlw) Φ/Θ

| | | | | |
|---|---|---|---|---|
| 31.0/31.0 | 31.0/30.0 | 31.0/29.00 | 31.0/29.00 | 31.5/27.75 |
| 32.0/26.75 | 32.5/25.75 | 33.0/25.00 | 33.5/24.50 | 34.0/23.75 |
| 34.5/23.25 | 35.0/22.75 | 36.0/21.75 | 37.0/20.75 | 38.0/20.00 |
| 39.0/19.00 | 40.0/18.00 | 41.0/17.00 | 42.0/16.00 | 43.0/15.00 |
| 44.0/14.00 | 45.0/13.00 | 46.0/12.00 | 47.0/11.00 | 48.0/9.50 |
| 49.0/8.25 | 50.0/6.75 | 51.0/5.25 | 52.0/3.50 | 53.0/1.50 |
| 53.25/1.00 | | | | |

LGT: C-mode Temperature Compensated Locus 17 expressed as (YXlw) Φ/Θ

| | | | | |
|---|---|---|---|---|
| 31.0/32.5 | 31.5/34.00 | 32.0/35.50 | 32.5/36.75 | 33.00/37.50 |
| 33.5/38.50 | 34.0/39.25 | 35.0/40.50 | 36.0/41.75 | 37.0/43.00 |
| 38.0/44.00 | | | | |

TABLE 5I

Further Subset of C-mode Temperature Compensated Loci for LGN with Coupling Coefficients Greater Than 1.0 (kt > 1.0).

LGN: C-mode Temperature Compensated Locus 22 expressed as (YXlw) Φ/Θ

| | | |
|---|---|---|
| 23.75/−35.75 | 23.75/−34.75 | 23.75/−33.75 |

LGN: C-mode Temperature Compensated Locus 23 expressed as (YXlw) Φ/Θ

| | | | | |
|---|---|---|---|---|
| 23.75/−33.00 | 1.0/−4.00 | 2.0/−5.00 | 3.0/−6.25 | 4.0/−7.50 |
| 5.0/−8.75 | 6.0/−10.0 | 70/−11.0 | 8.0/−12.25 | 9.0/−13.25 |
| 10.0/−14.50 | 11.0/−15.50 | 12.0/−16.50 | 13.0/−17.50 | 14.0/−18.50 |
| 15.0/−19.50 | 16.0/−20.50 | 17.0/−21.50 | 18.0/−22.50 | 19.0/−23.75 |
| 20.0/−24.75 | 21.0/−26.25 | 22.0/−28.00 | 23.0/−30.00 | 23.5/−32.00 |

TABLE 5I-continued

Further Subset of C-mode Temperature Compensated Loci for
LGN with Coupling Coefficients Greater Than 1.0 (kt > 1.0).

LGN: C-mode Temperature Compensated
Locus 24 expressed as (YXlw) Φ/Θ

| | | | | |
|---|---|---|---|---|
| 36.25/34.00 | 36.25/33.00 | 36.25/32.50 | 36.50/31.75 | 37.00/30.00 |
| 38.00/28.00 | 39.00/26.00 | 40.00/25.00 | 41.00/23.75 | 42.00/22.75 |
| 43.00/21.50 | 44.00/20.50 | 45.00/19.50 | 46.00/18.50 | 47.00/17.50 |
| 48.00/16.50 | 49.00/15.50 | 50.00/14.50 | 51.00/13.25 | 52.00/12.25 |
| 53.00/11.00 | 54.00/10.00 | 55.00/8.75 | 56.00/7.50 | 57.00/6.25 |
| 58.00/5.00 | 59.00/4.00 | 60.00/3.25 | | |

TABLE 6A

B-mode Temperature Compensated Loci for LGT.

LGT: B-mode Temperature Compensated
Locus 18 expressed as (YXlw) Φ/Θ

| | | | | |
|---|---|---|---|---|
| 47.00/−18.00 | 47.00/−19.00 | 47.00/−20.00 | 47.50/−21.00 | 48.00/−22.00 |
| 49.00/−23.25 | 50.00/−24.00 | 51.00/−24.75 | 52.00/−25.25 | 53.00/−25.50 |
| 54.00/−25.75 | 55.00/−26.00 | 56.00/−26.25 | 57.00/−26.50 | 58.00/−26.50 |
| 59.00/−26.50 | 60.00/−26.50 | | | |

LGT: B-mode Temperature Compensated
Locus 19 expressed as (YXlw) Φ/Θ

| | | | | |
|---|---|---|---|---|
| 47.00/−17.00 | 47.00/−16.00 | 47.25/−16.00 | 47.25/−15.00 | 47.25/−14.50 |
| 47.50/−15.00 | 47.50/−14.00 | 47.75/−14.00 | 47.75/−13.00 | 48.00/−12.25 |
| 48.50/−10.75 | 49.00/−9.25 | 49.50/−8.00 | 50.00/−6.75 | 50.50/−5.50 |
| 51.00/−4.25 | 51.50/−3.00 | 52.00/−1.75 | 52.50/−0.75 | 53.00/0.50 |
| 53.25/1.00 | 53.50/1.50 | 53.75/2.00 | 54.00/2.75 | 55.00/4.75 |
| 56.00/6.50 | 57.00/7.50 | 58.00/8.25 | 59.00/8.75 | 60.00/9.00 |

LGT: B-mode Temperature Compensated
Locus 20 expressed as (YXlw) Φ/Θ

| | | | | |
|---|---|---|---|---|
| 0.00/−9.00 | 1.00/−8.75 | 2.00/−8.25 | 3.00/−7.50 | 4.00/−6.25 |
| 5.00/−4.50 | 6.00/−2.75 | 6.25/−2.25 | 6.50/−1.50 | 6.75/−1.25 |
| 6.75/−1.00 | 7.00/−0.50 | 7.25/0.00 | 7.50/0.50 | 7.75/1.00 |
| 8.00/1.75 | 9.00/4.00 | 10.00/6.75 | 11.00/9.25 | 12.00/12.00 |
| 12.50/13.50 | 12.50/14.50 | 12.75/14.50 | 12.75/15.50 | 12.75/16.50 |
| 13.00/15.50 | 13.00/16.50 | 13.00/17.50 | 13.00/18.50 | 13.00/19.00 |

LGT: B-mode Temperature Compensated
Locus 21 expressed as (YXlw) Φ/Θ

| | | | | |
|---|---|---|---|---|
| 0.00/26.50 | 1.00/26.50 | 2.00/26.25 | 3.00/26.25 | 4.00/26.00 |
| 5.00/26.00 | 6.00/25.75 | 7.00/25.50 | 8.00/25.25 | 9.00/24.50 |
| 10.00/24.00 | 11.00/23.25 | 11.50/22.50 | 12.00/21.75 | 12.50/21.50 |
| 12.50/20.50 | 12.75/21.00 | 12.75/20.00 | 12.75/19.00 | 13.00/21.00 |
| 13.00/20.00 | | | | |

TABLE 6B

B-mode Temperature Compensated Loci for LGN.

LGN: B-mode Temperature Compensated
Locus 26 expressed as (YXlw) Φ/Θ

| | | | | |
|---|---|---|---|---|
| 54.50/−9.50 | 53.50/−9.75 | 52.75/−11.00 | 52.50/−11.25 | 52.50/−12.25 |
| 52.50/−13.25 | 52.50/−14.25 | 52.50/−15.25 | 52.75/−16.25 | 53.00/−16.00 |
| 53.50/−17.00 | 54.00/−18.00 | 55.00/−18.75 | 56.00/−19.25 | 57.00/−19.75 |
| 58.00/−20.00 | 59.00/−20.00 | 60.00/−20.00 | | |

LGN: B-mode Temperature Compensated
Locus 27 expressed as (YXlw) Φ/Θ

| | | | | |
|---|---|---|---|---|
| 50.50/−9.00 | 51.75/−8.75 | 52.75/−8.00 | 53.00/−7.50 | 53.50/−6.50 |
| 54.00/−5.25 | 55.00/−3.25 | 56.00/−1.25 | 56.50/0.00 | 57.00/0.75 |
| 58.00/2.00 | 59.00/3.00 | 60.00/3.25 | | |

LGN: B-mode Temperature Compensated
Locus 28 expressed as (YXlw) Φ/Θ

| | | | | |
|---|---|---|---|---|
| 0.00/−3.50 | 1.00/−3.00 | 2.00/−2.00 | 3.00/−0.50 | 3.50/0.00 |
| 4.00/1.25 | 4.50/2.00 | 5.00/3.00 | 5.50/4.00 | 6.00/5.00 |
| 6.50/6.00 | 7.00/7.50 | 7.50/8.25 | 8.00/8.50 | 9.00/9.00 |
| 9.50/9.00 | | | | |

LGN: B-mode Temperature Compensated
Locus 29 expressed as (YXlw) Φ/Θ

| | | | | |
|---|---|---|---|---|
| 0.00/20.00 | 1.00/20.00 | 2.00/20.00 | 3.00/19.50 | 4.00/19.25 |
| 5.00/18.50 | 6.00/17.75 | 6.50/17.25 | 7.00/16.75 | 7.00/16.00 |
| 7.25/16.25 | 7.25/15.25 | 7.50/15.50 | 7.50/14.50 | 7.50/13.50 |
| 7.50/12.50 | 7.50/11.50 | 7.25/11.00 | 7.00/10.50 | 6.50/9.75 |
| 5.50/9.50 | | | | |

TABLE 6C

Subset of B-mode Temperature Compensated Loci for LGT.

LGT: B-mode Temperature Compensated
Locus 18 expressed as (YXlw) Φ/Θ

| | | | | |
|---|---|---|---|---|
| 47.00/−18.00 | 47.00/−19.00 | 47.00/−20.00 | 47.50/−21.00 | 48.00/−22.00 |
| 49.00/−23.25 | 50.00/−24.00 | 51.00/−24.75 | 52.00/−25.25 | 53.00/−25.50 |
| 54.00/−25.75 | 55.00/−26.00 | 56.00/−26.25 | 57.00/−26.50 | 58.00/−26.50 |
| 59.00/−26.50 | 60.00/−26.50 | | | |

LGT: B-mode Temperature Compensated
Locus 19 expressed as (YXlw) Φ/Θ

| | | | | |
|---|---|---|---|---|
| 47.00/−17.00 | 47.00/−16.00 | 47.25/−16.00 | 47.25/−15.00 | 47.25/−14.50 |
| 47.50/−15.00 | 47.50/−14.00 | 47.75/−14.00 | 47.75/−13.00 | 48.00/−12.25 |
| 48.50/−10.75 | 49.00/−9.25 | 49.50/−8.00 | 50.00/−6.75 | 50.50/−5.50 |
| 51.00/−4.25 | 51.50/−3.00 | 52.00/−1.75 | 52.50/−0.75 | 53.00/0.50 |
| 53.25/1.00 | 53.50/1.50 | 53.75/2.00 | 54.00/2.75 | 55.00/4.75 |

LGT: B-mode Temperature Compensated
Locus 20 expressed as (YXlw) Φ/Θ

| | | | | |
|---|---|---|---|---|
| 0.00/−9.00 | 1.00/−8.75 | 2.00/−8.25 | 3.00/−7.50 | 4.00/−6.25 |
| 5.00/−4.50 | 6.00/−2.75 | 6.25/−2.25 | 6.50/−1.50 | 6.75/−1.25 |
| 6.75/−1.00 | 7.00/−0.50 | 7.25/0.00 | 7.50/0.50 | 7.75/1.00 |
| 8.00/1.75 | 9.00/4.00 | 10.00/6.75 | 11.00/9.25 | 12.00/12.00 |
| 12.50/13.50 | 12.50/14.50 | 12.75/14.50 | 12.75/15.50 | 12.75/16.50 |
| 13.00/15.50 | 13.00/16.50 | 13.00/17.50 | 13.00/18.50 | 13.00/19.00 |

LGT: B-mode Temperature Compensated
Locus 21 expressed as (YXlw) Φ/Θ

| | | | | |
|---|---|---|---|---|
| 0.00/26.50 | 1.00/26.50 | 2.00/26.25 | 3.00/26.25 | 4.00/26.00 |
| 5.00/26.00 | 6.00/25.75 | 7.00/25.50 | 8.00/25.25 | 9.00/24.50 |
| 10.00/24.00 | 11.00/23.25 | 11.50/22.50 | 12.00/21.75 | 12.50/21.50 |
| 12.50/20.50 | 12.75/21.00 | 12.75/20.00 | 12.75/19.00 | 13.00/21.00 |
| 13.00/20.00 | | | | |

TABLE 6D

Subset of B-mode Temperature Compensated Loci for LGN.

LGN: B-mode Temperature Compensated
Locus 26 expressed as (YXlw) Φ/Θ

| | | | | |
|---|---|---|---|---|
| 54.50/−9.50 | 53.50/−9.75 | 52.75/−11.00 | 52.50/−11.25 | 52.50/−12.25 |
| 52.50/−13.25 | 52.50/−14.25 | 52.50/−15.25 | 52.75/−16.25 | 53.00/−16.00 |
| 53.50/−17.00 | 54.00/−18.00 | 55.00/−18.75 | 56.00/−19.25 | 57.00/−19.75 |
| 58.00/−20.00 | 59.00/−20.00 | 60.00/−20.00 | | |

LGN: B-mode Temperature Compensated
Locus 27 expressed as (YXlw) Φ/Θ

| | | | | |
|---|---|---|---|---|
| 50.50/−9.00 | 51.75/−8.75 | 52.75/−8.00 | 53.00/−7.50 | 53.50/−6.50 |
| 54.00/−5.25 | 55.00/−3.25 | 56.00/−1.25 | 56.50/0.00 | 57.00/0.75 |
| 58.00/2.00 | 59.00/3.00 | 60.00/3.25 | | |

LGN: B-mode Temperature Compensated
Locus 28 expressed as (YXlw) Φ/Θ

| | | | | |
|---|---|---|---|---|
| 0.00/−3.50 | 1.00/−3.00 | 2.00/−2.00 | 3.00/−0.50 | 3.50/0.00 |
| 4.00/1.25 | 4.50/2.00 | 5.00/3.00 | 5.50/4.00 | 6.00/5.00 |
| 6.50/6.00 | 7.00/7.50 | 7.50/8.25 | 8.00/8.50 | 9.00/9.00 |
| 9.50/9.00 | | | | |

LGN: B-mode Temperature Compensated
Locus 29 expressed as (YXlw) Φ/Θ

| | | | | |
|---|---|---|---|---|
| 0.00/20.00 | 1.00/20.00 | 2.00/20.00 | 3.00/19.50 | 4.00/19.25 |
| 5.00/18.50 | 6.00/17.75 | 6.50/17.25 | 7.00/16.75 | 7.00/16.00 |
| 7.25/16.25 | 7.25/15.25 | 7.50/15.50 | 7.50/14.50 | 7.50/13.50 |
| 7.50/12.50 | 7.50/11.50 | 7.25/11.00 | 7.00/10.50 | 6.50/9.75 |
| 5.50/9.50 | | | | |

TABLE 6E

Further Subset of B-mode Temperature Compensated Loci for
LGT with Coupling Coefficients Greater Than 1.0 (kt > 1.0).

LGT: B-mode Temperature Compensated
Locus 18 expressed as (YXlw) Φ/Θ

| | | | | |
|---|---|---|---|---|
| 47.00/−18.00 | 47.00/−19.00 | 47.00/−20.00 | 47.50/−21.00 | 48.00/−22.00 |
| 49.00/−23.25 | 50.00/−24.00 | 51.00/−24.75 | 52.00/−25.25 | 53.00/−25.50 |
| 54.00/−25.75 | 55.00/−26.00 | 56.00/−26.25 | 57.00/−26.50 | |

LGT: B-mode Temperature Compensated
Locus 19 expressed as (YXlw) Φ/Θ

| | | | | |
|---|---|---|---|---|
| 47.00/−17.00 | 47.00/−16.00 | 47.25/−16.00 | 47.25/−15.00 | 47.25/−14.50 |
| 47.50/−15.00 | 47.50/−14.00 | 47.75/−14.00 | 47.75/−13.00 | 48.00/−12.25 |
| 48.50/−10.75 | 49.00/−9.25 | 49.50/−8.00 | 50.00/−6.75 | 50.50/−5.50 |
| 51.00/−4.25 | 51.50/−3.00 | 52.00/−1.75 | 52.50/−0.75 | 53.00/0.50 |
| 53.25/1.00 | 53.50/1.50 | 53.75/2.00 | 54.00/2.75 | 55.00/4.75 |

TABLE 6E-continued

Further Subset of B-mode Temperature Compensated Loci for
LGT with Coupling Coefficients Greater Than 1.0 (kt > 1.0).

LGT: B-mode Temperature Compensated
Locus 20 expressed as (YXlw) Φ/Θ

|  |  |  |  |  |
|---|---|---|---|---|
|  |  | 2.00/−8.25 | 3.00/−7.50 | 4.00/−6.25 |
| 5.00/−4.50 | 6.00/−2.75 | 6.25/−2.25 | 6.50/−1.50 | 6.75/−1.25 |
| 6.75/−1.00 | 7.00/−0.50 | 7.25/0.00 | 7.50/0.50 | 7.75/1.00 |
| 8.00/1.75 | 9.00/4.00 | 10.00/6.75 | 11.00/9.25 | 12.00/12.00 |
| 12.50/13.50 | 12.50/14.50 | 12.75/14.50 | 12.75/15.50 | 12.75/16.50 |
| 13.00/15.50 | 13.00/16.50 | 13.00/17.50 | 13.00/18.50 | 13.00/19.00 |

LGT: B-mode Temperature Compensated
Locus 21 expressed as (YXlw) Φ/Θ

|  |  |  |  |  |
|---|---|---|---|---|
|  |  | 3.00/26.25 | 4.00/26.00 |  |
| 5.00/26.00 | 6.00/25.75 | 7.00/25.50 | 8.00/25.25 | 9.00/24.50 |
| 10.00/24.00 | 11.00/23.25 | 11.50/22.50 | 12.00/21.75 | 12.50/21.50 |
| 12.50/20.50 |  |  |  |  |
| 13.00/20.00 |  |  |  |  |

TABLE 6F

Further Subset of B-mode Temperature Compensated Loci for
LGN with Coupling Coefficients Greater Than 1.0 (kt > 1.0).

LGN: B-mode Temperature Compensated
Locus 26 expressed as (YXlw) Φ/Θ

| 54.50/−9.50 | 53.50/−9.75 | 52.75/−11.00 | 52.50/−11.25 | 52.50/−12.25 |
|---|---|---|---|---|
| 52.50/−13.25 | 52.50/−14.25 | 52.50/−15.25 | 52.75/−16.25 | 53.00/−16.00 |
| 53.50/−17.00 | 54.00/−18.00 | 55.00/−18.75 | 56.00/−19.25 | 57.00/−19.75 |
| 58.00/−20.00 |  |  |  |  |

LGN: B-mode Temperature Compensated
Locus 27 expressed as (YXlw) Φ/Θ

| 50.50/−9.00 | 51.75/−8.75 | 52.75/−8.00 | 53.00/−7.50 | 53.50/−6.50 |
|---|---|---|---|---|
| 54.00/−5.25 | 55.00/−3.25 | 56.00/−1.25 | 56.50/0.00 | 57.00/0.75 |
| 58.00/2.00 | 59.00/3.00 | 60.00/3.25 |  |  |

LGN: B-mode Temperature Compensated
Locus 28 expressed as (YXlw) Φ/Θ

| 0.00/−3.50 | 1.00/−3.00 | 2.00/−2.00 | 3.00/−0.50 | 3.50/0.00 |
|---|---|---|---|---|
| 4.00/1.25 | 4.50/2.00 | 5.00/3.00 | 5.50/4.00 | 6.00/5.00 |
| 6.50/6.00 | 7.00/7.50 | 7.50/8.25 | 8.00/8.50 | 9.00/9.00 |
| 9.50/9.00 |  |  |  |  |

LGN: B-mode Temperature Compensated
Locus 29 expressed as (YXlw) Φ/Θ

| 0.00/20.00 | 1.00/20.00 | 2.00/20.00 | 3.00/19.50 | 4.00/19.25 |
|---|---|---|---|---|
| 5.00/18.50 | 6.00/17.75 | 6.50/17.25 | 7.00/16.75 | 7.00/16.00 |
| 7.25/16.25 | 7.25/15.25 | 7.50/15.50 | 7.50/14.50 | 7.50/13.50 |
| 7.50/12.50 | 7.50/11.50 | 7.25/11.00 | 7.00/10.50 | 6.50/9.75 |
| 5.50/9.50 |  |  |  |  |

The orientation of a particular resonator that is compensated against radially uniform in-plane stresses induced by means, such as electrodes, externally applied load, temperature, mechanical mounts, or acceleration, may vary. The orientations may vary by as much as ±4° in Φ and/or Θ from the orientations indicated in Tables 4, 5A-5I, 6A-F, 7, 8, 9, and corresponding orientations, or in FIGS. 7, 8, 13A-B, 14A-B, 15A-B, 18, 19, and 20. This variation is attributable to such factors as: (i) the type and degree of contouring applied to the LGX material, (ii) the quality of the LGX material, (iii) the shape, dimensions, and material of the electrodes (including, for example, the practice of using a partial electrode), (iv) the type of mounting in which the resonator is set, (v) the operating temperature of the resonator, (vi) operation of the resonator in overtone modes of vibration, and (vii) reasonable investigatory and parametric uncertainties.

A thickness-shear LGX resonator may be employed as a stabilizing element in an oscillator circuit. Generally, an oscillator may be considered to be a closed-loop system including an amplifier and a feed-back network including the resonator. The amplitude builds to the point where nonlinearities decrease loop gain to unity, while the frequency adjusts itself so that the total phase shift around the loop is zero (or 360°). The resonator possesses a large reactance frequency slope, and its impedance changes so sharply with frequency that other circuit components can be considered to be of constant reactance relative to the nominal frequency of the crystal.

A LGX resonator in accordance with illustrative embodiments of the present disclosure will have an orientation for which the stress coefficient "D" or the temperature coefficient "A" is zero or a minimal value for at least one mode of vibration. An oscillator including such a resonator will be useful in frequency control applications, temperature measurement applications, and/or pressure measurement applications. The suitability of the resonator for a particular application depends on the respective values of its temperature coefficients A, B, and C, the value of its stress coefficient "D" (if nonzero) relative to the value of the temperature coefficients, and the mode or modes of vibration which are used.

Figure 16:
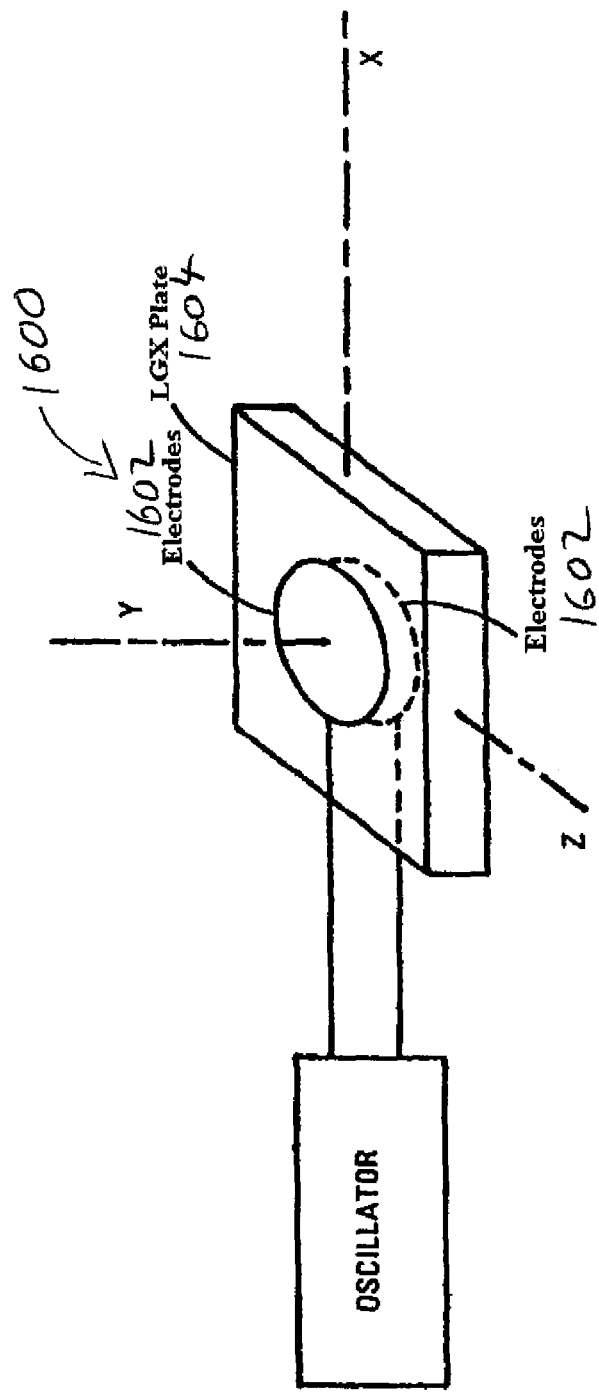
FIG. 16 shows a resonator in accordance with another embodiment of the present disclosure.
Figure 18:
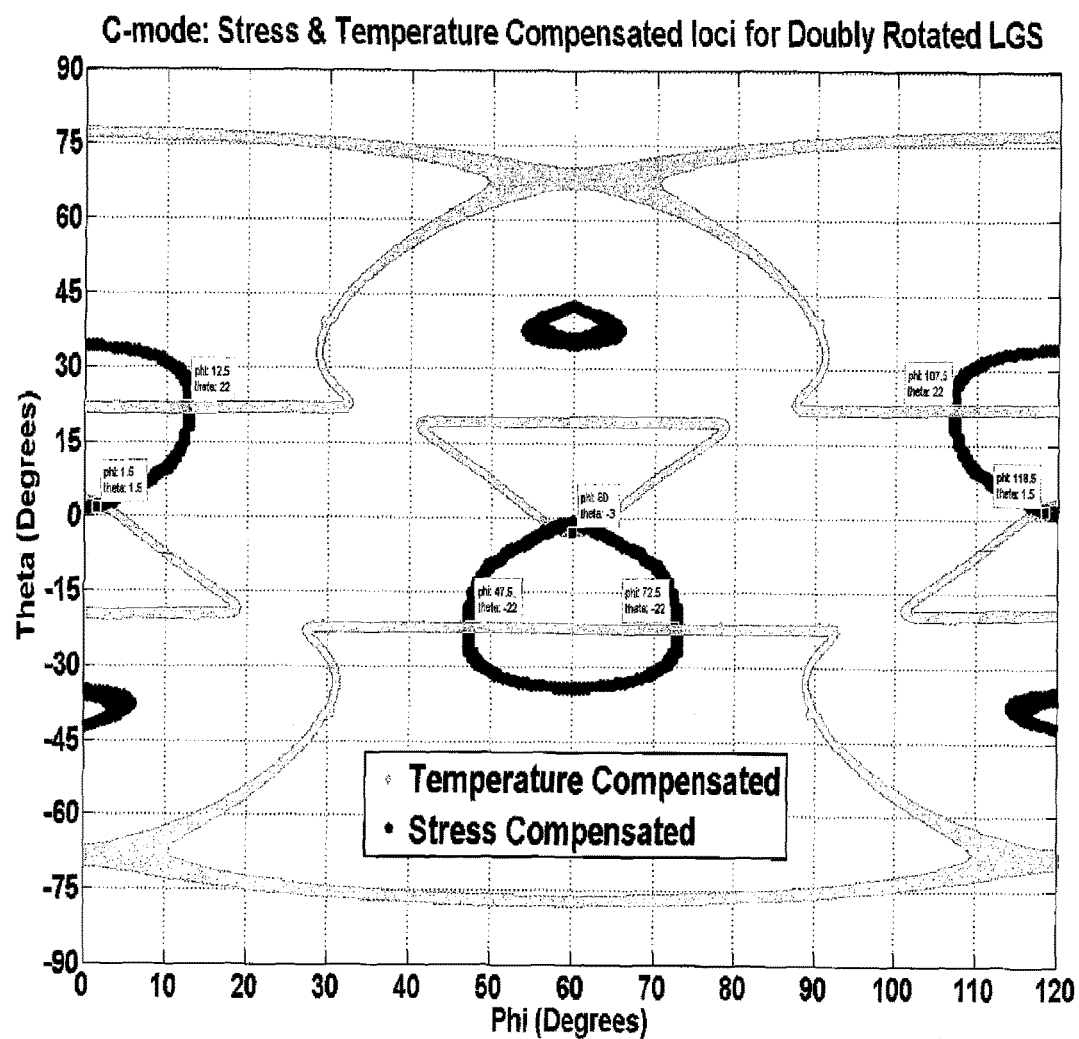
FIG. 18 shows a plot of stress and temperature compensated loci for doubly rotated LGS in C-mode in accordance with one embodiment of the present disclosure.
Figure 19:
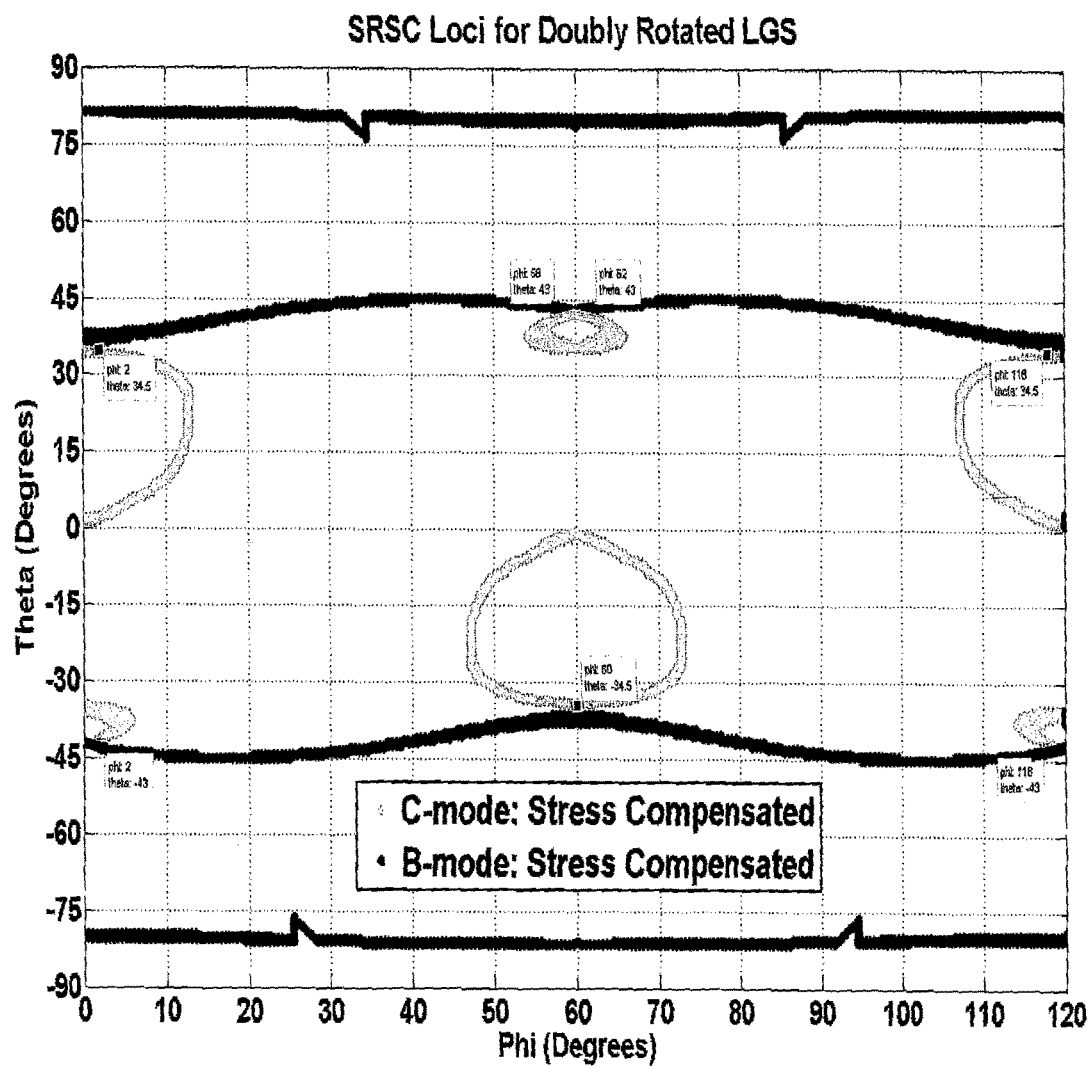
FIG. 19 shows a plot of stress compensated in C-mode and stress compensated in B-mode loci for doubly rotated LGS in accordance with one embodiment of the present disclosure.
Figure 20:
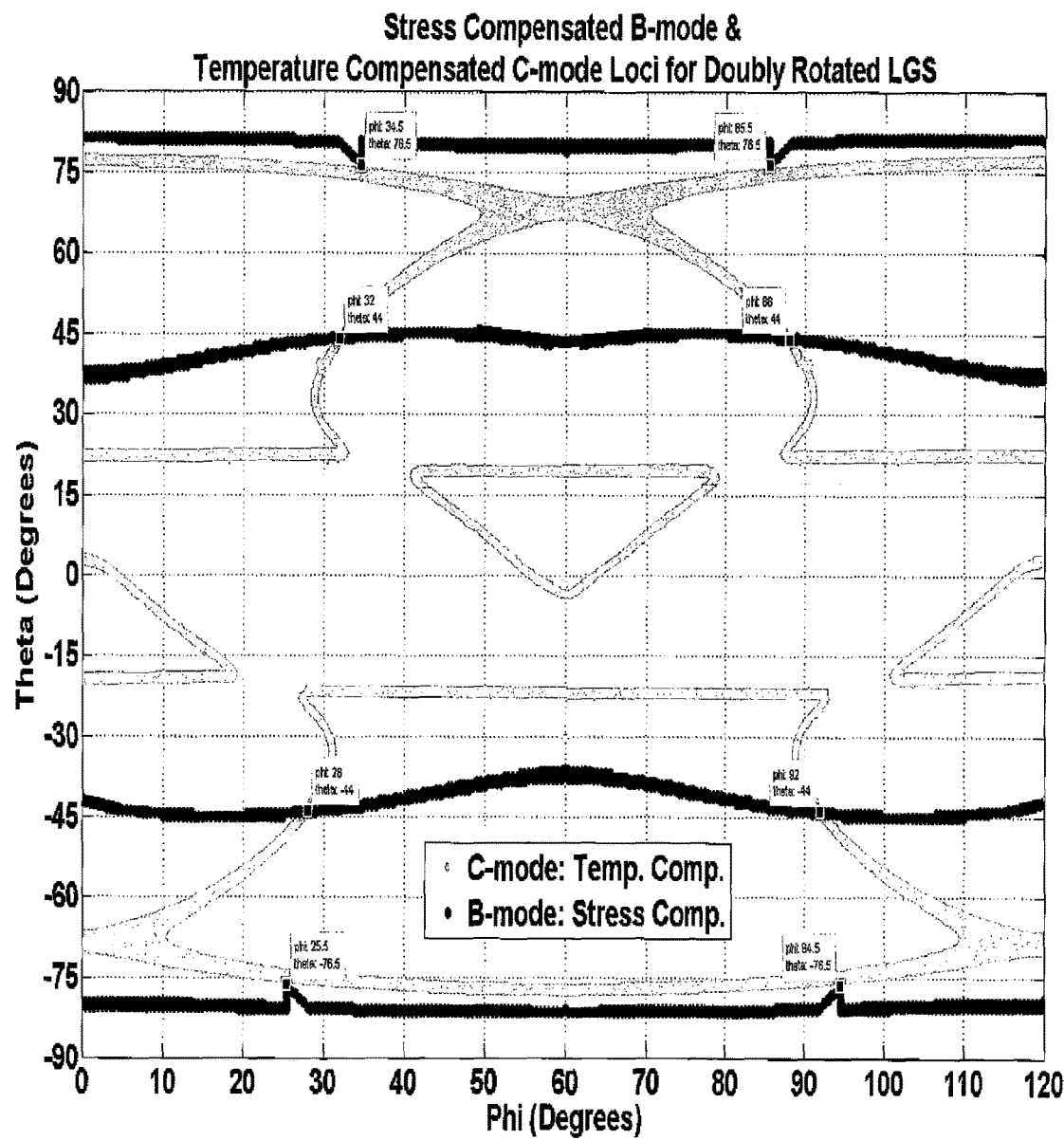
FIG. 20 shows a plot of stress compensated in B-mode and temperature compensated in C-mode loci for doubly rotated LGS in accordance with one embodiment of the present disclosure.

The resonator itself may have the configuration shown in FIG. 16, in which the resonator 1600 includes a disk-like vibratory region between circular electrodes 1602 deposited on respective surfaces of a LGX plate 1604. A disc-like vibratory region represents either a B-mode or C-mode of the thickness-vibrating element. Axes X and Z define the major resonator plane. FIGS. 17A-17F show some examples of cross sectional shapes for plate-shaped resonators. Electrodes 1602 are provided on opposite surfaces in central portions of the plate 1604 by conventional methods, such as vacuum evaporation deposition and sputtering. The electrodes 1602 apply an electric field to the LGX plate 1604 to excite vibration in plate. The electrode material is a conductive material, such as gold. In some embodiments, an intermediate layer of chromium may be used to inhibit migration of gold into the piezoelectric crystal material. Thickness of the electrodes may be between 100 to 500 Angstroms. The resonating portion of the resonator is formed in the portion between the electrodes 1602. One shape of the resonator is bi-convex as shown in FIGS. 17C and 17D. By using the bi-convex resonator, the energy of thickness vibrations can be trapped in the resonator so as to reduce mounting losses and possible reflections of anharmonic overtones from the electrode and plate boundaries. In other words, the bi-convex resonator reduces undesired modes of vibration and confines resonant vibration energy for a high Q-value. Other shapes of the resonator may also be adopted, such as a plano-convex resonator, as shown in FIGS. 17A and 17B, or a flat resonator, as shown in FIG. 17E, or a mesa resonator, as shown in FIG. 17F. In plano-convex and bi-convex resonators, the circumferential end portion 1606 surrounding the resonating element of the plate may be flat or raised, as shown in FIGS. 17A, 17C, 17E, and 17F so that a seal may be made between the plate 1604 and end caps (not shown) without having to shape the end surfaces of the end caps. End caps are further described below.

For frequency control applications, the orientations defined by the coincidence of the B-mode temperature compensated orientation loci and B-mode stress compensated orientation loci (FIG. 7) and the coincidence of the C-mode temperature compensated orientation loci (FIGS. 13A-B) and C-mode stress compensated orientation loci (FIG. 8) can be used in frequency control applications. For C-mode, such orientations exist for LGS and are presented in Table 7 and FIG. 18. For example, the C-mode of LGS has such an orientation at (YXlw) 1.5°/1.5°. The stress and temperature compensated cut for C-mode is referred to herein as the "SSC" cut. A resonator having one of these orientations is expected to have good long-term stability and fast thermal transient compensation. More specifically, a resonator that has a SSC cut will continue to oscillate at a stable frequency even as the temperature of the resonator and pressure applied to the resonator change by small amounts from those in the ambient conditions. This characteristic makes the SSC cut ideal for frequency control applications, such as a stable frequency source in a signal processing system or a clock used as a timing device in, for example, radar detection systems.

For the SSC cut in the C-mode, the value of the temperature coefficient "A" in equation (3) is zero or a minimal value, the temperature coefficients "B" and "C" have relatively small values, and the values of the stress coefficient "D" is zero or minimal. The SSC exhibits a higher electromechanical coupling coefficient of 15.81%. For the B-mode, no such orientations exist for LGS. The material Q for the B-mode is usually higher than that for the C-mode, which other factors being equal, means that the frequency stability of B-mode resonators would be greater than the frequency stability of C-mode resonators.

TABLE 7

SSC Cuts of LGS.

| SSC Compensated Cuts (YXlw) Φ/Θ for LGS | C-mode: Electromechanical Coupling (%) |
|---|---|
| 1.5°/1.5° | 15.81 |
| 12.5°/22.0° | 11.51 |
| 47.5°/−22.0° | 11.48 |
| 60.0°/−3.0° | 15.10 |

The orientations defined by the coincidence of the B-mode stress compensated orientation loci (FIG. 7) and the C-mode stress compensated orientation loci (FIG. 8) can be used in precision temperature measurement control applications. Respective independent temperature measurements are available from the B- and C-modes of vibration of the same resonator, thereby providing redundant indications for the parameter being measured and also permitting detection of erroneous device operation if independent oscillator circuitry is used. The orientations of LGS resonators with their respective electromechanical coupling coefficient for precision temperature measurements are presented in Table 8 and FIG. 19. The C-mode stress compensated and B-mode stress compensated cut is referred to herein as the "SBSC" cut.

The oscillating frequency for a resonator that has a SBSC cut will change as the temperature of the resonator changes, but the oscillating frequency will not be affected by a change in pressure. The change in oscillating frequency can be used to derive an environmental temperature. In this manner, a resonator that has a SBSC cut can be used as a temperature sensor.

TABLE 8

SBSC Cuts of LGS.

| SBSC Cuts (YXlw) | Electromechanical Coupling (%) | |
|---|---|---|
| Φ/Θ for LGS | B-mode | C-mode |
| 2.0°/34.5° | 0.453 | 11.72 |
| 2.0°/−43.0° | 3.272 | 1.417 |
| 58.00°/43.0° | 3.272 | 1.417 |
| 60.0°/−34.5° | 0.000 | 11.78 |

For pressure measurement applications, an orientation of particular suitability is (YXlw) 32.0°/44.0°, defined by the coincidence of the B-mode stress compensated orientation loci (FIG. 7) with the C-mode temperature compensated orientation loci (FIGS. 13A-B) for LGS. Other such orientations for LGS are presented in FIG. 20 and listed in Table 9 with their respective electromechanical coupling coefficient. A LGS cut having this orientation is herein after referred to as the LGS-SBTC (Stress Compensated in B-mode and Temperature Compensated in C-mode) cut.

TABLE 9

SBTC Cuts of LGS

| SBTC Cuts (YXlw) | Electromechanical Coupling (%) | |
|---|---|---|
| Φ/Θ for LGS | B-mode | C-mode |
| 32.0°/44.0° | 3.010 | 3.007 |
| 28.0°/−44.0° | 3.010 | 3.007 |
| 34.5°/76.5° | 0.075 | 0.715 |
| 25.5°/−76.5° | 0.075 | 0.715 |

A resonator of this orientation may be excited to vibrate in both B and C modes. Pressure measurements may be derived from the C-mode. Over a broad range of temperatures and pressures, however, C-mode frequencies would include small errors due to temperature effects, while C-mode frequencies would include small errors due to stress effects. The C-mode frequencies may be corrected by using temperature measurements obtained from the B-mode, as explained below.

The frequency-temperature and frequency-stress behavior of a resonator excited in the two thickness-shear modes of vibration (B- and C-modes) can be characterized (ignoring higher order terms) by the equation:

$$\begin{bmatrix} \Delta f_B/f_B \\ \Delta f_C/f_C \end{bmatrix} = \begin{bmatrix} M_B & D_B \\ M_C & D_C \end{bmatrix} \begin{bmatrix} \Delta T \\ \Delta P \end{bmatrix} \quad (11)$$

where $M = A + B\Delta T + C\Delta T^2$, the subscripts B and C indicate the pertinent mode of vibration and the other terms are defined above. The quantities $\Delta T$ and $\Delta P$ are determined by inverting the coefficient matrix in equation (11). For greatest resolution the diagonal elements should be dominant, which requires, for example, that $M_B \gg D_B$ and $D_C \gg M_C$.

The empirical analogy, simply stated, is that the relatively large temperature effects in one mode of vibration are used to precisely compensate for the relatively small temperature effects in the other mode of vibration. In more detail, a number of various methods may be applied for achieving temperature compensation in pressure measurements, including curve fitting routines and look-up and interpolation routines. In a curve fitting implementation, for example, the first step is a calibration process in which both the B- and C-mode frequencies are measured at selected temperatures and pressures over the required operating range. The actual frequencies of the B- and C-modes can be expressed as respective polynomials in temperature and pressure:

$$f_B = f_{BR}(1 + A_B\Delta T + B_B\Delta T^2 + C_B\Delta T^3 + D_B\Delta P) \quad (12)$$

$$f_C = f_{CR}(1 + A_C\Delta T + B_C\Delta T^2 + C_C\Delta T^3 + D_C\Delta P) \quad (13)$$

where $f_B$ is the actual B-mode frequency, $f_{BR}$ is the B-mode reference frequency, $f_C$ and $f_{CR}$ are similarly defined for C-mode, and the other terms are as defined above. The actual B-mode frequency $f_B$ can be measured using the C-mode frequency $f_C$ as the reference. It is then known from frequency counter principles that the relative error in the measured B-mode frequencies is identical to that of the C-mode frequency signal. Therefore, after selection of a reference frequency $f_{CR}$, the frequency $f_B$ can be determined as a function of temperature and fixed pressure from the relation:

$$f_B(T,P) = f_{BM}(T,P)\{1 + (f_{CM}(T,P)/f_{CR})/f_{CR}\} \quad (14)$$

where $f_{BM}$ and $f_{CM}$ are the measured frequencies for B- and C-modes, respectively.

Several values of $f_B$ (T, P) are thus obtained for various temperature and pressure data, whereby, the temperature of the probe can be expressed as polynomial of the form:

$$T = A + Bf_B + Cf_B^2 + Df_B^2 \quad (15)$$

at a fixed pressure. This curve fitting routine can be implemented on any suitable processing system, whereby the temperature induced error in the C-mode frequency can be compensated to provide the shift in the reference frequency $f_{CR}$ as a function of applied pressure and independent of temperature fluctuations.

Figure 21:
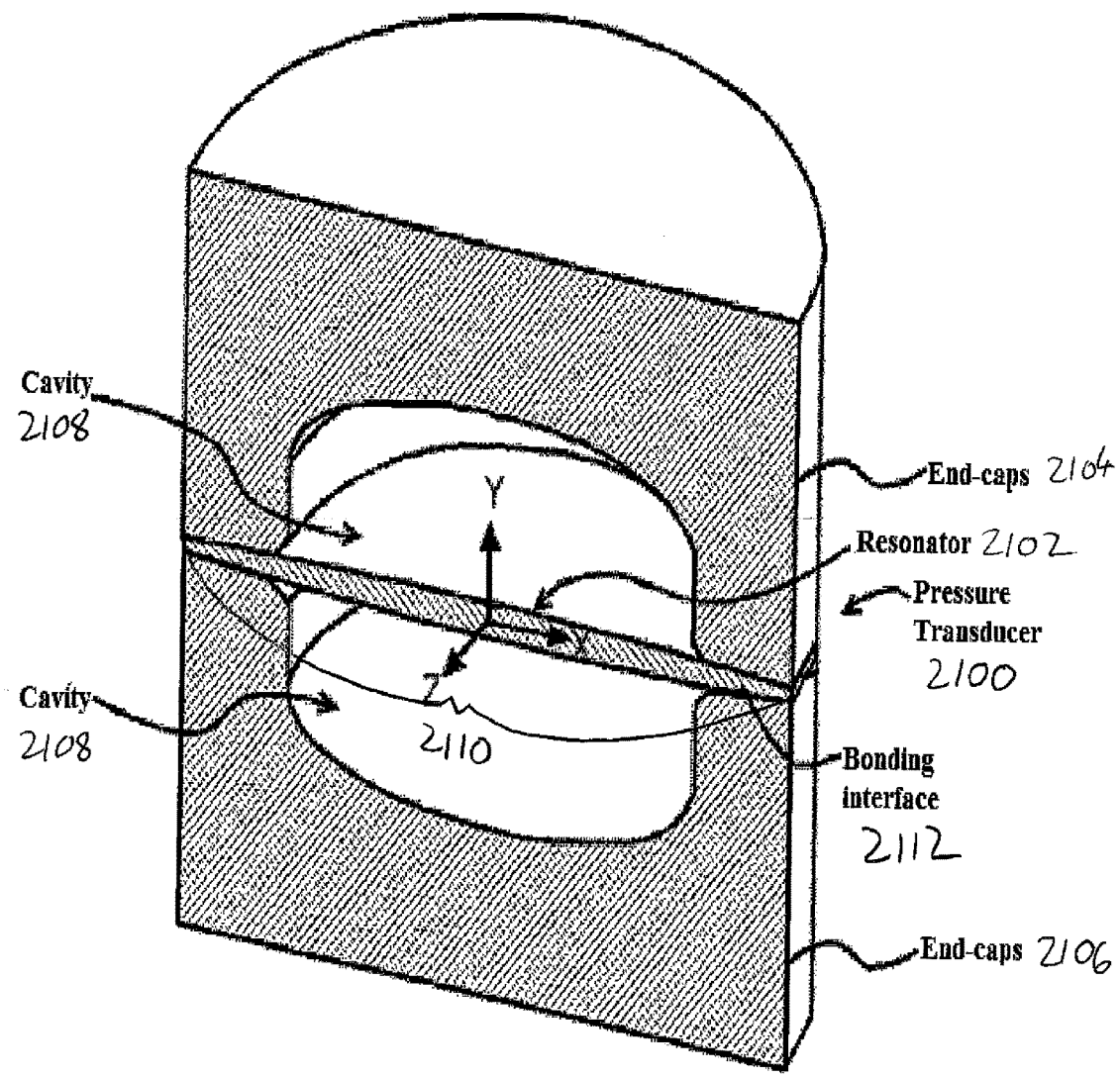
FIG. 21 shows a pressure sensor in accordance with one embodiment of the present disclosure.

FIG. 21 shows a pressure sensor 2100 with a resonator 2102 formed from a LGS material. In one specific embodiment, the resonator 2102 is formed from an SBTC cut LGS material. The pressure sensor 2100 includes an axisymmetric housing formed from two end caps 2104, 2106. The housing includes a hollow inside cavity 2108. In this embodiment, the resonator 2102 is a bi-convex resonator located in a radial plane within the housing. The resonator 2102 includes a plate portion with a circumferential edge surface. The end caps 2104, 2106 are at opposite sides of the plate 2110. The end caps 2104, 2106 are attached to the plate 2110 so as to define the cavity 2108 within which the resonator 2102 is located. In one embodiment, the plate 2110 of the resonator 2102 and the end caps 2104, 2106 may be formed as unitary axisymmetric structures from a crystal block of the LGS. In another embodiment, the end caps 2104, 2106 are attached to the ends 110 of plate 2110 via bonding interfaces 2112. Further details regarding pressure sensors and transducers are provided in U.S. Pat. No. 8,136,406, issued on Mar. 20, 2012 to Sato et al., and U.S. Pat. No. 8,294,332, issued Oct. 23, 2012 to Matsumoto et al. Each of these patents is incorporated by reference herein in its entirety.

Figure 22:
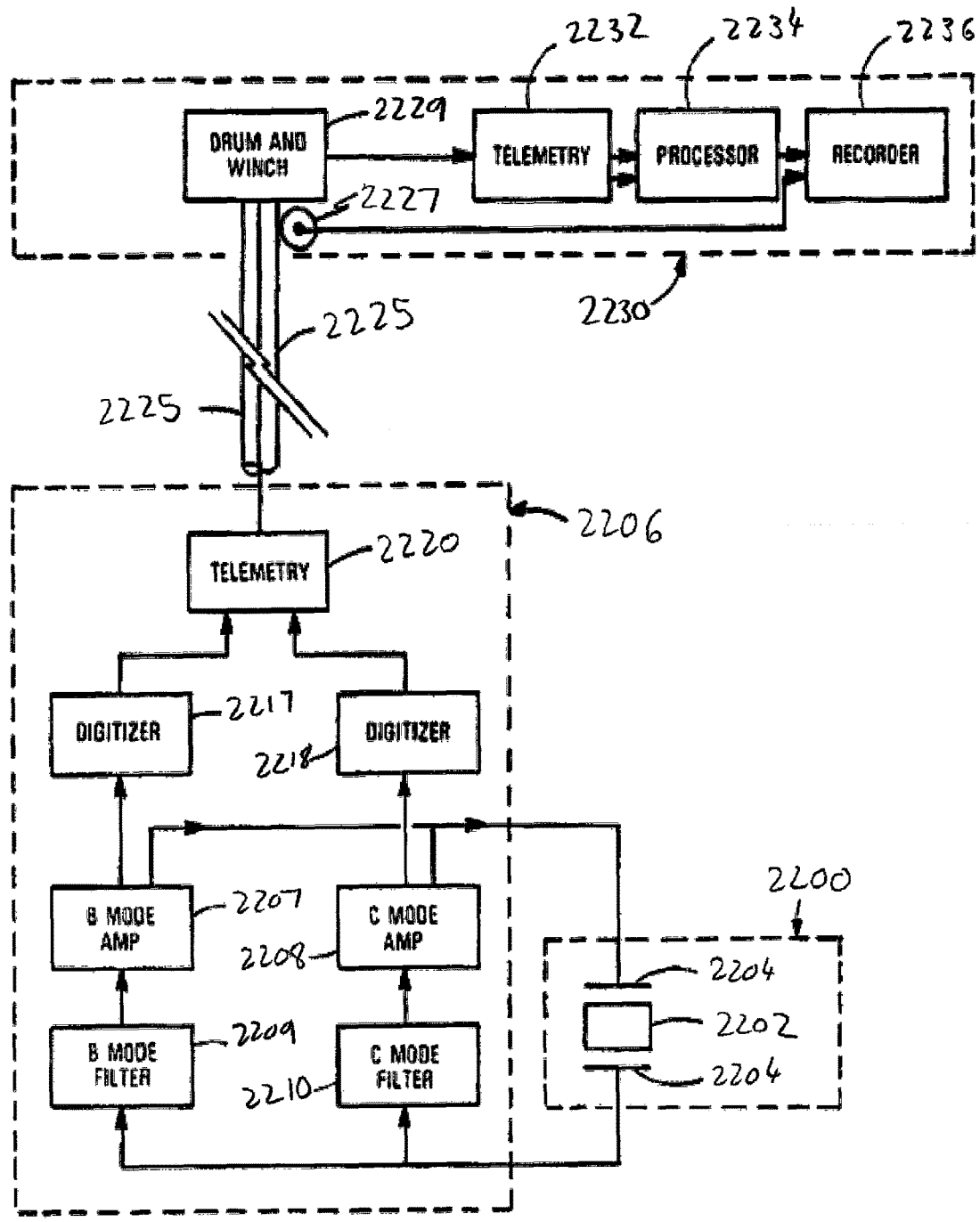
FIG. 22 shows a pressure sensor system for use in logging of earth formations in accordance with one embodiment of the present disclosure.

FIG. 22 shows a pressure sensor system 2200 that can be used in oilfield applications. In this embodiment, the pressure sensor system 2200 includes a LGS resonator 2202 having an SBTC orientation (YXlw) 32°/44.0° (±4° in Φ and/or Θ) (or an orientation sufficiently close thereto to exhibit the characteristics described in reference to Equation (11)). The resonator 2202 is disposed between electrodes 2204. The pressure sensor 2200 and associated downhole electronics 2206 are mounted in a logging tool that is conveyed through a wellbore to analyze and investigate Earth formations. The logging tool can be, for example, a wireline tool or a logging-while-drilling (LWD) tool. In this embodiment, the resonator 2202 is driven to vibrate simultaneously in both the B- and C-modes of vibration by applying an AC signal to electrodes 2204 by amplifiers 2207 and 2208 corresponding to the B- and C-mode frequencies, respectively. Filter networks 2209 and 2210, each having appropriate poles and/or zeroes relative to the B- and C-mode frequencies respectively, are provided to separate the energy from the variation in the two modes of the single pair of electrodes 2204. The B- and C-mode signals from amplifiers 2207 and 2208 are applied to respective digitizers 2217 and 2218. The digitized signals are applied to a telemetry system 2220 where they are multiplexed and transmitted to surface equipment, generally indicated at 2230, over an armored cable 2225.

In the embodiment shown in FIG. 22, the logging tool is suspended in the wellbore on an armored cable 2225, the length of which substantially determines the relative depth of the logging tool within the wellbore. The length of armored cable 2225 is controlled by suitable means at the surface, such as a drum and winch mechanism 2229. The armored cable 2225 is rewound on the drum to raise the logging device toward the surface as measurements are taken. Depth measurements are provided by a measure wheel 2227 or other suitable means. Telemetry signals transmitted over the armored cable 2225 are supplied to a telemetry system 2232 through the drum and winch mechanism 2229. The signals are de-multiplexed and the digital frequency information for the B- and C-modes is supplied to a processing system 2234. Processing system 2234 determines the temperature compensated pressure in accordance with the curve fitting routine described above or any other suitable method, and supplies this information to recorder 2236 which, receiving depth information from measure wheel 2227, records pressure as a function of depth.

The term "processing system" should not be construed to limit the embodiments disclosed herein to any particular device type or system. The processing system may be a computer, such as a laptop computer, a desktop computer, or a mainframe computer. The processing system may include a graphical user interface (GUI) so that a user can interact with the processing system. The processing system may also include a processor (e.g., a microprocessor, microcontroller, digital signal processor, or general purpose computer) for executing any of the methods and processes described above.

The processing system may further include a memory such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. This memory may be used to store, for example, pressure data, temperature, and depth data.

Any of the methods and processes described above, can be implemented as computer program logic for use with the processing system. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer readable medium (e.g., memory) and executed by the processing system.

Alternatively or additionally, the processing system may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

Although several example embodiments have been described in detail above, those skilled in the art will readily appreciate that many modifications are possible in the example embodiments without materially departing from the scope of this disclosure. Accordingly, such modifications are intended to be included within the scope of this disclosure.

We claim:

1. An oscillator comprising:
a langasite resonator configured to vibrate at an oscillating frequency in a thickness-shear mode of vibration, wherein the resonator comprises a crystal orientation (yxwl) $\Phi/\Theta$ selected from the group consisting of:
(i) $\Phi=1.5°/\Theta=1.5°$, (ii) $\Phi=12.5°/\Theta=22.0°$, (iii) $\Phi=47.5°/\Theta=22.0°$, (iv) $\Phi=60.0°/\Theta=3.0°$, (v) $\Phi=2.0°/\Theta=34.5°$, (vi) $\Phi=2.0°/\Theta=43.0°$, (vii) $\Phi=58.0°/\Theta=43.0°$, (viii) $\Phi=60.0°/\Theta=34.5°$, (ix) $\Phi=32.0°/\Theta=44.0°$, (x) $\Phi=28.0°/\Theta=44.0°$, (xi) $\Phi=34.5°/\Theta=76.5°$, (xii) $\Phi=25.5°/\Theta=76.5°$, and (xiii) corresponding orientations for orientations (i)-(xii), with plus or minus 4° in $\Phi$ and 4° in $\Theta$, wherein the corresponding orientations for orientations (i)-(xii) include a plurality of orientations derivable from orientations (i)-(xii) by one or more of trigonal symmetry, diagonal symmetry, and diagonal-mirror symmetry.

2. The oscillator of claim 1, wherein the resonator is configured to vibrate in a slow thickness-shear mode and the resonator comprises a crystal orientation (yxwl) $\Phi/\Theta$ selected from the group consisting of:
(i) $\Phi=1.5°/\Theta=1.5°$, (ii) $\Phi=12.5°/\Theta=22.0°$, (iii) $\Phi=47.5°/\Theta=22.0°$, (iv) $\Phi=60.0°/\Theta=3.0°$, and (v) corresponding orientations for orientations (i)-(iv), with plus or minus 4° in $\Phi$ and 4° in $\Theta$, wherein the corresponding orientations for orientations (i)-(iv) include a plurality of orientations derivable from orientations (i)-(iv) by one or more of trigonal symmetry, diagonal symmetry, and diagonal-mirror symmetry.

3. The oscillator of claim 2, wherein the oscillator is configured to maintain a stable oscillating frequency.

4. The oscillator of claim 1, wherein the resonator comprises a crystal orientation (yxwl) $\Phi/\Theta$ selected from the group consisting of:
(i) $\Phi=2.0°/\Theta=34.5°$, (ii) $\Phi=2.0°/\Theta=43.0°$, (iii) $\Phi=58.0°/\Theta=43.0°$, (iv) $\Phi=60.0°/\Theta=34.5°$, and (v) corresponding orientations for orientations (i)-(iv), with plus or minus 4° in $\Phi$ and 4° in $\Theta$, wherein the corresponding orientations for orientations (i)-(iv) include a plurality of orientations derivable from orientations (i)-(iv) by one or more of trigonal symmetry, diagonal symmetry, and diagonal-mirror symmetry.

5. The oscillator of claim 4, wherein the oscillator is configured to measure temperature.

6. The oscillator of claim 5, wherein the resonator is configured to simultaneously vibrate in a slow thickness-shear mode and fast-thickness shear mode.

7. The oscillator of claim 1, wherein the resonator comprises a crystal orientation (yxwl) $\Phi/\Theta$ selected from the group consisting of:
(i) $\Phi=32.0°/\Theta=44.0°$, (ii) $\Phi=28.0°/\Theta=44.0°$, (iii) $\Phi=34.5°/\Theta=76.5°$, (iv) $\Phi=25.5°/\Theta=-76.5°$, and (v) corresponding orientations for orientations (i)-(iv), with plus or minus 4° in $\Phi$ and 4° in $\Theta$, wherein the corresponding orientations for orientations (i)-(iv) include a plurality of orientations derivable from orientations (i)-(iv) by one or more of trigonal symmetry, diagonal symmetry, and diagonal-mirror symmetry.

8. The oscillator of claim 7, wherein the oscillator is configured to measure pressure.

9. The oscillator of claim 8, wherein the resonator is configured to simultaneously vibrate in a slow thickness-shear mode and fast-thickness shear mode.

10. The oscillator of claim 7, wherein the resonator comprises a crystal orientation (yxwl) $\Phi/\Theta$ selected from the group consisting of:
(i) $\Phi=32.0°/\Theta=44.0°$, (ii) $\Phi=28.0°/\Theta=-44.0°$, and (iii) corresponding orientations for orientations (i) and (ii), with plus or minus 4° in $\Phi$ and 4° in $\Theta$, wherein the corresponding orientations for orientations (i)-(ii) include a plurality of orientations derivable from orientations (i)-(ii) by one or more of trigonal symmetry, diagonal symmetry, and diagonal-mirror symmetry.

11. The oscillator of claim 1, further comprising: electrodes disposed on opposite surfaces of the resonator and configured to excite vibrations within the resonator.

12. The oscillator of claim 11, further comprising:
an amplifier;
a feedback network coupled to the amplifier, wherein the feedback network comprises the resonator.

13. The oscillator of claim 1, wherein the oscillator is incorporated into a wellbore tool.

14. The oscillator of claim 1, wherein the resonator comprises a disk structure.

15. A method comprising:
vibrating a langasite resonator at an oscillating frequency in a thickness-shear mode of vibration, wherein the resonator comprises a crystal orientation (yxwl) $\Phi/\Theta$ selected from the group consisting of:
(i) $\Phi=1.5°/\Theta=1.5°$, (ii) $\Phi=12.5°/\Theta=22.0°$, (iii) $\Phi=47.5°/\Theta=22.0°$, (iv) $\Phi=60.0°/\Theta=3.0°$, (v) $\Phi=2.0°/\Theta=34.5°$, (vi) $\Phi=2.0°/\Theta=43.0°$, (vii) $\Phi=58.0°/\Theta=43.0°$, (viii) $\Phi=60.0°/\Theta=34.5°$, (ix) $\Phi=32.0°/\Theta=44.0°$, (x) $\Phi=28.0°/\Theta=44.0°$, (xi) $\Phi=34.5°/\Theta=76.5°$, (xii) $\Phi=25.5°/\Theta=76.5°$, and (xiii) corresponding orientations for orientations (i)-(xii), with plus or minus 4° in $\Phi$ and 4° in $\Theta$, wherein the corresponding orientations for orientations (i)-(xii) include a plurality of orientations derivable from orientations (i)-(xii) by one or more of trigonal symmetry, diagonal symmetry, and diagonal-mirror symmetry.

16. The method of claim 15, further comprising: vibrating the resonator in a slow thickness-shear mode of vibration.

17. The method of claim 15, further comprising: deriving a temperature from the oscillating frequency.

18. The method of claim 15, further comprising: deriving a pressure from the oscillating frequency.

19. An oscillator comprising:
a resonator configured to vibrate at an oscillating frequency in a thickness-shear mode of vibration, wherein the resonator comprises at least one of:
  (i) a langasite material with a crystal orientation (yxwl) $\Phi/\Theta$ selected from the group consisting of the orientations in Table 5D and corresponding orientations for the orientations in Table 5D, with plus or minus 4° in $\Phi$ and 4° in $\Theta$, wherein the corresponding orientations for the orientations in Table 5D include a plurality of orientations derivable from the orientations in Table 5D by one or more of trigonal symmetry, diagonal symmetry, and diagonal-mirror symmetry;
  (ii) a langatate material with a crystal orientation (yxwl) $\Phi/\Theta$ selected from the group consisting of the orientations in Table 5E, Table 6C, and corresponding orientations for the orientations in Table 5E and Table 6C, with plus or minus 4° in $\Phi$ and 4° in $\Theta$, wherein the corresponding orientations for the orientations in Table 5E and Table 6C include a plurality of orientations derivable from the orientations in Table 5E and Table 6C by one or more of trigonal symmetry, diagonal symmetry, and diagonal-mirror symmetry; and
  (iii) a langanite material with a crystal orientation (yxwl) $\Phi/\Theta$ selected from the group consisting of the orientations in Table 5F, Table 6D, and corresponding orientations for the orientations in Table 5F and Table 6D, with plus or minus 4° in $\Phi$ and 4° in $\Theta$, wherein the corresponding orientations for the orientations in Table 5F and Table 6D include a plurality of orientations derivable from the orientations in Table 5F and Table 6D by one or more of trigonal symmetry, diagonal symmetry, and diagonal-mirror symmetry.

20. The oscillator of claim 19, wherein the resonator comprises at least one of:
  (i) a langasite material with a crystal orientation (yxwl) $\Phi/\Theta$ selected from the group consisting of the orientations in Table 5G and corresponding orientations for the orientations in Table 5G, with plus or minus 4° in $\Phi$ and 4° in $\Theta$, wherein the corresponding orientations for the orientations in Table 5G include a plurality of orientations derivable from the orientations in Table 5G by one or more of trigonal, diagonal, and diagonal-mirror symmetry;
  (ii) a langatate material with a crystal orientation (yxwl) $\Phi/\Theta$ selected from the group consisting of the orientations in Table 5H, Table 6E, and corresponding orientations for the orientations in Table 5H and Table 6E, with plus or minus 4° in $\Phi$ and 4° in $\Theta$, wherein the corresponding orientations for the orientations in Table 5H and Table 6E include a plurality of orientations derivable from the orientations in Table 5H and Table 6E by one or more of trigonal symmetry, diagonal symmetry, and diagonal-mirror symmetry; and
  (iii) a langanite material with a crystal orientation (yxwl) $\Phi/\Theta$ selected from the group consisting of the orientations in Table 5I, Table 6F, and corresponding orientations for the orientations in Table 5I and Table 6F, with plus or minus 4° in $\Phi$ and 4° in $\Theta$, wherein the corresponding orientations for the orientations in Table 5I and Table 6F include a plurality of orientations derivable from the orientations in Table 5I and Table 6F by one or more of trigonal symmetry, diagonal symmetry, and diagonal-mirror symmetry.

21. The oscillator of claim 20, wherein the resonator is configured to vibrate in a slow thickness-shear mode and the resonator comprises at least one of:
  (i) a langasite material with a crystal orientation (yxwl) $\Phi/\Theta$ selected from the group consisting of the orientations in Table 5G and corresponding orientations for the orientations in Table 5G, with plus or minus 4° in $\Phi$ and 4° in $\Theta$, wherein the corresponding orientations for the orientations in Table 5G include a plurality of orientations derivable from the orientations in Table 5G by one or more of trigonal symmetry, diagonal symmetry, and diagonal-mirror symmetry;
  (ii) a langatate material with a crystal orientation (yxwl) $\Phi/\Theta$ selected from the group consisting of the orientations in Table 5H and corresponding orientations for the orientations in Table 5H, with plus or minus 4° in $\Phi$ and 4° in $\Theta$, wherein the corresponding orientations for the orientations in Table 5H include a plurality of orientations derivable from the orientations in Table 5H by one or more of trigonal symmetry, diagonal symmetry, and diagonal-mirror symmetry; and
  (iii) a langanite material with a crystal orientation (yxwl) $\Phi/\Theta$ selected from the group consisting of the orientations in Table 5I and corresponding orientations for the orientations in Table 5I, with plus or minus 4° in $\Phi$ and 4° in $\Theta$, wherein the corresponding orientations for the orientations in Table 5I include a plurality of orientations derivable from the orientations in Table 5I by one or more of trigonal symmetry, diagonal symmetry, and diagonal-mirror symmetry.

22. The oscillator of claim 20, wherein the resonator is configured to vibrate in a fast-thickness shear mode and the resonator comprises at least one of:
  (i) a langatate material with a crystal orientation (yxwl) $\Phi/\Theta$ selected from the group consisting of the orientations in Table 6E and corresponding orientations for the orientations in Table 6E, with plus or minus 4° in $\Phi$ and 4° in $\Theta$, wherein the corresponding orientations for the orientations in Table 6E include a plurality of orientations derivable from the orientations in Table 6E by one or more of trigonal symmetry, diagonal symmetry, and diagonal-mirror symmetry; and
  (ii) a langanite material with a crystal orientation (yxwl) $\Phi/\Theta$ selected from the group consisting of the orientations in Table 6F and corresponding orientations for the orientations in Table 6F, with plus or minus 4° in $\Phi$ and 4° in $\Theta$, wherein the corresponding orientations for the orientations in Table 6F include a plurality of orientations derivable from the orientations in Table 6F by one or more of trigonal symmetry, diagonal symmetry, and diagonal-mirror symmetry.

23. The oscillator of claim 19, wherein the oscillator is configured to measure pressure.

24. The oscillator of claim 19, wherein the oscillator is incorporated into a wellbore tool.

* * * * *